United States Patent [19]

Dynneson et al.

[11] Patent Number: 4,597,084

[45] Date of Patent: Jun. 24, 1986

[54] COMPUTER MEMORY APPARATUS

[75] Inventors: Ronald E. Dynneson, Brighton; Gardner C. Hendrie, Marlboro, both of Mass.

[73] Assignee: Stratus Computer, Inc., Marlboro, Mass.

[21] Appl. No.: 698,257

[22] Filed: Feb. 4, 1985

Related U.S. Application Data

[63] Continuation of Ser. No. 307,502, Oct. 1, 1981, abandoned.

[51] Int. Cl.$^4$ .................... G06F 11/08; G06F 11/16
[52] U.S. Cl. .................................. 371/51; 371/49; 371/21; 371/38; 364/200
[58] Field of Search ... 364/200 MS File, 900 MS File; 371/38, 49, 51, 21

[56] References Cited

U.S. PATENT DOCUMENTS

| | | | |
|---|---|---|---|
| 3,469,239 | 9/1969 | Richmond et al. | 340/172.5 |
| 3,544,973 | 12/1970 | Borck et al. | 340/172.5 |
| 3,548,382 | 12/1970 | Lichty et al. | 340/172.5 |
| 3,560,935 | 2/1971 | Beers | 340/172.5 |
| 3,641,505 | 2/1972 | Artz et al. | 340/172.5 |
| 3,768,074 | 10/1973 | Sharp et al. | 340/172.5 |
| 3,795,901 | 3/1974 | Boehm et al. | 340/172.5 |
| 3,820,079 | 6/1974 | Bergh et al. | 340/172.5 |
| 3,879,712 | 4/1975 | Edge et al. | 364/200 |
| 3,893,084 | 7/1975 | Kotok et al. | 340/172.5 |
| 3,895,353 | 7/1975 | Dalton | 340/172.5 |
| 3,997,896 | 12/1976 | Cassarino, Jr. et al. | 340/172.5 |
| 4,015,243 | 3/1977 | Kurpanek et al. | 340/172.5 |
| 4,032,893 | 6/1977 | Moran | 340/166 R |
| 4,177,510 | 12/1979 | Appell et al. | 364/200 |
| 4,228,496 | 10/1980 | Katzman et al. | 364/200 |
| 4,233,682 | 11/1980 | Liebergot et al. | 371/68 |
| 4,245,344 | 1/1981 | Richter | 371/68 |
| 4,253,147 | 2/1981 | McDougall et al. | 364/200 |
| 4,323,966 | 4/1982 | Whiteside et al. | 364/200 |
| 4,484,273 | 11/1984 | Stiffler et al. | 364/200 |

FOREIGN PATENT DOCUMENTS 1200155 4/1970 Austria .
8100925 4/1981 PCT Int'l Appl. .
2060229 4/1981 United Kingdom .

OTHER PUBLICATIONS

Rennels, "Architecture for Fault-Tolerant Spacecraft Computers," Proceedings IEEE, vol. 66, No. 10, pp. 1255-1268, (1978).
Matick, Richard E.; Computer Storage Systems and Technology, Chapter 4, p. 306, John Wiley & Sons.
"Standard Specification for S-100 Bus Interface Devices", Computer, vol. 12, No. 7, Jul. 1979, pp. 28-52.
Kogge, Peter M., The Architecture of Pipelined Computers, Hemisphere Publishing Corp., 1981.
Hamming, R. W., "Error Detecting and Error Correcting Codes", The Bell System Technical Journal, vol. XXVI, Apr. 1950, No. 2, pp. 147-160.
The Bell System Technical Journal, Sep. 1964, pp. 1845-1847, 1872-1877, 1966-1980, 2021-2022.
Electronics, "Computers People Can Count On", Jan. 27, 1983, pp. 93-105.
(List continued on next page.)

Primary Examiner—Eddie P. Chan
Attorney, Agent, or Firm—Lahive & Cockfield

[57] ABSTRACT

A fault-tolerant computer system provides information transfers between the units of a computing module, including a processor unit and a memory unit and one or more peripheral control units, on a bus structure common to all the units. Information-handling parts of the system, both in the bus structure and in each unit, can have a duplicate partner. The units of a module check incoming and outgoing signals for errors, signal other module units of a detected error, and disable the unit from sending potentially erroneous information onto the bus structure. Error detectors check the operation of the bus structure and of each system unit to provide information transfers only on fault-free bus conductors and between fault-free units. The computer system can operate in this manner essentially without interruption in the event of faults by using only fault-free conductors and functional units.

17 Claims, 22 Drawing Figures

OTHER PUBLICATIONS

Gorsline, G. W., *Computer Organization Hardware/Software*, Prentice-Hall, Inc., 1980, pp. 221-227.

*AFIPS Conference Proceedings*, vol. 41, Part II, 1972, "C.mmp—A Multi-mini-processor", W. A. Wulf & C. G. Bell, pp. 765-777.

*Computer Design*, "Design Motivations for Multiple Processor Microcomputer Systems", vol. 17, Mar. 1978, pp. 81-89.

*Computing Surveys*, "Multiprocessor Organization—A Survey", vol. 9, No. 1, Mar. 1977, pp. 103-129.

Mano, M., *Computer System Architecture*, Prentice-Hall, Inc., 1982, pp. 454-473.

Anderson & Lee, Fault Tolerance, Principles and Practice, Prentice-Hall International, N.J., 1981, Chapters 4 and 5.

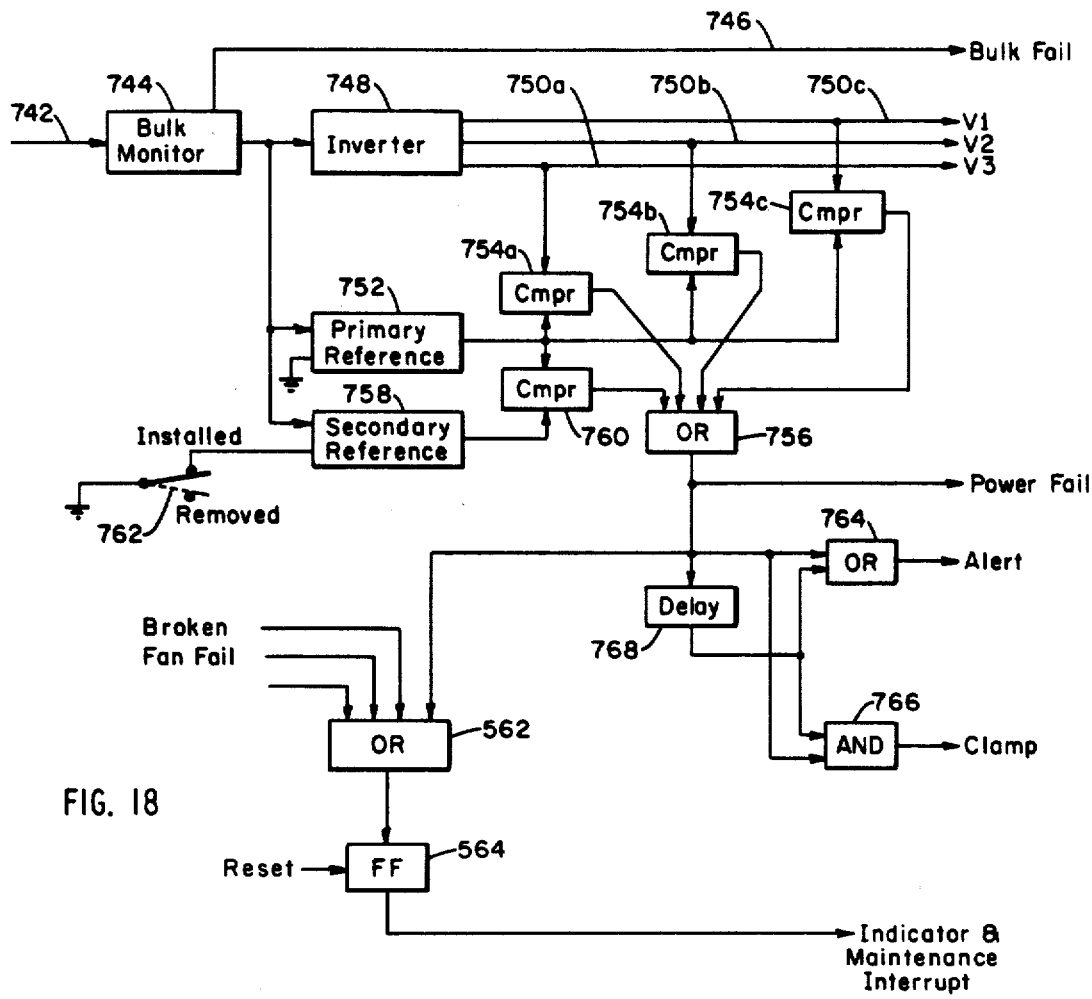
FIG. 18
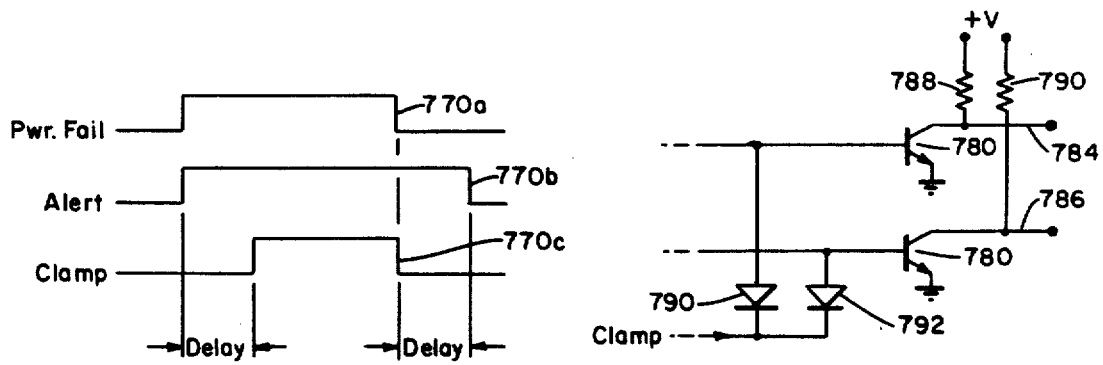
FIG. 19
FIG. 20

COMPUTER MEMORY APPARATUS

This application is a continuation, of application Ser. No. 307,502, filed Oct. 1, 1981, now abandoned.

REFERENCE TO RELATED APPLICATIONS

This application is related to the following commonly-assigned applications filed concurrently herewith:

| Title | Ser. No. |
|---|---|
| "Digital Data Processor With High Reliability" | 307,632 |
| "Digital Data Processor With Fault Tolerant Bus Protocol" | 307,436 |
| "Digital Logic For Priority Determination" | 307,440 (now abandoned) |
| "Central Processing Apparatus" | 307,525; now U.S. Pat. No. 4,453,215 |
| "Computer Peripheral Control Apparatus" | 307,524; now U.S. Pat. No. 4,486,826 |

BACKGROUND OF THE INVENTION

This invention relates to digital computing apparatus and methods that provide essentially continuous operation in the event of numerous fault conditions. The invention thus provides a computer system that is unusually reliable. The computer system also is highly flexible in terms of system configuration and is easy to use in terms of sparing the user from concern in the event of numerous fault conditions. The system further provides ease of use in terms of programming simplifications and in the provision of relatively low-cost hardware to handle numerous operations.

Faults are inevitable in digital computer systems due, at least in part, to the complexity of the circuits and of the associated electromechanical devices, and to programming complexity. There accordingly has long been a need to maintain the integrity of the data being processed in a computer in the event of a fault, while maintaining essentially continuous operation, at least from the standpoint of the user. To meet this need, the art has developed a variety of error-correcting codes and apparatus for operation with such codes. The art has also developed various configurations of equipment redundancies. One example of this art is set forth in U.S. Pat. No. 4,228,496 for "multiprocessor system". That patent provides pairs of redundant processing modules, each of which has at least a processing unit and a memory unit, and which operates with peripheral control units. A fault anywhere in one processing module can disable the entire module and require the module paired with it to continue operation alone. A fault anywhere in the latter module can disable it also, so that two faults can disable the entire module pair.

This and other prior practices have met with limited success. Efforts to simplify computer hardware have often led to unduly complex software, i.e. machine programming. Efforts to simplify software, on the other hand, have led to excessive equipment redundancy, with attendant high cost and complexity.

It is accordingly a general object of this invention to provide a digital computer system which operates with improved tolerance to faults and hence with improved reliability.

Another object of the invention is to provide digital computer apparatus and methods for detecting faults and for effecting remedial action, and for continuing operation, with assured data integrity and essentially without disturbance to the user.

It is also an object of the invention to provide fault-tolerant digital computer apparatus and methods having both relatively uncomplicated software and a relatively efficient level of hardware duplication.

A further object of the invention is to provide fault-tolerant digital computer apparatus and methods which have a relatively high degree of decentralization of error detection and which operate with relatively simple corrective action in the event of an error-producing fault.

A further object of the invention is to provide fault-tolerant digital computer apparatus and methods of the above character which employ different error detection methods and structures for different system components for obtaining cost economies and hardware simplifications.

A more specific object of the invention is to provide a fault-tolerant computer system having a processor module with redundant elements in the bus structure and in the processing, the memory and the peripheral control units so arranged that the module can continue valid operation essentially uninterrupted even in case of faults in multiple elements of the module.

Other general and specific objects of the invention will in part be obvious and will in part appear hereinafter.

SUMMARY OF THE INVENTION

A computer system according to the invention has a processor module with a processing unit, a random access memory unit, and peripheral control units, and has a single bus structure which provides all information transfers between the several units of the module. The computer system can employ only a single such processor module or can be a multiprocessor system with multiple modules linked together. The bus structure within each processor module includes duplicate partner buses, and each functional unit can have a duplicate partner unit. Each unit, other than control units which operate with asynchronous peripheral devices, normally operates in lock-step synchronism with its partner unit. For example, the two partner memory units of a processor module normally both drive the two partner buses, and are both driven by the bus structure, in full synchronism.

Further in accord with the invention, the computer system provides fault detection at the level of each functional unit within a processor module. To attain this feature, error detectors monitor hardware operations within each unit and check information transfers between the units. The detection of an error causes the processor module to isolate the bus or unit which caused the error from transferring information to other units, and the module continues operation. The continued operation employs the partner of the faulty bus or unit. Where the error detection preceeds an information transfer, the continued operation can execute the transfer at the same time it would have occurred in the absence of the fault. Where the error detection coincides with an information transfer, the continued operation can repeat the transfer.

The computer system can effect the foregoing fault detection and remedial action extremely rapidly, i.e. within a fraction of an operating cycle. A preferred embodiment, for example, corrects a questionable information transfer within two clock intervals after detecting a fault-manifesting error. The computer system of this embodiment hence has at most only a single information transfer that is of questionable validity and which requires repeating to ensure total data validity.

Although a processor module according to the invention can have significant hardware redundancy to provide fault-tolerant operation, a module that has no duplicate units is nevertheless fully operational. This feature enables a user to acquire a computer system according to the invention at the low initial cost for a non-redundant configuration and yet attain the full computing capacity. The user can add duplicate units to the system, to increase tne fault-tolerant reliability, as best suited for that user and as economies allow. This is in contrast to many prior computers, which are not expandable in this manner. A computer system according to the invention and having no duplicate units nevertheless provides significant error detection and identification, which can save the user from the results of numerous faults. The attainment of this feature also enables a computer system which has duplicate units to remain operational during removal, repair and replacement of various units.

In general, a processor module according to the invention can include a back-up partner for each unit of the module. Hence, a module can have two central processing units, two main (random access) memory units, two disc control units, two communication control units, and two link control units for linking the processor module to another module to form a multi-processor system. The module further can have a tape control unit, for operation with a magnetic tape memory, but which generally is not duplicated.

This redundancy enables the module to continue operating in the event of a fault in any unit. In general, all units of a processor module operate continuously, and with selected synchronism, in the absence of any detected fault. Upon detection of an error-manifesting fault in any unit, that unit is isolated and placed off-line so that it cannot transfer information to other units of the module. The partner of the off-line unit continues operating and thereby enables the entire module to continue operating, normally with essentially no interruption. A user is seldom aware of such a fault detection and transition to off-line status, except for the display or other presentation of a maintenance request to service the off-line unit.

In addition to the foregoing partnered duplication of functional units within a processor module to provide fault-tolerant operation, each unit within a processor module generally has a duplicate of hardware which is involved in a data transfer. The purpose of this duplication, within a functional unit, is to test, independently of the other units, for faults within each unit. Other structure within each unit of a module, including the error detection structure, is in general not duplicated.

The common bus structure which serves all units of a processor module preferably employs a combination of the foregoing two levels of duplication and has three sets of conductors that form an A bus, a B bus that duplicates the A bus, and an X bus. The A and B buses each carry an identical set of cycle-definition, address, data, parity and other signals that can be compared to warn of erroneous information transfer between units. The conductors of the X bus, which are not duplicated, in general carry module-wide and other operating signals such as timing, error conditions, and electrical power.

A processor module according to the invention detects and locates a fault by a combination of techniques within each functional unit including comparing the operation of duplicated sections of the unit, the use of parity and further error checking and correcting codes, and by monitoring operating parameters such as supply voltages. Each central processing unit in the illustrated computer system, as one specific example, has two redundant processing sections which operate in lock-step synchronism. An error detector compares the operations of the redundant sections and, if the comparison is invalid, isolates the processing unit from transferring information to the bus structure. This isolates other functional units of the processor module from any faulty information which may stem from the processing unit in question. Each processing unit also has a stage for providing virtual memory operation and which is not duplicated. Rather, the processing unit employs parity techniques to detect a fault in this stage.

The random access memory unit of the illustrated computer system is arranged with two non-redundant memory sections, each of which is arranged for the storage of different bytes of a memory word. The unit detects a fault both in each memory section and in the composite of the two sections, with an error-correcting code. Again, the error detector disables the memory unit from transferring potentially erroneous information onto the bus structure and hence to other units.

The memory unit is also assigned the task in the illustrated processor module of checking the duplicated bus conductors, i.e. the A bus and the B bus. For this purpose, the unit has parity checkers that test the address signals and that test the data signals on the bus structure. In addition, a comparator compares all signals on the A bus with all signals on the B bus. Upon determining in this manner that either bus is faulty, the memory unit signals other units of the module, by way of the X bus, to obey only the non-faulty bus.

Peripheral control units for a processor module according to the invention employ a bus interface section for connection with the common bus structure, duplicate control sections termed "drive" and "check", and a peripheral interface section that communicates between the control sections and the peripheral input/output devices which the unit serves. There typically are a disc control unit for operation with disc memories, a tape control unit for operation with tape transports, a communication control unit for operation, through communication panels, with communication devices including terminals, printers and modems, and a link control unit for interconnecting one processor module with another in a multiprocessor system. In each instance the bus interface section feeds input signals to the drive and check control sections from the A bus and/or the B bus, applies output signals from the drive channel to both the A bus and the B bus, tests for logical errors in certain input signals from the bus structure, and tests the identity of signals output from the drive and check channels. The drive control section in each peripheral control unit provides control, address, status, and data manipulating functions appropriate for the I/O device which the unit serves. The check control section of the unit is essentially identical for the purpose of checking the drive control section. The peripheral interface section of each control unit includes a combination of parity and comparator devices for testing signals which pass between the control unit and the peripheral devices for errors.

A peripheral control unit which operates with a synchronous I/O device, such as a communication control unit, operates in lock-step synchronism with its partner unit. However, the partnered disc control units, for example, operate with different non-synchronized disc memories and accordingly operate with limited synchronism. For example, the partner disc control units perform write operations concurrently but not in precise synchronism inasmuch as the disc memories operate asynchronously of one another. A link control unit and its partner also typically operate with this limited degree of synchronism.

The power supply unit for the foregoing illustrated processor module employs two bulk power supplies, each of which provides operating power to only one unit in each pair of partner units. Thus, one bulk supply feeds one duplicated portion of the bus structure, one of two partner central processing units, one of two partner memory units, and one unit in each pair of peripheral control units. The bulk supplies also provide electrical power for non-duplicated units of the processor module. Each unit of the module has a power supply stage which receives operating power from one bulk supply and in turn develops the operating voltages which that unit requires. This power stage in addition monitors the supply voltages. Upon detecting a failing supply voltage, the power stage produces a signal that clamps to ground potential all output lines from that unit to the bus structure. This action precludes a power failure at any unit from causing the transmission of faulty information to the bus structure.

A further feature of the invention is that some units of the processor module execute each information transfer with an operating cycle that includes an error-detecting timing phase prior to the actual information transfer. A unit which provides this operation, an example of which is a control unit for a peripheral device, thus tests for a fault condition prior to effecting an information transfer. The unit inhibits the information transfer in the event a fault is detected. The module, however, can continue operation--without interruption or delay--and effect the information transfer from the non-inhibited partner unit.

Other units of the processor module, generally including at least the central processing unit and the memory unit, for which operating time is of more importance, execute each information transfer concurrently with the error detection pertinent to that transfer. In the event a fault is detected, the unit immediately produces a signal which alerts other processing units to disregard the immediately preceding information transfer. The processor module can repeat the information transfer from the partner of the unit which reported a fault condition. This manner of operation produces optimum operating speed in that each information transfer is executed without delay for the purpose of error detection. A delay only arises in the relatively few instances where a fault is detected.

The invention in one embodiment embraces digital data processor apparatus having at least a central processing unit, a random-access memory unit, a control unit for a mass storage device, and a control unit for a communication device, and further featuring a bus structure having redundant first and second buses and a third bus. The buses are connected with all the units for operating the units and for providing information transfers between them. Fault detection means check each information transfer between any unit and any one or more of the first bus and the second bus. The fault detection means detect fault conditions in a unit and in each of the first and second buses. The embodiment further features logic means responsive to the fault detection means and responding to the absence of any detected fault condition for providing information transfers on both the first bus and the second bus and responding to the detection of a fault in one of the first and second buses to condition all the units to respond only to information-transferring signals on the other of the first and second buses.

A further feature for practice with such an embodiment has a separate fault detection means in each unit for detecting faults in that unit, each separate fault detection means responding to the detection of a fault condition in that unit to apply at least one fault-reporting signal to the third bus for transfer to other units.

The practice of the invention can also provide a priority-determining feature which is characterized in that each of not more than $2^{(n)}$ units connected to the bus structure, where (n) is an integer greater than one, can initiate an information transfer by way of the bus structure and each such unit selectively has a transfer-request signal. At least the third bus or each of the first and second buses has at least (n) conductors for providing priority selection among those units. The apparatus in this instance has plural arbitration circuit means each of which is associated with a different one of the transfer-initiating units. Each arbitration circuit means is connected with the (n) selection conductors, and responds to a transfer-request signal in the associated unit to apply to the selection conductors a parallel rank-responsive digital signal responsive to a unique priority-rank of that unit, and to produce a transfer-initiate output signal in the absence of a rank-responsive signal on the selection conductors from a higher-priority rank. This arbitration logic operates in a single timing interval and requires minimal bus conductors and logic circuitry. Further, it can determine priority for any of numerous operations, including bus requests, channel requests and priority interrupt requests.

A processor module of the foregoing character can also employ, pursuant to a feature of the invention, supply means for providing electrical operating power for the processor, memory and control units, and power logic means responsive to the level of operating power for preventing those units from applying information transfer signals to the buses in the event the operating power is below a selected supply condition.

The central processing unit and the fault detection means of a processor module can include, according to a feature of the invention, first and second processing sections, each of which is arranged for receiving signals from the third bus and from either of the first and second buses, for providing identical processing in response to the received signals, and for producing output signals for application to the bus structure. There also is provided comparator means for comparing corresponding output signals from the first and second processing sections. The comparator means detects fault conditions in the processing unit in response to that signal comparison. The comparator means can also compare corresponding signals which the first and second processing sections receive from the bus structure, and detect a fault condition in response to that comparison of received signals.

The memory unit and the fault detection means of a processor module can include, as a feature of the invention, first and second random access memory sections, each of which is arranged for storing portions of memory words and which together store complete memory words. Means are provided for writing into each memory section a memory word portion received from any of the first and second buses, and means are provided for reading a complete memory word from both memory sections and for applying the memory word selectively to the first and second buses. There is also provided means for checking memory-word parity and for detecting a fault condition in response to invalid memory-word parity.

At least one control unit and the fault detection means of a processor module according to the invention can employ, pursuant to yet another feature, first and second device controlling sections, each of which is arranged to receive signals from at least any of the first and second buses, and each of which is arranged for providing identical operations in response to the received signals and for producing output signals in response to those operations. At least the first such device is arranged to apply output signals to both the first bus and the second bus and to apply output signals to a device connected therewith. This embodiment further employs comparator means for comparing corresponding output signals from the first and second controlling sections. The comparator means detects fault conditions in the one control unit in response to such a signal comparison.

The invention in another embodiment embraces digital data processor apparatus having first and second redundant central processing units, first and second redundant random access memory units, at least a first control unit for a peripheral device, and at least first and second buses, each of which is connected for transferring information between the aforesaid units. Fault detection means are provided for checking each information transfer between units. The fault detection means detects fault conditions in any unit and in any bus. Logic means responsive to the fault detection means are also provided. The logic means respond to the absence of any detected fault condition for providing information transfers on both the buses and identically with both the central processing units and identically with both the memory units, and respond to the detection of a fault in one processing unit to inhibit that unit from driving information-transferring signals onto either bus. The logic means further respond to the detection of a fault in one memory unit to inhibit that unit from driving information-transferring signals onto either bus, and respond to the detection of a fault in one bus to condition all the units to respond only to information-transferring signals on the other bus.

It is also a feature that the logic means provide information transfers which occur on both the buses with lockstep synchronism between the buses.

The invention in a further embodiment embraces digital data processor apparatus having at least one central processing unit, at least one memory unit, at least two control units for peripheral processor devices, and a bus structure connected with each unit for transferring information between the units, and being characterized in that not more than $2^{(n)}$ units which are connected to the bus structure, where (n) is an integer of two or greater, can initiate an information transfer by way of the bus structure, and in that each such unit selectively has a transfer request signal. There are at least (n) selection conductors connected with each transfer-initiating unit, and there are plural arbitration circuits, each of which is associated with a different one of the transfer-initiating units. Each arbitration circuit is connected with the selection conductors, and responds in a single timing interval to a transfer request signal in the associated unit to apply to the selection conductors a parallel rank-responsive digital signal responsive to a priority-rank of that unit, and to produce a transfer initiate signal in the absence of a rank-responsive signal on the selection conductors from a higher-priority rank. Further features are that each arbitration circuit produces the rank-responsive signal with not more than (n) digits, and that each selection conductor is assigned a digit position and is arranged with a number of electrically-isolated conductor segments according to the assigned digit position.

Central processing apparatus according to the invention provides programmable processing of digital information including the transfer of digital information with memory apparatus and with peripheral apparatus by way of any of first and second duplicative buses, and features first and second programmable digital data processing means that are at least substantially alike. Each processing means is arranged for receiving, and for producing, information-transferring signals, and for applying produced signals to at least one bus. Multiplex means connected with the processing means apply the information-transferring signals from either of the first and second buses to both processing means. Further, means are provided for comparing produced signals from the first processing means with those from the second processing means and for producing a fault-reporting signal in response thereto.

The central processing apparatus also features timing control means for operating each processing means to process successive operations from different information-transferring sequences.

Random-access computer memory apparatus according to the invention reads and writes digital information transferred to and from other computer apparatus by way of a bus structure having at least first and second duplicative buses, and further features first and second random access memory means, each of which is arranged for storing portions of memory words and which together are arranged for storing complete memory words. Multiplexor means apply word portions received from any one of the first and second buses to both memory means. Output means apply each memory word portion read from the memory means to both the first and second buses, and code checking means are in circuit with the output means for responding to invalid read-word error checking code to produce a fault-reporting signal.

It is also a feature of the invention to provide in such memory apparatus first code-introducing means for providing a selected code in each word portion applied to each of the memory means, and second code-introducing means for providing a selected further code in each two-portion word applied to the two memory means. The second code-introducing means, in a preferred embodiment, includes means for providing the further code such that the code checking means can detect and correct any single bit error in a memory word.

These and other features of the invention enable a computer system to operate without transferring potentially faulty information from one functional unit to another, except in selected instances where the system attends to the transmission of potentially faulty information within a few clock phases at most of the fault and hence well within a single operating cycle.

The invention attains these and other features as set forth hereinafter with apparatus and methods that detect error-manifesting faults at the functional level of a central processing unit, a memory unit, or individual peripheral control units. As deemed preferable for reliability, the fault detection is implemented in each such unit at a point close to the connection of the unit to other units and/or devices. Further, the detection of error-manifesting faults can readily be distributed timewise so that every timing phase causes an error-checking operation.

The invention accordingly comprises the several steps and the relation of one or more of such steps with respect to each of the others, and the apparatus embodying features of construction, combinations of elements and arrangements of parts adapted to effect such steps, all as exemplified in the following detailed disclosure, and the scope of the invention is indicated in the claims.

BRIEF DESCRIPTION OF DRAWINGS

For a fuller understanding of the nature and objects of the invention, reference should be made to the following detailed description and the accompanying drawings, in which:

FIG. 18 is a block schematic diagram of a power supply stage according to the invention;

FIG. 19 shows timing diagrams illustrating the operation of the circuit of FIG. 18; and FIG. 20 shows a clamp circuit for use in practicing the invention.

DESCRIPTION OF ILLUSTRATED EMBODIMENTS

The Processor Module

Figure 1:
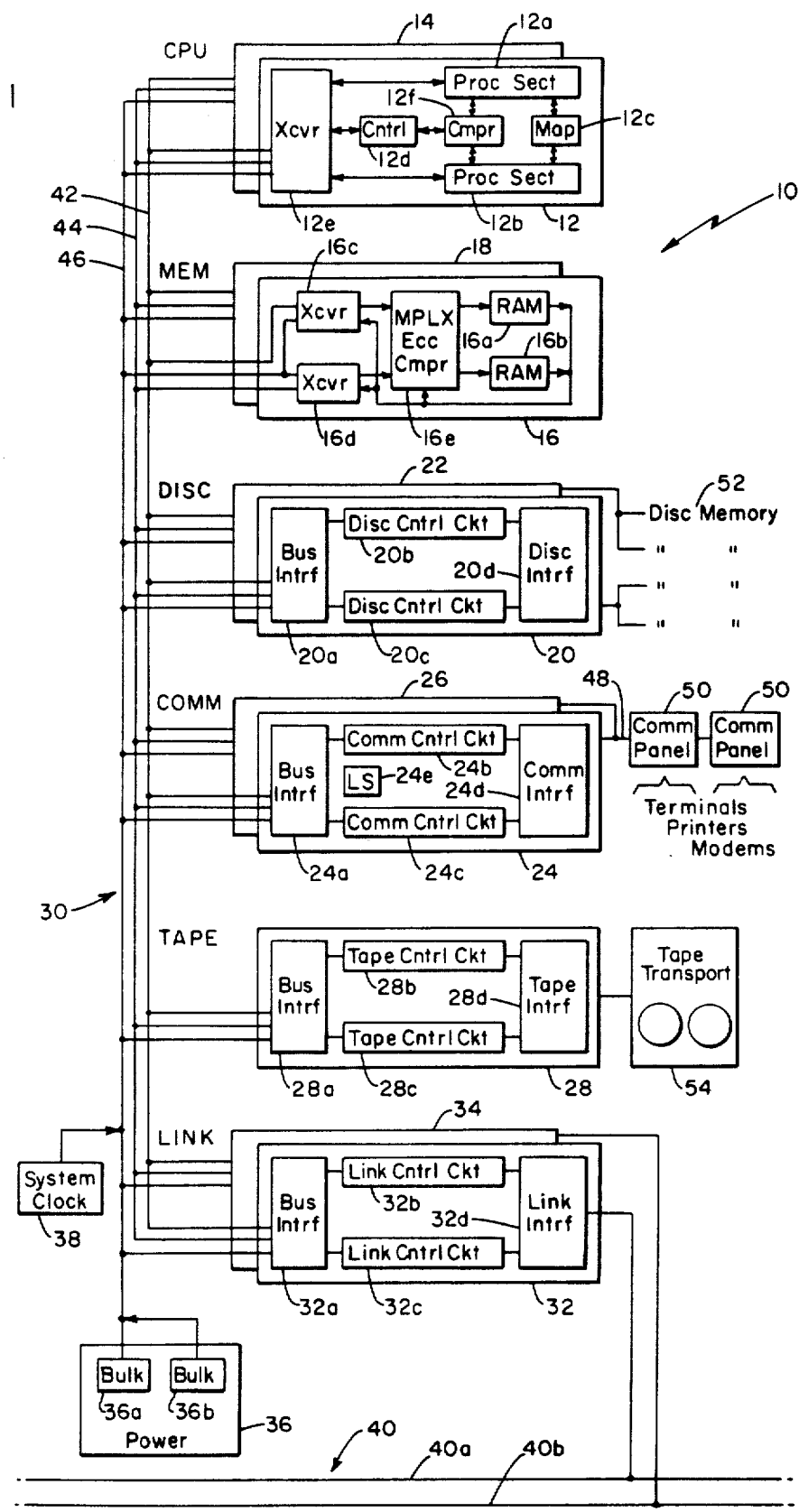
FIG. 1 is a block schematic representation of a computer system according to the invention.

A processor module 10 according to the invention has, as FIG. 1 shows, a central processing unit (CPU) 12, a main memory unit 16, and control units for peripheral input/output devices and including a disc control unit 20, a communication control unit 24 and a tape control unit 28. A single common bus structure 30 interconnects the units to provide all information transfers and other signal communications between them. The bus structure 30 also provides operating power to the units of the module from a main supply 36 and provides system timing signals from a main clock 38.

A module 10 as shown can be connected with a disc memory 52, a communication panel 50 for hooking up communication devices, and with a tape transport 54 to form a complete, single-processor computer system. However, the illustrated module 10 further has a link control unit 32 for connection to other like processor modules by way of a linking bus structure 40. In this manner the module 10 forms part of a multiprocessor computer system.

The bus structure 30 includes two identical buses 42 and 44, termed an A bus and a B bus, and has an X bus 46. In general, the signals on the A bus and on the B bus execute information transfers between units of the module 10. Accordingly, these buses carry function, address, and data signals. The X bus in general carries signals that serve more than one other unit in the module and including main power, timing, status and fault-responsive signals.

With further reference to FIG. 1, each functional unit of the module 10 in accordance with the invention can have a back-up redundant partner unit. Accordingly, the illustrated module has a second central processing unit 14, a second memory unit 18, a second disc control unit 22, a second communication control unit 26, and a second link control unit 4. The system does not have a second tape control unit although such can be provided. It often is not cost effective in a computer system to provide full redundancy with a second tape control unit. Moreover, the absence from the FIG. 1 system of a second tape control unit illustrates that a computer system according to the invention can provide different degrees of tolerance to faults. Thus, not only can a second tape control unit be provided where a user's needs make this desirable, but conversely the system in FIG. 1 can be implemented with any one or more of the illustrated second units omitted.

Each unit 12 through 28, 32 and 34 is connected to all three buses of the bus structure 30. This enables each unit to transfer signals on either or both the A bus and the B bus, as well as on the X bus.

Module Operation

The basic operation of the system 10 is that, in the absence of a fault, the partner central processing units 12 and 14 operate in lock-step synchronism with one another. Thus, both units drive the A bus and the B bus identically, and both are driven identically by the two buses. The same is true for the partner memory units 16 and 18 and again for the partner communication control units 24 and 26. Further, both communication control units 24 and 26 jointly drive and are driven by a communication bus 48 that connects to one or more communication panels 50 which are connected to conventional communication devices such as keyboards, cathode ray tube terminals, printers and modems.

The disc control units 20 and 22, on the other hand, do not operate in full synchronism with one another because the disc memories 52, 52 with which they function operate asynchronously of one another. During fault-free operation, each disc control unit 20 and 22 writes data received from one bus 42, 44 in one memory 52 connected with it. Hence two disc memories, each connected to a different disc control unit, contain identical data. During a read operation, the system reads the stored data from one of these two memories 52 depending on which control unit 20, 22 is available and can effect the read operation in the least time, which typically means with the shortest access time. The two link controllers 32 and 34, moreover, typically are operated independently of one another.

The units 12 through 28 and 32 and 34 of the processor module of FIG. 1 check for fault conditions during each information transfer. In the event a fault is detected, the unit in question is immediately disabled from driving information onto the bus structure 30. This protects the computer system from the transfer of potentially faulty information between any units. The partner of the faulted unit, however, continues operating. The system can thus detect a fault condition and continue operating without any interruption being apparent to the user. The processor module 10 provides this fault-tolerant operation by means of the system structure, i.e. hardware, rather than with an operating system or other software program.

The peripheral control units 20, 22, 24, 26, 28, 32, 34 in the illustrated computer system transfer information to other units with an operating sequence that checks for a fault prior to driving the information onto the bus structure 30. In the event of a fault, the fault unit is inhibited from executing the information drive step, and remains off line. Operation continues, however, with the partner unit alone driving the information onto the bus structure.

It is more timewise efficient, however, for information transfers from the central processing units and from the memory units to proceed without any delay for fault checking. Accordingly, the illustrated central processing units 12 and 14 and illustrated memory units 16 and 18 operate with a sequence in which information is driven onto the bus structure without delay for fault checking. The fault check instead is performed concurrently. In the event of an error-producing fault, during the next clock phase the unit in question drives onto the bus structure a signal instructing all units of the module to disregard the item of information which was placed on the bus structure during the preceding clock phase. The module then repeats the information driving clock phase using only the good partner unit, i.e. the one free of detected faults. The repeat operation aborts the subsequent transfer cycle which would otherwise have driven data onto the bus structure during this subsequent clock phase; that subsequent cycle must be repeated in its entirety.

The processor module 10 of FIG. 1 thus operates in a manner in which a data transfer from any peripheral control units is delayed for one clock phase to provide for a fault-checking step, whereas transfers from the CPU or memory proceed without such delay and are cancelled in the event of a fault detection. In either of the foregoing instances, after completion of an information transfer during which a fault condition was detected, the potentially faulty unit remains isolated from driving information onto the A bus or the B bus, and the partner of the faulty unit continues operating.

Module Organization

FIG. 1 also shows that the central processing unit 12, identical to the partner unit 14, has two processor sections 12a and 12b, a MAP 12c connected with the two processing sections to provide virtual memory operation, a control section 12d and transceivers 12e that transfer signals between the processing unit and the buses 42, 44 and 46. The two processor sections 12a and 12b are provided for purposes of fault detection within the unit 12. They operate essentially identically and in total synchronism with one another. A comparator 12f compares signals output from the two processing sections and produces a fault signal if corresponding signals from the two sections differ. In response to the fault signal, the control section, among other operations, produces an error signal that the X bus 46 transmits to all units of the module 10. The control section then isolates that unit from driving further signals onto the bus structure 30.

The error signal which the failing unit sends to other units is, in the illustrated module, a pair of signals termed an A Bus Error signal and a B Bus Error signal. Any illustrated unit in the module 10 produces this pair of signals on the X bus when it detects certain error-producing faults. Any failing unit also produces an interrupt signal that causes the central processing unit of the module to interrogate the different units to locate the faulty one.

The central processing unit 12 receives power from one of two identical bulk supplies 36a and 36b in the main power supply 36. The partner CPU 14 receives main power from the other bulk supply. Hence a failure of one bulk supply disables only one of the two partner CPUs 12 and 14, and does not impair the other. The control section 12d in the unit 12 has a power stage that produces supply voltages for the CPU 12. The power stage monitors the bus supply voltage from the main system supply 36, and monitors the further voltages it produces, to produce power fault signals. As noted, the hardware of the CPU 12 responds to any fault condition which is developed within the unit to, among other operations, disable the drivers of the transceivers 12e from sending potentially erroneous information from the unit 12 to the bus structure.

With further reference to FIG. 1, the main memory unit 16, identical to the partner memory unit 18, has a random access memory (RAM) that is divided into two RAM sections 16a and 16b. A transceiver 16c is connected with the A bus 42 and the X bus 46 and an identical transceiver 16d is connected with the B bus 44 and the X bus 46. A format section 16e of multiplex, ECC and compare circuitry in the memory unit couples either the A bus or the B bus with the RAM sections 16a and 16b for each memory write operation. A read operation, however, drives data read from the RAM sections onto both buses 42 and 44.

An error checking and correcting (ECC) portion of the memory unit section 16e provides an error checking code on every word written into the RAM sections 16a and 16b and checks the code during each memory read operation. Depending on the syndrome of the error detected in the ECC portion of the section 16e, the memory unit raises a fault signal that is sent to all units of the module 10. More particularly, the faulty memory unit asserts both Bus Error signals. Depending on status set in that memory unit, it either corrects the data and re-transmits it on the A and B buses, or goes off-line. The partner memory unit, if present, responds to the Bus Error signals and re-transmits the correct data.

In addition to testing for faults within the unit, the memory unit 16 provides fault detection for the A and B buses of the module 10. For this purpose, the compare portion of the format section 16e compares all signals which the memory unit 16 receives from the A bus 42 with those the unit receives from the B bus 44. When the module 10, and particularly the buses 42 and 44, are operating without fault, the A bus and the B bus carry identical and synchronized signals. If the signals differ, the compare portion of the section 16e can note the fault. The format section 16e also tests the code of received signals and produces an error signal identifying any bus which has a coding error. The X bus 46 communicates this Bus Error signal to all units of the module 10 to instruct that each disregard the signals on that bus.

The disc control unit 20, identical to the partner disc control unit 22, has a bus interface section 20a, two identical disc control sections 20b and 20c, and a disc interface section 20d. The bus interface section 20a, which in the illustrated system is essentially standard for all control units, couples input signals from either the A bus 42 or the B bus 44, with a multiplexer, to the disc control sections 20b and 20c. It also applies output signals to the A bus an the B bus. However, prior to applying output signals to the buses, the bus interface section 20a compares output signals from the two control sections 20b and 20c and, in the event of an invalid comparison, disables output drivers in the interface section to prevent potentially erroneous signals from being applied to the bus structure 30. The disc control unit 20 receives operating power from one main bulk supply 36a and the partner unit 22 receives operating power from the other bulk supply 36b.

Each illustrated disc control section 20b and 20c has a programmed microprocessor which provides read and write operations and associated control operations for operating the disc memories 52. Two sections are provided to facilitate checking operations within the unit 20. The disc interface section 20d applies control and write data signals from the unit to the disc memories, and applies status and read data signals from the disc memories to the control sections. The disc interface section 20d tests various signals for error-producing faults with parity and comparison techniques.

With continued reference to FIG. 1, the communication control unit 24, like the identical partner 26, has a bus interface section 24a identical in large part at least to the interface section 20a of the disc unit 20. The communication unit 24 also has two communication sections 24b and 24c and a communication interface section 24d. There is also a lock-step circuit 24e that brings the unit 24 into exact synchronism with the partner unit 26. The bus interface section 24a functions essentially like the bus interface section 20a of the disc control unit. In the illustrated module, the communication control section 24b serves as a drive section to provide control, address, data and status functions for the communication panels 50, and the other section serves as a check section to duplicate these operations for error checking purposes. The communication interface section 24b provides error checking functions similar to those described with regard to the disc interface section 20d of the disc control unit 20.

Similarly, the link control unit 32, which is identical to the partner unit 34, has a bus interface section 32a connected with two redundant link control sections 32b and 32c and has a link interface section 32d connected between the two control section sections and the conductor set 40a of the link 40. The partner unit 34 connects with the other conductor set 40b.

The single tape control unit 28 is constructed basically like the other control units with a bus interface section 28a connected with all three buses 42, 44 and 46 of the bus structure 30, with two tape control sections 28b and 28c, and with a tape interface section 28d that connects with a tape transport 54.

Bus Structure Organization

The bus structure 30 which interconnects all units of the FIG. 1 processor module connects to the units by way of a backplane which has an array of connectors, to which the units connect, mounted on a panel to which the bus conductors are wired. The backplane is thus wired with duplicated conductors of the A bus 42 and the B bus 44 and with non-duplicated conductors of the X bus 46.

The illustrated module of FIG. 1 operates in one of three bus or backplane modes; namely, obey both the A bus and the B bus, obey the A bus, or obey the B bus. In all three modes, the A bus and the B bus are driven with identical signals in lock-step synchronization, but units actuated to receive data ignore the other bus in the Obey A mode and in the Obey B mode. In all modes, parity is continually generated, and checked, and any unit may signal that either bus is potentially faulty by producing a Bus A Error signal and/or a Bus B Error signal, depending on which bus appears to have a fault. All units in the system respond to such a single Bus Error signal and switch to obey only the other bus. The central processing unit can instruct all the units simultaneously to switch operating modes by broadcasting a mode instruction.

Figure 2:
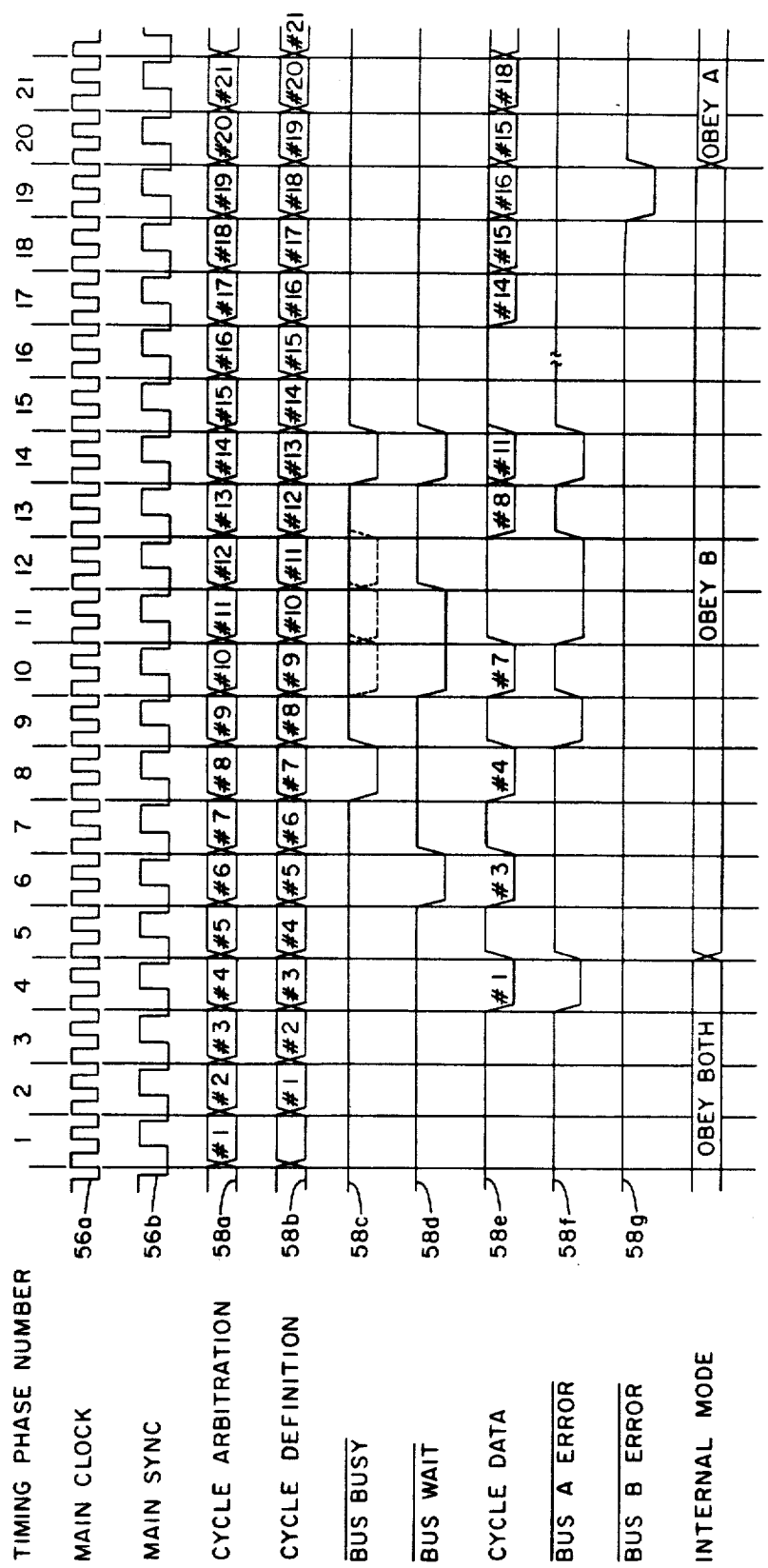
FIG. 2 shows a set of timing diagrams illustrating operation of the bus structure of the computer system of FIG. 1.

The module clock 38, FIG. 1, which applies main clock signals to all units by way of the X bus 46, provides main timing for the transfer of information from one unit to another. To facilitate the production of properly phased timing sequences in different units of the module, the main clock 38 produces, as FIG. 2 shows with waveforms 56a and 56b, both clock and sync timing signals. The illustrated module operates with a sixteen megahertz clock signal and an eight megahertz sync signal and is capable of initiating a new transfer cycle on every 125 nanosecond phase of the sync signal.

Each data transfer cycle has at least four such timing phases and the illustrated system is capable of pipelining four cycles on the backplane bus structure. That is, the system is capable of concurrently performing the last phase of one cycle, the third phase of a second cycle, the second phase of still another cycle, and the first phase of a fourth cycle. The phases are termed, in the sequence in which they occur in a cycle, arbitration phase, definition phase, response phase, and data transfer phase. A cycle can be extended in the case of an error to include fifth and sixth, post-data, phases. These timing phases of an operating cycle are discussed further after a description of the signals that can occur on the bus structure during each phase.

The illustrated processor module of FIG. 1 can produce the following signals on the bus structure 30 in connection with each timing phase designated. Signals which are noted as duplicated are produced on both the A bus and the B bus; other signals are produced only on the X bus.

Arbitration Phase Signals (Duplicated)

Bus Cycle request—Any unit which is ready to initiate a bus cycle can assert this signal. The unit which succeeds in gaining bus access in the arbitration phase starts a cycle during the next phase. The central processing unit has lowest priority for arbitration and frees the next timing phase following assertion of this signal to whatever peripheral control unit that secures access in the arbitration phase.

Arbitration Network—This set of signals interconnects arbitration circuits in the different units of the system for determining the unit with the highest priority which is requesting service, i.e., which is producing a Bus Cycle request. The selected unit is termed the bus master for that cycle.

Definition Phase Signals (Duplicated)

Cycle Definition—The unit designated bus master in the arbitration phase asserts this set of signals to define the cycle, e.g., read, write, I/O, interrupt acknowledge.

Address—The bus master unit asserts the physical address signals identifying the memory or I/O location for the cycle.

Address Parity—the bus master unit also produces a signal to provide even parity of the address and cycle definition signals.

Fast Busy—An addressed slave unit can assert this optional signal to which the central processing unit responds. This signal is followed by a Busy signal during the following Response phase.

Response Phase Signals

Busy—Any unit in a system can assert this signal. It aborts whatever cycle is in the response phase.

Wait—This signal is asserted to extend a cycle and has the effect of repeating the response phase of that cycle and of aborting the following cycle. It is usually asserted by the unit which the bus master unit addressed, i.e. a slave unit which is not ready to effect a data transfer.

Data Transfer Phase Signals (Duplicated)

Data—The data signals, typically sixteen in number, are asserted by the Bus Master unit during a write cycle or by a slave unit during a read cycle.

Upper Data Valid (UDV)—This signal is asserted if the upper byte of the data word is valid.

Lower Data Valid (LDV)—This signal is asserted if the lower byte of the data word is valid.

Data Parity—This signal provides even parity for the data, UDV and LDV lines of the bus structure.

Fast ECC Error—A slave unit asserts this signal during a read operation, with the data, to signal the Bus Master of a correctable memory error. It is followed by both Bus Error signals in a post-data phase. Slow master units such as a disc control unit may ignore this signal and merely respond to the ensuing Bus Error signals.

Miscellaneous Duplicated Signals

Bus PI Request—A unit requiring service asserts one of these signals at the appropriate level of interrupt priority.

Miscellaneous Non-Duplicated Signals

Bus A Error—A unit which detects an error on the A bus asserts this signal during the next timing phase.

Bus B Error—A unit which detects an error on the B bus asserts this signal during the next timing phase.

Bus Clock and Bus Synchronization—The system clock 38 produces these master timing signals.

Maintenance Request—A unit requiring a low priority maintenance service asserts this signal. It is usually accompanied by turning on an indicator light on that unit.

Slot Number—These signals are not applied to the bus structure but, in effect, are produced at the backplane connectors to identify the number and the arbitration priority assigned each unit of the processor module.

Partner Communication—These signals are bused only between partner units.

Bulk Power—These are the electrical power lines (including returns) which the bus structure carries from the bulk power supplies 36a and 36b to different units of the module 10.

Cycle Phases

During an arbitration phase, any unit of the processor module 10 of FIG. 1 and which is capable of being a bus master and which is ready to initiate a bus cycle, arbitrates for use of the bus structure. The unit does this by asserting the Bus Cycle Request signal and by simultaneously checking, by way of an arbitration network described below, for units of higher priority which also are asserting a Bus Cycle Request. In the illustrated system of FIG. 1, the arbitration network operates with the unit slot number, and priority is assigned according to slot positions. The unit, or pair of partnered units, which succeeds in gaining access to the bus structure during the arbitration phase is termed the bus master and starts a transfer cycle during the next clock phase.

The central processing unit 12, 14 in the illustrated system has the lowest priority and does not connect to the arbitration lines of the bus structure. The CPU accordingly does not start a cycle following an arbitration phase, i.e., a timing phase in which a Bus Cycle Request has been asserted. It instead releases the bus structure to the bus master, i.e. to the successful peripheral unit. Further, in the illustrated system, each memory unit 16, 18 is never a master and does not arbitrate.

During the definition phase of a cycle, the unit which is determined to be the bus master for the cycle defines the type of cycle by producing a set of cycle definition or function signals. The bus master also asserts the address signals and places on the address parity line even parity for the address and function signals. All units of the processor module, regardless of their internal operating state, always receive the signals on the bus conductors which carry the function and address signals, although peripheral control units can operate without receiving parity signals. The cycle being defined is aborted if the Bus Wait signal is asserted at this time.

During the response phase, any addressed unit of the system which is busy may assert the Busy signal to abort the cycle. A memory unit, for example, can assert a Bus Busy signal if addressed when busy or during a refresh cycle. A Bus Error signal asserted during the response phase will abort the cycle, as the error may have been with the address given during the definition phase of the cycle.

Further, a slow unit can assert the Bus Wait signal to extend the response phase for one or more extra timing intervals. The Bus Wait aborts any cycle which is in the definition phase.

Data is transferred on both the A bus and the B bus during the data transfer phase for both read and write cycles. This enables the system to pipeline a mixture of read cycles and write cycles on the bus structure without recourse to re-arbitration for use of the data lines and without having to tag data as to the source unit or the destination unit.

Full word transfers are accompanied by assertion of both UDV and LDV (upper and lower data valid) signals. Half word or byte transfers are defined as transfers accompanied by assertion of only one of these valid signals. Write transfers can be aborted early in the cycle by the bus master by merely asserting neither valid signal. Slave units, which are being read, must assert the valid signals with the data. The valid signals are included in computing bus data parity.

Errors detected during the data transfer phase will cause the unit which detects the error to assert one or both of the Bus Error signals in the next timing phase, which is a first post-data phase. In the illustrated module of FIG. 1, the peripheral control units wait to see if an error occurs before using data. The central processing unit and the main memory unit of the system however, use data as soon as it is received and in the event of an error, in effect, back up and wait for correct data. The assertion of a Bus Error signal during a post-data phase causes the transfer phase to be repeated during the next, sixth, phase of the transfer cycle. This aborts the cycle, if any, that would otherwise have transmitted data on the bus structure during this second post-data, i.e. sixth, phase.

The normal backplane mode of operation of the illustrated system is when all units are in the Obey Both mode, in which both the A bus and the B bus appear to be free of error. In response to an error on the A bus, for example, all units synchronously switch to the Obey B mode. The illustrated processor module 10 returns to the Obey Both mode of operation by means of supervisor software running in the central processing unit.

In both the Obey B and the Obey A modes of operation, both the A bus and the B bus are driven by the system units and all units still perform full error checking. The only difference from operation in the Obey Both mode is that the units merely log further errors on the one bus that is not being obeyed, without requiring data to be repeated and without aborting any cycles. A Bus Error signal however on the obeyed bus is handled as above and causes all units to switch to obey the other bus.

As stated, the FIG. 1 power supply 36 provides electrical operating power to all units of the system from the two bulk supplies 36a and 36b. In the illustrated system, one bulk supply provides operating power only to all even slot positions and the other provides power only to all odd slot positions. Thus in a fully redundant system according to the invention, a failure of one bulk supply 36a, 36b only stops operation of half the system; the other half remains operative.

Pipelined Phases

FIG. 2 illustrates the foregoing operation with four pipelined multiple-phase transfer cycles on the bus structure for the FIG. 1 module 10. Waveforms 56a and 56b show the master clock and master synchronization signals which the FIG. 1 clock 38 applies to the X bus 46, for twenty-one successive timing phases numbered (1) to (21) as labeled at the top of the drawing. The arbitration signals on the bus structure, represented with waveforms 58a, change at the start of each timing phase to initiate, in each of the twenty-one illustrated phases, arbitration for a new cycle as noted with the cycle-numbering legend #1, #2, #3 ... #21. FIG. 2 also represents the cycle definition signals with waveform 58b. The cycle definition signals for each cycle occur one clock phase later than the arbitration signals for that cycle, as noted with the cycle numbers on the waveform 58b. The drawing further represents the Busy, Wait, Data, A Bus Error, and B Bus Error signals. The bottom row of the drawing indicates the backplane mode in which the system is operating and shows transitions between different modes.

With further reference to FIG. 2, during timing phase number (1), the module 10 produces the cycle arbitration signals for cycle #1. The system is operating in the Obey Both mode as designated. The Bus Master unit determined during the cycle arbitration of phase (1) defines the cycle to be performed during timing phase (2), as designated with the legend #1 on the cycle definition signal waveform 58b. Also in timing phase (2), the arbitration for a second cycle, cycle #2, is performed.

During timing phase (3) there is no response signal on the bus structure for cycle #1, which indicates that this cycle is ready to proceed with a data transfer as occurs during timing phase (4) and as designated with the #1 legend on the data waveform 58e. Also during timing phase (3), the cycle definition for cycle #2 is performed and arbitration for a further cycle #3 is performed.

In timing phase (4), the data for cycle #1 is transferred, and the definition for cycle #3 is performed. Also, a Bus A Error is asserted during this timing phase as designated with waveform 58f. The error signal aborts cycle #2 and switches all units in the module to the Obey B mode.

The Bus A Error signal of timing phase (4) indicates that in the prior timing phase (3) at least one unit of the system detected an error regarding signals from the A bus 42. The error occurred when no data was on the bus structure, as indicated by the absence of data in waveform 58e during timing phase (3), and there hence is no need to repeat a data transfer.

During timing phase (5), with the system operating in the Obey B mode, a fifth cycle is arbitrated, the function for cycle #4 is defined and no response signal is present on the bus structure for cycle #3. Accordingly that cycle proceeds to transfer data during time phase (6), as FIG. 2 designates. Also in time phase (6), a Bus Wait is asserted, as appears in waveform 58d; this is in connection with cycle #4. The effect is to extend that cycle for another timing phase and to abort cycle #5.

A new cycle #7 is arbitrated in timing phase (7) and the definition operation proceeds for cycle #6. In time phase (8), the data for cycle #4 is applied to the bus structure for transfer.

Also in time phase (8), a Busy signal is asserted. This signal is part of the response for cycle #6 and aborts that cycle.

The arbitration and definition operations in time phase (9) follow the same pattern but another Bus A Error is asserted. The system already is operating in the Obey B mode and accordingly the response to this signal is simply to log the error.

The Bus Wait signal asserted in time phase (10) and continuing to time phase (11) extends cycle #8 for two further time phases, so that the data for that cycle is transferred during time phase (13), as designated. The Bus Wait signal asserted during these phases also aborts cycles #9 and #10, as shown. Any Busy signal asserted during phase (10), (11) or (12) in view of the extention of cycle #8 by the Wait signal, would abort cycle #8. Note that the data transfer for cycle #7 occurs in time phase (10) independent of the signals on the Wait and the Busy conductors during this time phase.

Further Bus A Error signals occurring during time phases (11), (12) and (14) again have no effect on the system other than to be logged, because the system is already operating in the Obey B mode.

The Wait signal asserted during time phase (14) aborts cycle #13. Also, it extends cycle #12, which however is aborted by the Busy signal asserted during time phase (14). This, however, is not a common sequence.

Data for cycle #11 is transferred in the normal sequence during time phase (14). Further, the data transfer for cycle #14 occurs in time phase (17).

In time phase (19), immediately following the cycle #15 data transfer of time phase (18), a Bus B Error is asserted. This error signal aborts cycle #17, which is in the response phase, and initiates a repeat of the data transfer for cycle #15. The repeat transfer occurs during cycle #20. Further, this error signal switches the module to the Obey A mode.

Control logic in each unit of the FIG. 1 processor module 10 provides the operations in that unit for executing the foregoing bus protocol which FIG. 2 illustrates. The protocol which control logic in each peripheral control unit thus provides includes conditioning the unit, when first turned on, to receive signals on both the A bus 42 and the B bus 44 and to process the two sets of signals as if they are identical. Each illustrated central processor unit and memory unit, which process signals received from a single one of the duplicated buses, initially receives signals on the A bus 42, but operates as if the signals on the B bus 44 are identical. Further, the control logic in all units initially conditions the unit to transmit signals identically on both the A and the B buses, in lock-step synchronism.

The control logic in each illustrated peripheral control unit responds to the A bus error signal and to the B bus error, transmitted on the X bus 46, to condition the unit for the following operation. A Bus Error signal for the A (or B) bus causes the unit, and hence all units in a processor module, to stop receiving on both buses and to receive only on the other bus, i.e. the B (or A) bus, commencing with the first timing interval following the one in which the Bus Error signal first appears on the X bus. The units continue however to transmit signals on both the A and the B buses.

After a peripheral control unit has responded to an A(or B) Bus Error signal by switching to receiving on only the B (or A) bus, the control logic therein does not again switch in response to further Bus Error signals for the A (or B) bus; it essentially ignores the further error signals. However, the control logic responds to a B (or A) Bus Error signal by switching the unit to receive on the A (or B) bus, and it then ignores further B (or A) Bus Error signals.

In the illustrated module, faulty information is transmitted on the A and/or B buses generally only by the central processing unit and by the memory unit. This is because the illustrated peripheral control units check for faults prior to transmitting information on the A and B buses. If a fault is detected, the control unit in question does not transmit information, and only the partner unit does.

Further, each unit applies address and data signals on the A and B buses with parity which that unit generates. The memory unit serves, in the illustrated embodiment, to check bus parity and to drive the appropriate bus error line of the X bus 46 during the timing interval immediately following the interval in which it detected the bus parity error. The memory unit also sets a diagnostic flag and requests a diagnostic interrupt.

All units of a module which arbitrate for access to the bus structure, as discussed further in the next section, include logic that checks for false operation of the bus arbitration logic and that drives the appropriate bus error line—in the event of such a fault—on the interval following the detection of the fault. This is described further with reference to FIG. 12B. The unit also sets a diagnostic flag and requests a diagnostic interrupt.

The bus protocol which control logic in each unit provides further conditions that unit to provide the following operation in response to a Bus Error signal for the bus which the unit is presently conditioned to receive. (These operations do not occur for a Bus Error signal for a bus which is not being received; as noted the unit essentially ignores such an error signal.) A unit which was transmitting cycle definition signals during the interval immediately preceding the one in which the Bus Error signal appears on the X bus re-initiates that cycle, including arbitration for the bus, if that cycle continues to be needed. This is because the Error signal causes any unit receiving the cycle definition signals to abort that cycle.

A unit which was transmitting data signals during the timing interval immediately preceding the one in which the Bus Error signal appears on the bus repeats the data transmission two intervals after it was previously sent, i.e. on the interval following the one in which the Error Signal appears on the bus.

A unit receiving definition signals for a cycle and which is identified (addressed) by such signals responds to the Bus Error during the next interval by aborting that cycle.

A unit which was receiving data signals during the interval immediately preceding the one in which the Bus Error signal appears on the bus ignores that data and receives a re-transmission of that data two intervals after the ignored one. An alternative is for the unit to receive and latch the data from both buses and uses only the data from the good bus.

When a unit simultaneously receives Bus Error signals for both the A and the B buses, which indicates a memory ECC error, the unit responds exactly as it does to a Bus Error signal for a single bus being received, as discussed above, except that it does not make any change in the bus(es) to which it is responding. Thus an ECC error aborts any cycle that was placing cycle definition signals on the bus in the preceding interval, and it causes any data transfer in that preceding interval to be repeated in the next interval following the ECC error.

As FIG. 2 illustrates, a Wait signal aborts any cycle placing definition signals on the bus in the same interval when the Wait signal occurs, and it delays, until the second interval after the Wait terminates, the data transfer for a cycle that placed definition signals on the bus in the interval preceding initiation of the Wait. The occurrence of a Busy signal aborts a cycle that was placing definition signals on the bus in the preceding interval.

Control logic for implementing the foregoing bus protocol and related operations in the several units of a processor module for practice of this invention can be provided using conventional skills, and is not described further, other than as noted.

Arbitration Network

Figure 3:
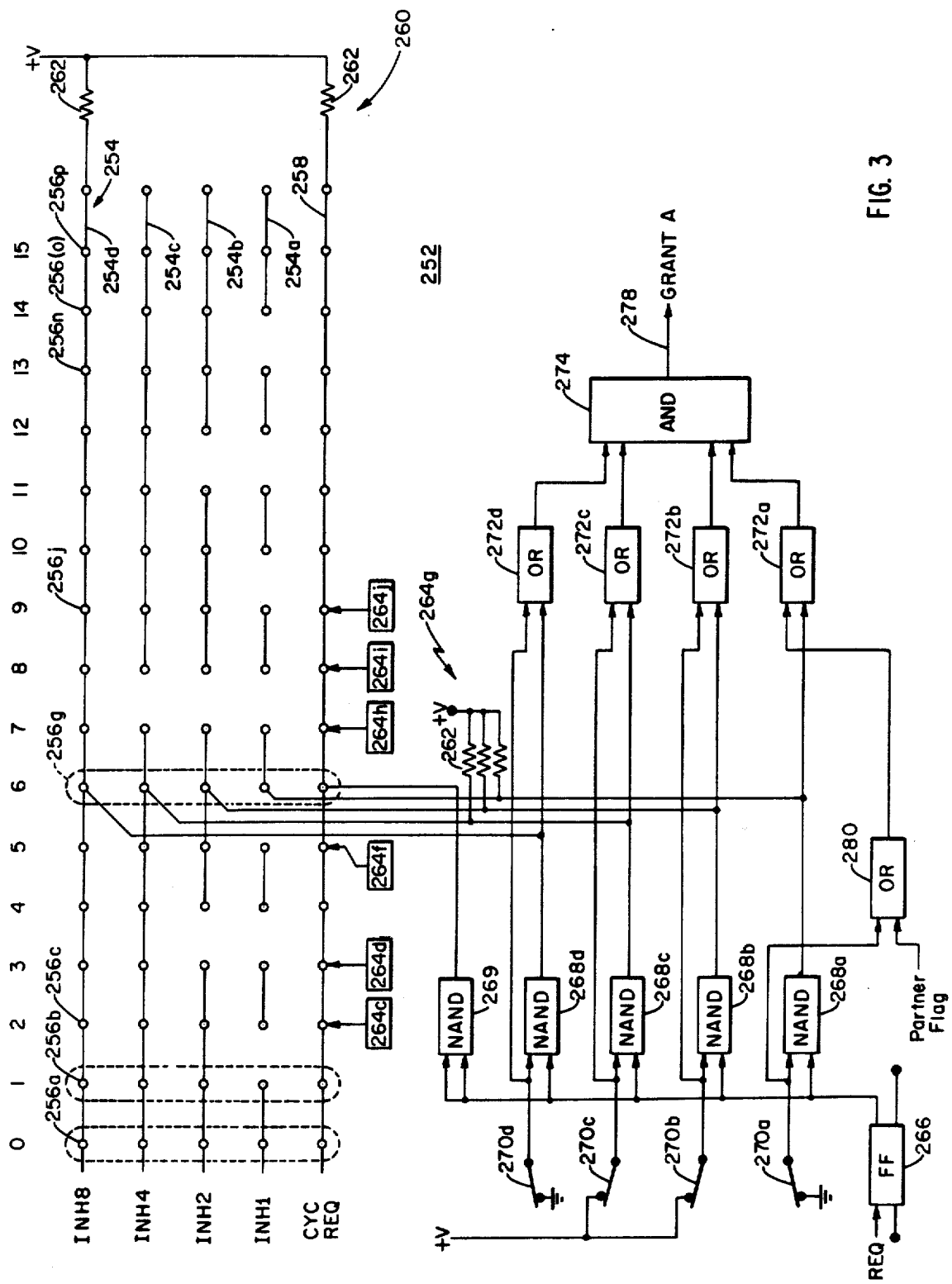
FIG. 3 is a schematic representation of arbitration circuits for use in the system of FIG. 1.

With reference to FIG. 3, the illustrated processor module 10 of FIG. 1 has two arbitration networks, a network 252 connected with the set of arbitration conductors 254 of the A bus 42 and another network (not shown) connected with the arbitration conductors of the B bus 44. The two networks are identical. Each arbitration network includes an arbitration circuit in each unit that competes to initiate a cycle on the bus structure. Thus each such unit has two arbitration circuits, one of which connects to the A bus 42 and the other to the B bus 44. Each arbitration network, which thus includes conductors of one bus 42 or 44 and arbitration circuits, provides an automatic hardware determination of which unit, or pair of partner units, that requests access to the bus structure has priority to initiate an operating cycle. That is, the arbitration network receives a Cycle Request signal from a unit when the operation of that unit requires a data transfer with another unit of the system, and the arbitration network determines, in each timing phase, which requesting unit has highest priority.

Each unit that arbitrates for access to the bus structure is assigned a relative priority according to the slot number at which that unit connects to the bus structure. In the illustrated system slot number zero has the lowest priority, and partner units are assigned successive slot numbers, an even number and the next odd number.

FIG. 3 illustrates the arbitration network 252 of the A bus with the connection of a set of four arbitration conductors 254a, 254b, 254c and 254d of that bus to sixteen electrical receptacles 256a, 256b, ... 256p on the system backplane. Each receptacle 256 is assigned a slot number, the illustrated receptacles being numbered accordingly from zero to fifteen. Each receptacle 256 is illustrated simply as a vertical column of connections to the four arbitration conductors 254 and to a cycle request conductor 258. This network thus has four arbitration conductors and can handle up to $(2)^4$ or sixteen units, each connected to a separate receptacle 256. A network with five arbitration conductors, for example, can handle up to thirty-two access-requesting units.

The cycle request conductor 258 extends continuously along the A bus 42 to all the receptacles, as FIG. 3 shows. The arbitration conductors 254 on the other hand are segmented according to binary logic such that only one, the conductor 254d which is assigned the binary value $(2)^3$ extends continuously to all sixteen connectors. This conductor carries a signal designated Inhibit (8) (Inh 8). The remaining conductors 254c, 254b, and 254a are designated as carrying respectively an Inhibit (4) signal, an Inhibit (2) signal and an Inhibit (1) signal. The arbitration conductor 254c is segmented so that each segment connects to eight successive priority-ordered receptacles 256. Thus, this conductor 254c has a first segment which connects together the receptacles assigned to slot numbers (0) through (7) and has a second segment which connects together the receptacles in slot numbers (8) through (15). Similarly, the Inhibit (2) conductor 254b is segmented to connect together every four successive priority-ordered receptacles, and the conductor 254a is segmented to connect together only every two successive ordered receptacles. In each instance there is no connection along a given arbitration conductor between the different segments thereof or between different ones of those conductors.

A bus terminator 260 on the backplane connects the INH 8 arbitration conductor 254d and the cycle request conductor 258 to a positive supply voltage through separate pull-up resistors 262, 262. Further pull-up resistors 262 are connected to from each segment of the arbitration conductors 254a, 254b and 254c to the pull-up supply voltage. These connections thus tend to maintain each conductor 254 segment and conductor 258 at a selected positive voltage, i.e., in a pull-up condition. A grounded or other low voltage external signal is required to pull the voltage of any given conductor or conductor segment down from that normal positive condition.

FIG. 3 further shows an arbitration circuit 264g for one typical unit in a processor module according to the invention. The illustrated arbitration circuit is for the unit connected to the bus receptacle 256g at slot number (6). An identical circuit 264 can be connected to each other receptacle 256a, 256b ... etc., up to the number of arbitrating units in the module. Central processing units and memory units do not connect to the arbitration network, but the illustrated processing units respond to slot numbers zero and one. Hence for the processor 10 of FIG. 1, by way of illustrative example, the link units 32 and 34 have the next lowest arbitration priority and the circuits 264 therein are connected to receptacles 256c and 256d. No unit is connected to receptacle 256e and the tape unit 28 is connected to receptacle 256f. The circuits 264 in the communication units 24 and 26 and in the disc units 20 and 22 are connected to receptacles 256g/h/i and j, respectively.

The illustrated arbitration circuit 264g includes a separate pull-up resistor 262 connected to the pull-up supply voltage from the connections therein to segments of conductors 254c, 254b, and 254a. The circuit 264g further has a flipflop 266 that is switched to the set state in response to a Request signal produced within the unit. The set output from the flip-flop 266 is applied to one input of each of four NAND gates 268a, 268b, 268c and 268d and to both inputs of a further NAND gate 269. The illustrated arbitration circuit also has a set of four selective connections 270a, 270b, 270c and 270d, each of which applies either a ground level or an assertive positive voltage to one NAND gates 268a, 268b, 268c and 268d, respectively. The set of connections 270 is associated with one specific backplane slot and is set according to that slot number and hence to specify the arbitration priority of the unit plugged in or otherwise connected to that slot. Accordingly, the connections of the illustrated circuit 264g for slot number (6) are set as illustrated to apply the binary equivalent this slot number, i.e., 0110, to the four NAND gates. One preferred arrangement to produce the multiple digit parallel signal identifying each slot number is to provide a binary-coded set of connections 270 on the backplane at each connection to it.

The output signals from the NAND gates 268 are connected to the arbitration conductors and to OR gates 272, the outputs of which are applied to an AND gate 274. More particularly, the output from the NAND circuit 268a associated with the binary value $(2)^0$, and connected with the connection 270a, is connected to the Inhibit (1) bus conductor 254a and to an input of OR gate 272a. Similarly, the outputs from the next three higher binary-valued NAND gates 268b, 268c and 268d are connected respectively to the Inhibit (2), Inhibit (4), and Inhibit (8) bus conductors, and to one input of the OR gates 272b, 272c and 272d respectively, as shown. The output from the request NAND gate 269 is connected to the cycle request conductor 258.

The arbitration circuit 264g of FIG. 3 produces an assertive output signal, termed Grant A, from the output AND gate 274 when it receives a Request signal at the flip-flop 266 in a time phase when no arbitration circuit connected to higher priority backplane connectors 256 receives a like request signal. More particularly, when the unit in which the illustrated arbitration circuit 264g is connected applies a request signal to the flip-flop 266, the resultant assertive signal from the set output terminal actuates the four NAND gates 268a, 268b, 268c and 268d to apply to the arbitration conductors 254a, 254b, 254c and 254d a set of signals corresponding to the backpanel slot number as produced by the connection 270. The flip-flop 266 also actuates the NAND gate 269 to apply an assertive signal to the Cycle Request conductor 258. That is, when the output of the flip-flop 266 is at a high assertive value, it applies a high input signal to the NAND gate 268a, which also receives a low input signal from the slot-number connection 270a. The gate 268a accordingly produces a high level output signal which does not pull down the normal plus V level of the Inhibit (1) conductor 254a. Each NAND gate 268b and 268c, on the other hand, receives both a high level input signal from the flip-flop 266 and from the connection 270b, 270c to which it is connected and accordingly applies a low level signal to the Inhibit (2) and Inhibit (4) conductors, respectively. The NAND gate 268d produces a high level output to the Inhibit (8) conductor, which remains at tne normal pull-up value. The cycle request conductor 258 is pulled down from that level by a low level output from the NAND gate 269.

Each OR gate 272 receives as input signals one digit of the slot-number signal and the potential on the corresponding arbitration conductor at that slot. By virtue of the connections of the NAND gate 268 outputs to the segmented arbitration conductors 254, a request signal applied to a higher priority arbitration circuit 264 alters the signals which the OR gates 272 in circuit 264g otherwise receive from within that circuit 264g. A request signal applied to a lower priority arbitration circuit 264, on the other hand, does not alter the states of the signals applied to the OR gates 272 in the arbitration circuit 264g.

In particular, in the absence of any other arbitration circuits receiving an assertive request signal, the OR gate 272a in the arbitration circuit 264g receives a high level signal from the NAND gate 268a and receives a low level signal from the connection 270a; it accordingly produces a high level output signal. The same input signals are applied to the OR gate 272d and it also produces a high level output signal. The OR gate 272b on the other hand receives a low level signal from the NAND gate 268b and receives a high level signal from the connection 270b. Hence the OR gate 272b receives two different valued input signals and produces a high level output signal. The input conditions to the OR gate 272c also differ in this same manner. Thus, under this operating condition, all four OR gates 272b produce identical, high level, output signals. In response, the AND gate 274 produces an assertive Grant A output signal on line 278. This signal causes the associated unit of the processor module to initiate a cycle of operations, as discussed above with reference to FIG. 2.

In the event that an arbitration circuit 264 in a lower priority unit is also activated by a request signal, the input signals to the OR gates 272 of the illustrated arbitration circuit 264g are unchanged from the example just described. However, in the event a higher priority unit produces a request signal, the inputs to the OR gates of the illustrated arbitration circuit 264g are different, and the output AND gate 274 does not produce an assertive signal. For example, when the system unit connected to the next higher priority receptacle 276h produces a request signal, the arbitration circuit therein applies a low level signal not only to the Inhibit (4) and Inhibit (2) conductors, but also to the Inhibit (1) conductor. The resultant low level signal on the latter conductor is applied to the OR gate 272 in the circuit 264g connected to the number (6) slot. That OR gate accordingly produces a low level output signal, thereby inhibiting the AND gate 274 at slot (6) from producing an assertive output signal.

Note that the foregoing operation employs NAND gates 268 that produce a high level output signal with a relatively high impedance. A NAND gate with an open-collector circuit, for example, provides this operation, which facilitates pulling the voltage on an arbitration conductor segment to a low level.

The arbitration circuit 264g in FIG. 3 further has an OR gate 280 connected between the switch 270a and input to the OR gate 272a. The other input to the OR gate 280 is an assertive level that comes from a hardware status flag that is set to allow an even-odd pair of backplane slots, to which are connected two units operating as partners, to arbitrate as a single unit. The OR gate 280 thus is optional and is used only where a unit of the system 10 may operate in lock-step synchronism with a partner unit.

It will now be understood that each unit of a processing module which competes, via the arbitration network, to define a bus cycle has two arbitration circuits 264. One is connected to the A bus as FIG. 3 shows, and the other is connected in the identical manner to the B bus, and the latter arbitration circuit produces a Grant B signal when it prevails in an arbitration phase. The response within a unit to assertive Grant signals is discussed below with reference to FIG. 12.

Central Processing Unit

Figure 4:
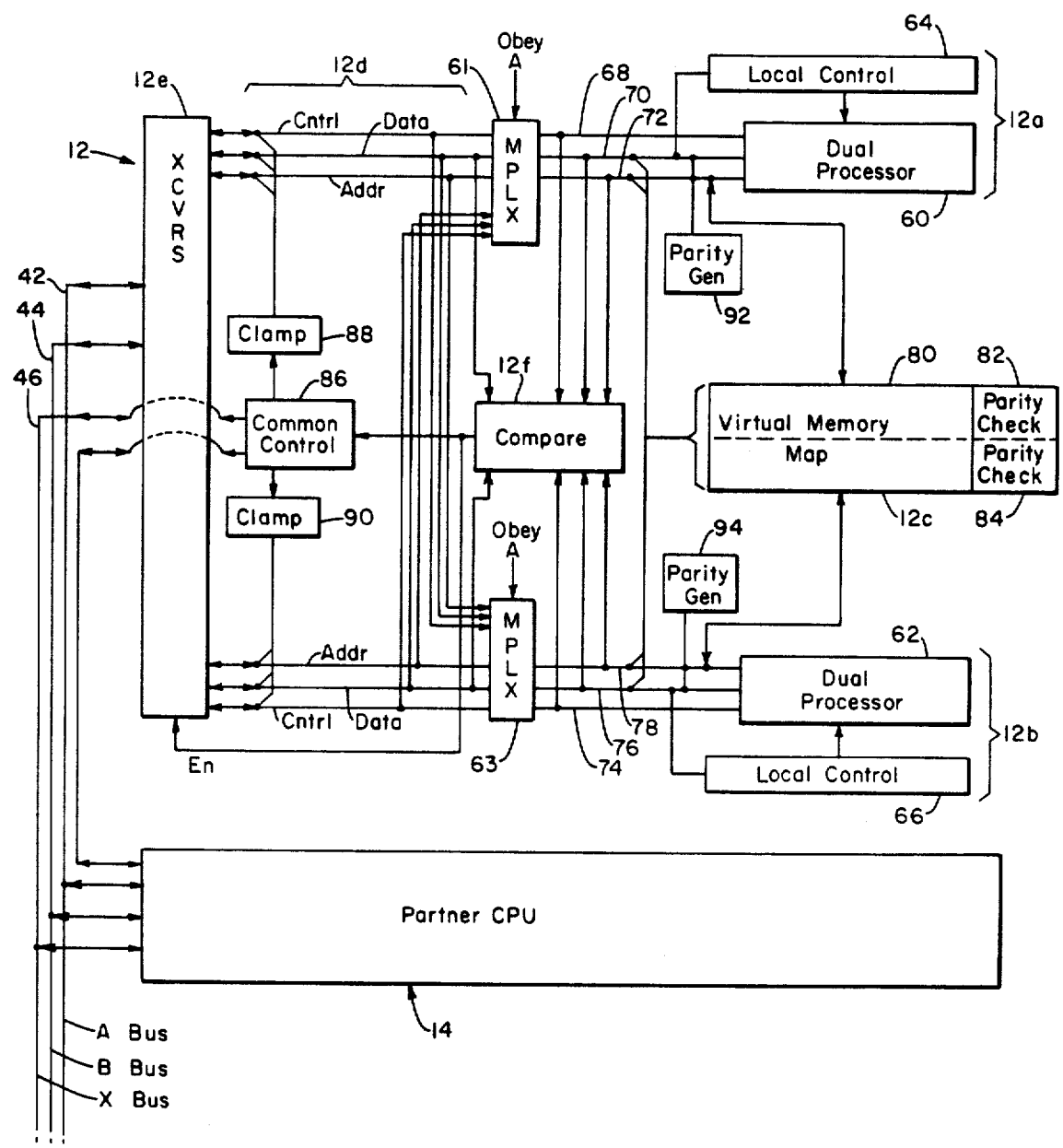
FIG. 4 is a functional block representation of central processing units for the system of FIG. 1.

FIG. 4 shows that the illustrated central processing unit 12 of FIG. 1 has, in each processing section 12a and 12b, a dual processor 60 and 62, respectively. Control lines 68, data lines 70 and address lines 72 connect from the dual processor 60 to a multiplexor 61 that connects transceivers 12e that connect to the buses 42 and 44.

Similarly, control lines 74, data lines 76 and address lines 78 connect from the other dual processor 62 to the transceivers 12e by way of a multiplexor 63. Each multiplexor in the illustrated unit 12 selectively applies input signals received from either the A bus or the B bus to the dual processors 60 and 62. Output signals from the processor 60 are, in the described embodiment, applied only to the A bus, and those from the processor 62 are applied only to the B bus. A local control stage 64, 66 is associated with each dual processor 60, 62, respectively. Each processing section also has a parity generator 92, 94 for providing selected parity on the data and address signals which that processing section sends out on the buses 42 and 44.

The comparator 12f checks for error-producing faults by comparing address signals which the two processing sections 12a and 12b receive on the address lines 72 and 78. The comparator also checks the output signals from the two processing sections to the bus structure, i.e. compare the signals on the control, data and address lines from the dual processor 60 with the signals on the corresponding lines from the processor 62.

The two processing sections 12a and 12b use a single virtual memory MAP 80 to convert virtual memory addresses on the address lines 72 and 78 to physical memory addresses. The MAP 80 also connects to both sets of data lines 70 and 76. Parity check circuits 82 and 84 ensure the validity of the MAP 80, which is not duplicated within the unit 12.

Any mismatch of corresponding signals applied to the comparator 12f causes a comparison error signal, which is applied to a common, non-duplicated control stage 86. In response, the control stage sends out error signals on the X bus 46. It also disables the drivers in the transceivers 12e to take the processing unit 12 off-line so that it cannot send further signals to other units of the FIG. 1 system. The control stage 86 also monitors the two parity error signals from the parity check circuits 82 and 84. The control stage 86 is part of the CPU control section 12d (FIG. 1), which also includes clamp circuits 88 and 90. The clamp circuits respond to a power failure at the unit 12 to clamp to ground, at the transceiver 12e drivers, all output lines from the processing unit 12 to the bus structure 30.

Figure 5A:
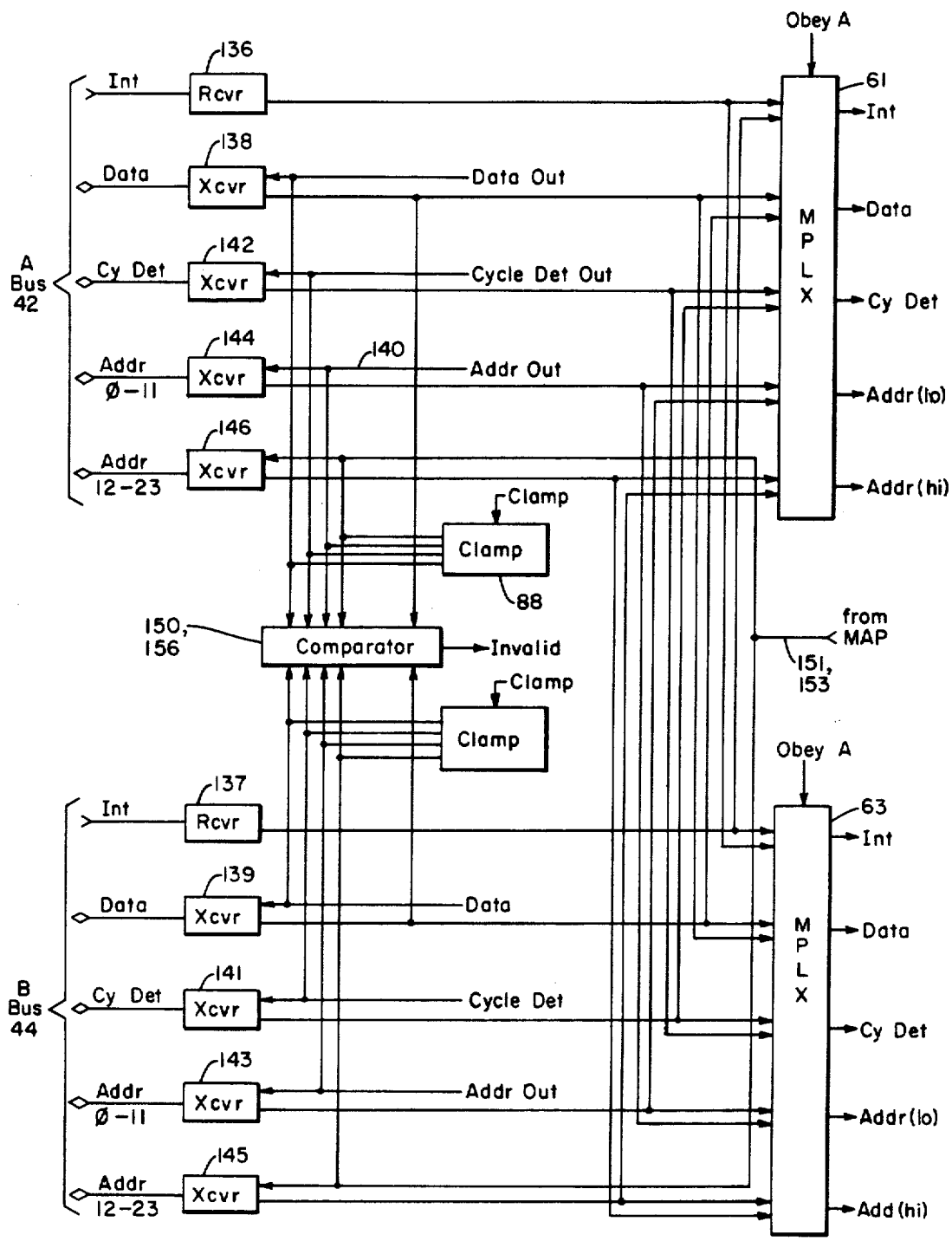
FIGS. 5A and 5B form a block schematic diagram of one central processing unit according to the invention.
Figure 5B:
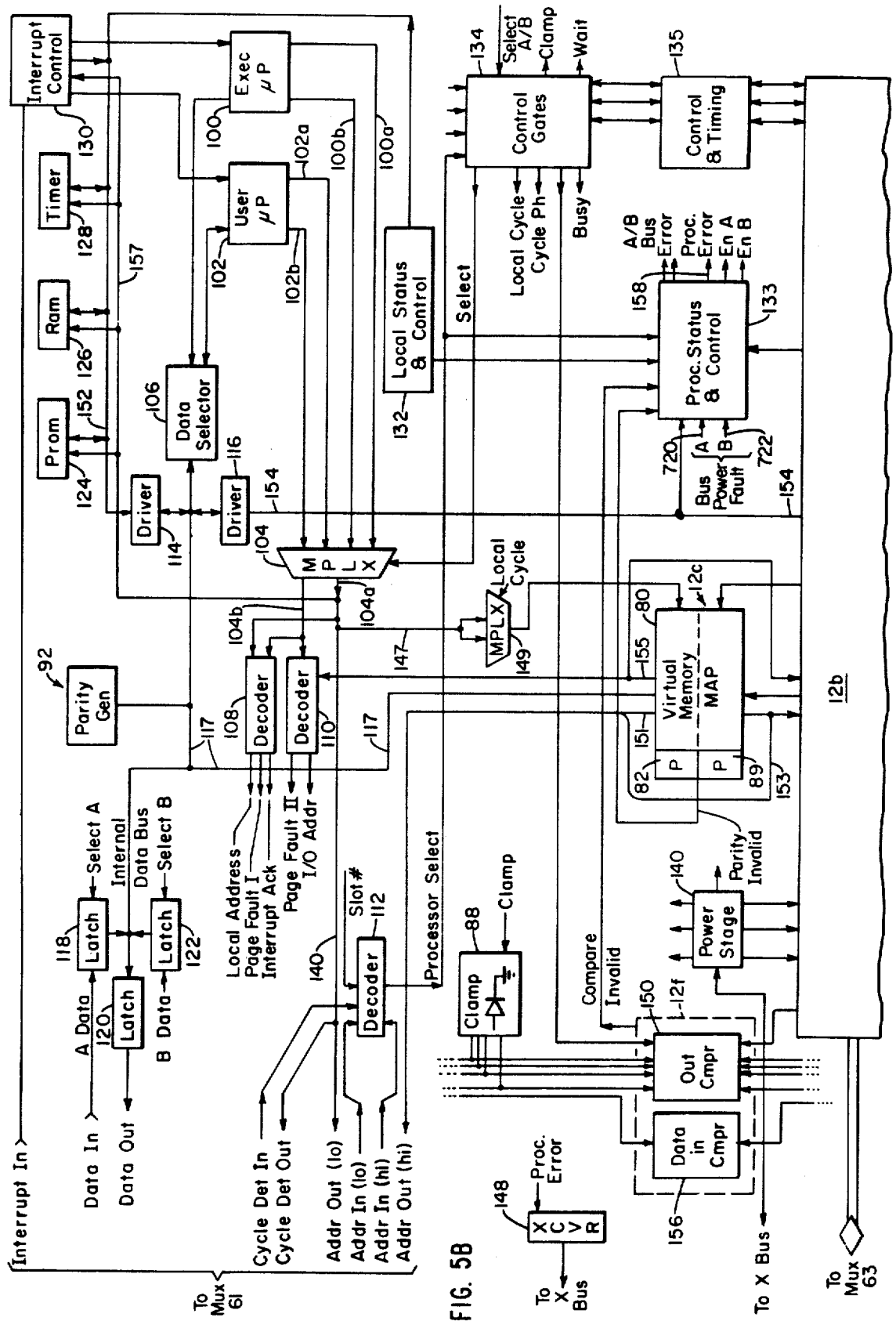

FIGS. 5A and 5B, which show the illustrated central processing unit 12 in further detail, shows that the dual processor 60 of FIG. 4 has two programmable microprocessors: an executive microprocessor 100 and a user microprocessor 102. The dual processor 60 also has a multiplexor 104, a data selector 106, decoders 108 and 110 and 112, drivers 114 and 116 of an internal data bus 117, latches 118 and 120 and 122, and control gates 134. The local control stage 64 of FIG. 4 includes a programmable read-only memory (PROM) 124, a random access memory (RAM) 126, a timer 128, an interrupt control stage 130, and a local status and control stage 132. The common control stage 86 shown in FIG. 4 includes status and control circuits 133, control and timing circuits 135, and a power stage 140 that receives bulk power from the X bus 46.

FIG. 5A further shows that the transceivers 12e of FIGS. 1 and 4 employ, to transfer signals between the A bus 42 and the processing section 12a, a receiver 136 for A bus interrupt signals, transceiver 138 for A bus data signals, a transceiver 142 for A bus function (cycle definition) signals, and transceivers 144 and 146 for A bus address signals. An identical set of an interrupt receiver 137, a data transceiver 139, a function transceiver 141, and address transceivers 143 and 145 connects between the two multiplexors 61 and 63 and the B bus 44. The processor 12 further has a transceiver 148 (FIG. 5B) connected with the X bus 46.

The processing section 12b of FIG. 1 is constructed identically to the processing section 12a and is connected with the MAP 12c, with the comparator 12f, the power stage 140, transceivers 12e, and with the stages 136 and 138 of the control section 12 in the same manner as FIGS. 5A and 5B show for the processing section 12a. The multiplexor 61 applies to the processing section 12e signals received from one bus 42 or 44, and the multiplexor 63 applies signals received on the same bus to the processing section 12b.

The central processing unit 12 thus has two essentially identical subsystems, the processing sections 12a and 12b, which operate in lock-step with one another. The comparator 12f compares operations of the two sections at the end of each clock phase. The entire unit 12 operates in lock-step with an identical partner unit 14, such that when either unit 12 or 14 detects an error, control circuits within that unit automatically take the unit off-line from the bus structure. Processing continues essentially uninterrupted by the partner unit. The failing unit generates a low priority interrupt to inform the partner unit that an error has been detected. The operative unit 12, 14 can interrogate each unit in the module to determine the source or nature of the error. In some instances, such as a random transient error, the operative central processing unit can bring the failed unit back into lock-step operation.

Each central processing unit 12, 14 has a section or portion that is not duplicated and which provides control, timing and error checking functions. The non-duplicated logic is designed so that in most cases a failure therein does not cause an error in the data being processed.

The illustrated central processing unit of FIGS. 4 and 5 employs in each microprocessor 100 and 102 of FIG. 5B a commercially available type 68000 microprocessor. The illustrated embodiment employs two such microprocessors, one to execute user-defined code and one to execute the operating system. Either microprocessor can operate in the user mode or in the executive mode. The executive processor 100 is arranged for operation such that it does not encounter page faults, but rather is always executing code currently in physical memory, i.e. within the processing unit or in the memory unit 16, 18. That is, it does not address unavailable data. It also handles all interrupt requests in the processor module. The user microprocessor 102, on the other hand, is arranged to handle user code and to essentially halt operating whenever it encounters a page fault. The action of resolving a user page fault causes an interrupt to the executive microprocessor 100. The user microprocessor 102 resumes operating as soon as the executive microprocessor 100 provides the necessary memory rearrangement to resolve the page fault. The two microprocessor 100 and 102 normally operate at maximum speed, with memory accesses pipelined through the MAP 12c and onto the bus structure 30.

Output signals from each microprocessor 100, 102 include a multi-digit parallel address on lines 100a, 102a, respectively, and a function code on lines 100b, 102b. The function code identifies, for example, whether the address on lines 100a, 102a is for a read operation or a write operation and further identifies whether that memory access operation is to involve an instruction, data, an interrupt vector or other information. The lines 100a, 100 b, 102a, 102b are applied to the multiplexor 104.

The select control line input to the multiplexor 104 from the control gates 134 selects the executive microprocessor 100 upon initial power up of the processor and otherwise selects the one microprocessor 100, 102 which is appropriate for the particular operation to be performed.

At the start of each operating cycle, in each processing section 12a and 12b, a Select signal from the control gates 134 actuates the multiplexor 104 to select one of the two microprocessors 100, 102. Each microprocessor applies two inputs to the multiplexor 104, namely a function code and a memory address; the former is illustrated as four bits long and the latter of twenty-four bit length. The twelve most significant bits of the address from the selected microprocessor are applied from the multiplexor 104 on lines 147 to a further multiplexor 149 that feeds the virtual memory MAP 80. The multiplexor 149 selects from the twelve input address bits those that represent a virtual page number and hence address one page location in the MAP 12c. The multiplexor 149 effects this solution in response to a Local Cycle signal. The least significant twelve bits of the selected address from the multiplexor 104 represent the byte address in the addressed page and are applied on lines 140 through the driver of transceiver 144 (FIG. 5A) to address conductors of the A bus 42.

The most significant twelve bits of address on the multiplexor output lines 104a are also sent to the decoder 108 for decoding the following conditions: local address, page fault I, and interrupt acknowledge. Interrupt acknowledge is a particular function coming from a microprocessor 100, 102. The local address is a selected section of the virtual memory space and is valid only when the selected microprocessor 100 or 102 is operating in the executive mode. The decoder 108 produces a Page Fault I signal when a user addresses a location outside the allocated memory space. Any Page Fault causes an interrupt to the executive microprocessor 100. Page faults in the executive microprocessor do not normally occur and if they do, the processing section produces a Bus Error signal. In response to any Page Fault signal, the control gates 134 in conjunction with the control and timing logic 135 abort a memory access that is in process by asserting the Busy signal on the next clock phase, as indicated by one output from the control gates 134.

With continued reference to the illustrated central processing unit of FIG. 5, a local cycle is initiated by the selected microprocessor by producing address signals identifying the desired location in the local address space. The decoder 108 responds to any such local address to produce a signal identifying the local address condition. In response, the control gates 134 produce a Local Cycle signal, which actuates the local status and control stage 132 to execute the local cycle. The address drivers in transceiver 144 (FIG. 5A) are disabled. The driver 114 (FIG. 5B) is enabled to connect the local data bus 152 to the interval data bus 117, and the local driver 116 is enabled. Also, the multiplexor 149 is set for the local cycle.

The PROM 124 operates in a local cycle of this nature to handle power-up diagnostics and initialization of the processor module 10 of FIG. 1. Further addresses which cause local cycles are used for I/O control of the central processing unit 12 itself. In this address space are such information items as the used bits and the written bits for the MAP, initialization of the timer 128, start-up control of the user microprocessor 102, and the handling of various page faults and other types of interrupts with the interrupt control stage 130. The local cycle can also be used to read and, conversely, to write such information as the status of the processor, the serial and revision numbers and maintenance history of the processor, and timing and data information.

The interrupt control 130 receives interrupts which are produced under program control and receives all interrupts which the hardware of the processor produces including page faults, time-out signals, and maintenance interrupts. The interrupt control 130 also receives fault signals which originate outside the processor and are communicated to it by way of the bus structure 30 and the receiver 136. The interrupt control 130 processes these interrupt conditions in conjunction with the executive microprocessor 100.

With further reference to FIG. 5B, the illustrated MAP 12c employs a high speed random access memory of 4096 words, each of sixteen bit length. In response to the combined twenty-four bit address from the multiplexors 104 in both processing sections 12a and 12b, the virtual memory MAP 80 reads out a sixteen bit word consisting of a twelve bit physical page number, on lines 151 and 153, and a four bit code, on lines 155, showing which accesses are legal to that page. This four bit code also identifies which pages address I/0 space within the central processing unit 12. In response to the code on lines 155 and signals from the multiplexor 104, the decoder 110 identifies two conditions, namely, Page Fault II and I/0 address.

The decoder 108 thus produces a Page Fault I signal in response to address signals from the selected microprocessor 100, 102. The decoder 110 on the other hand, produces a Page Fault II signal in response in part to function signals which the MAP 12c develops in response to address signals from the selected microprocessor.

More particularly, in the illustrated CPU 12 of FIGS. 5A and 5B, one of two portions of the MAP 12c responds to the twelve-bit address from the multiplexor 104 in the processing section 12a to produce the four-bit function code on lines 155 which feed to the decoder 110 in the processing section 12c and to the corresponding decoder in the processing section 12b. This section of the map also produces, on lines 151, four bits of a twelve-bit page number. The remaining eight bits of the twelve-bit page number are produced, on lines 153, by the other section of the MAP in response to the twelve address bits it receives from the processor section 12b. The combined twelve bits on the MAP output lines 151 and 153 are applied, as FIG. 5A shows, to a driver in the address transceiver 146 for the A bus address lines and are also applied to a corresponding driver of the B bus in the other processing section 12b.

Thus, the processing section 12a drives the physical page address from the MAP 80, and the byte address from the selector 104, to the address lines of the A bus 42 through drivers in transceivers 144 and 146. The signals which the processing section applies to these drivers in addition are applied to an output comparator 150 in the comparator 12f. The output comparator 150 compares these signals with the identical signals generated in the processing section 12b. Any failure in this comparison causes the processor 12 to go off-line.

The MAP 12c also can be accessed with sixteen-bit words in the local address space so that it can be addressed by the operating system. This is done by way of the internal data bus 117.

The internal data bus 117, illustratively with sixteen bit parallel capacity, receives data from either microprocessor 100, 102, by way of the data selector 106. The internal bus applies the selected data through a latch 120 to the driver of transceiver 138 for driving onto the data lines of the A bus 42. The output of the latch 120 is also applied to the output comparator 150 for comparison with the corresponding output data from the processor section 12b. The latch 120 provides temporary storage of output data so that in the event any error is reported on the buses, the operating sequence in which the error was reported can be duplicated and the data retransmitted on the A bus 42, from the latch 120, even though the microprocessors 100 and 102 may have sequenced to a subsequent operating step.

With continued reference to FIGS. 5A and 5B, the transceiver 138 applies data received from the A bus 42 to the latch 118 by way of the multiplexor 61. The processor section 12a receives data from the B bus 44 and applies it to the section 12a at the latch 122. Each latch 118 and 122 transfers received data to the internal data bus 117 of the processor section 12a in response to a Select A signal and a Select B signal, respectively. The control logic 134 produces one such Select signal at a time. The bidirectional data selector 106 applies the received data from the bus 117 to either microprocessor 100 and 102. The internal data bus 117 can also drive signals through bidirectional drivers 114 and 116 to a local data bus 152 and to a further data bus 154. The data bus 154 is common to both processor sections 12a and 12b as FIG. 5B shows, and connects to the status and control circuit 136.

With continued reference to FIGS. 1 and 5A and 5B, each central processing unit 12 and 14 performs error checking at the same time it drives the A bus 42 and the B bus 44. This concurrent operation is in contrast to units in the processor module 10 which implement an error check prior to driving the bus structure. The processing unit operates in this manner because timing therein is sufficiently important that any delay in operation is undersirable for system throughput. An error noted by the checking logic during the time the processing unit is driving the bus structure causes the unit to drive both an A Bus Error signal and a B Bus Error signal, by way of the driver 48, onto the X bus 46 during the next phase of the system clock. During the same time phase, the failing central processing unit drives a level One maintenance interrupt, onto the X bus 46, which the partner central processing unit receives. At the end of that time phase, the failing unit goes off-line, becoming incapable of driving further signals onto the bus structure, except in response to interrogation from the partner central processing unit. This automatic off-line operation ensures that any read or write cycle, whether to the memory unit 16, 18 of FIG. 1 or to a peripheral device through a control unit and during which an error was detected in either the address or the data on the A bus or B bus, is aborted. Further, any data transfer during that same operating cycle is repeated using only the partner central processing unit.

Essentially the only portions in the central processing unit 12 which are not duplicated, aside from the MAP 80 which includes parity checking, are the comparator 12f, the power stage 140, the status and control stage 133, and the control and timing stage 135. A fault in these circuits is not likely to cause a system failure or invalid data within the system. Further, the system is provided with software that tests these CPU elements.

As also shown in FIGS. 5A and 5B, other units of the FIG. 1 module can access the partnered CPUs 12, 14. In the processing section 12a, for example, the decoder 112, which is connected by way of the multiplexor 61 and 63 with the A bus address transceiver 144 and 146 or the B bus address transceiver 143 and 145, respectively, responds to incoming address signals which identify the processor 12 to produce a Processor Select signal which is applied to the control gates 134. The processor 12 can be signaled in this way to perform a read cycle and apply status information to the bus structure 30. Conversely, when selected in this manner, the processor 12 can be controlled to perform a write cycle to effect a control change.

CPU Fault Detection

With further reference to FIGS. 5A and 5B, the comparator 12f has an input comparator 156 that compares the input data which the processing section 12a receives from the A bus 42 with the input data which the processing section 12b receives on the B bus 44. The output comparator 150 compares the function, address and data signals (including parity) which the processing section 12a applies to transceivers 142, 144 and 146, and 138, respectively, with corresponding signals which the processing section 12b produces. The illustrated processor also compares selected timing and control signals from the control gates 134 of section 12a with corresponding signals from section 12b. This comparison of internal control signals checks internal operations of the CPU and facilitates prompt detection of faults and is useful in diagnostic and maintenance of the processor unit.

At any time that one or more corresponding input signals to the comparator 12f differ, the comparator produces a Compare Error signal which is applied to the control stage 133. The error can be the result of a data-in error, a data-out error, a function error, or an address error. It can also be either a cycle error or a control error due to differing timing or control signals.

The detection of an error by the parity checking circuits 82 and 84 connected with the virtual memory MAP 80 produces a parity error signal which also is applied to the control stage 133.

The control stage 133 responds to the Compare Invalid signal of comparator 12f, and to a Parity Invalid signal from the parity check circuits 82 and 84, to produce, on the next clock phase, a Processor Error signal on line 158. One exception to this operation occurs if the Compare Invalid signal is due to an invalid comparison in the input comparator 156 of input data signals, as can occur during a read operation. In that event, control stage 133 produces the Processor Error signal only if no Bus Error signals are produced with the next timing phase. A Bus Error signal indicates a fault condition in the bus structure 30 and hence identifies that the invalid comparison of input data was the result of a fault in the A bus or B bus portion of the bus structure 30 and not in either processing section 12a or 12b. The Bus Error signal is one of many signals which the processor status and control stage 133 produces. The stage 133 produces the Bus Error signal in response to an invalid comparison of the Processor Select signal it receives from the decoder 112 of the processing section 12a and with the corresponding signal from the processing section 12b.

Figure 6:
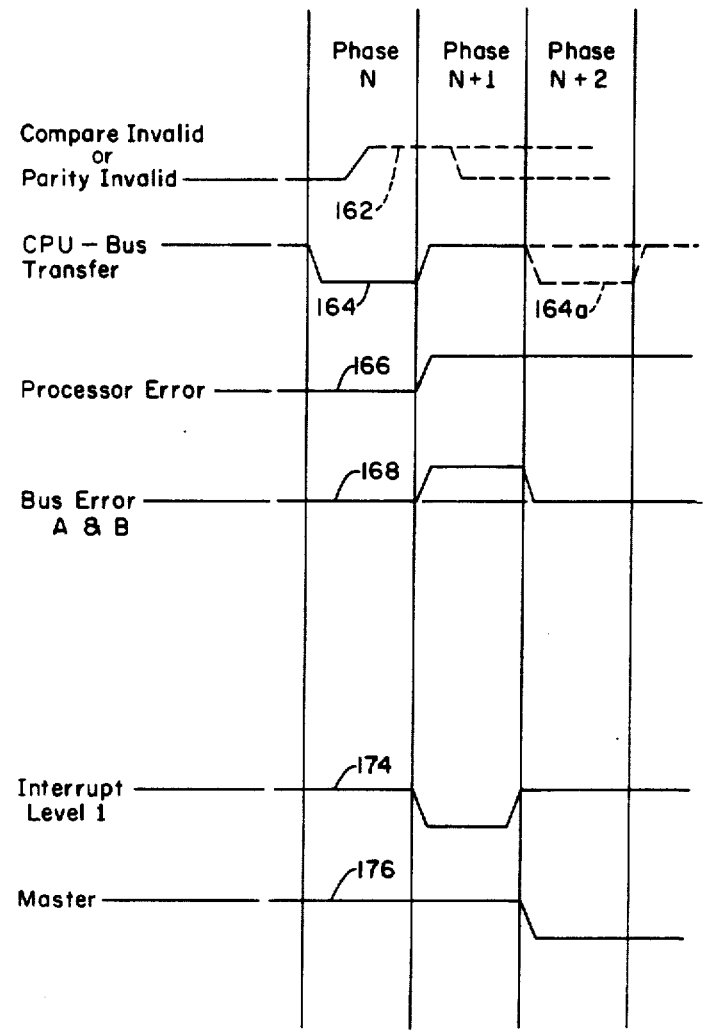
FIG. 6 shows timing diagrams illustrating operation of the central processing unit of FIGS. 5A and 5B.

FIG. 6 shows timing waveforms which illustrate these fault detection operations of each illustrated processing unit 12, 14. The drawing shows three successive timing phases, designated phase N, phase (N+1), and phase (N+2). The waveform 162 shows the occurrence during phase N of a fault which produces a Compare Invalid signal or a Parity Invalid signal. The fault signal of waveform 162 actuates the control stage 133 to produce a Processor Error signal, as shown with waveform 166, during the next timing phase, i.e. phase (N+1). One function of Processor Error signal 166 is to disable logic circuits and thereby essentially halt all operation in the processing unit 12.

The processor status and control stage 133 next asserts both an A Bus Error signal and a B Bus Error signal, each with waveform 168, during phase (N+1). The stage 133 also produces these signals in the event of a detected difference between the Processor Select signals in the two processing sections 12a and 23b. The illustrated processing section 12a also produces a level one interrupt signal, waveform 174, during phase (N+1).

At the start of the phase (N+2), the stage 133, still in response to the fault signal of waveform 162, terminates the assertive bus master status, as shown with waveform 176. This action is accompanied by termination of the Bus Error signals of waveform 168. The A Bus error signal and the B Bus error signal are applied to the X bus 46 to signal all units in the FIG. 1 module 10 to ignore information placed on the bus during the immediately prior phase, e.g., to ignore the CPU-bus transfer shown with waveform 164. The level one Interrupt signal 174 is also applied to the X bus 46 and signals the partner processing unit 14 that some unit in the module has detected a fault-producing error. When the processing section 12a switches out of the Master state with waveform 176, it disables all the bus drivers in the transceivers 136, 138, 142, 144, 146 and 148, as well as in the transceivers 12e connected with the processing section 12b.

With further reference to FIGS. 5 and 6, in the event the fault signal 162 occurs during the data transfer of a memory read operation as shown with data waveform 164, the control stage 133 produces both Bus Error signals. The memory unit 16, 18 in FIG. 1 responds to the concurrent A and B Bus Error signals to repeat the data transfer of waveform 164. FIG. 6 shows the repeated data transfer with a broken-line waveform 164a.

Similarly, if the fault signal 162 occurs during a write operation, the partner processor 14 repeats the CPU-bus transfer of waveform 164 during phase (N+2) as indicated also with the waveform 164a.

Thus, a processing unit 12, 14 can only drive the bus structure when in the Master state, as required to produce the Bus Enable signal that is applied to the drivers. The Processor Error signal promptly, i.e. at the end of the next timing phase, turns off the master status. In the event the processing unit 12 produces a Processor Error signal as illustrated in FIG. 6, the partner unit 14 continues operating essentially without interruption. When the Processor Error signal 166 occurs during a write operation, the partner processing unit 14 repeats the data transfer, as shown with waveform 164a. When the Processor Error arises during a read operation, the partner unit reads in the repeated data which the memory applies to the bus structure in a subsequent timing phase. Further, the partner processing unit 14 responds to the level One interrupt of waveform 174, which is a low level interrupt, to initiate a diagnostic routine. In the event the cause of the Processor Error appears to be a transient phenomenon, i.e., the diagnostic routine does not identify or locate any faulty or erroneous condition, the processing unit 12 can be restored to operation without maintenance. In a preferred embodiment the occurrence of the transient failure is recorded, and if repeated the processing unit is not returned to service without further diagnosis.

With continued reference to FIG. 5B, when the processing unit 12 is initialized, it negates an internal Error Check signal, and thereby prevents a Parity Invalid signal or a Compare Invalid signal from producing a Processor Hold Signal. Instead, the CPU executes a test routine, typically stored in the PROM 124, which exercises all conditions that can produce a Processor Error signal. As each potentially faulty condition is created, the processing section tests to see whether the corresponding fault reporting signal is indeed produced. The absence of the Error Check signal thus inhibits the processing unit from attaining Master state, with the result that faults produced during this logic exercising routine do not stop the processing unit and are not reported to the bus structure 30. The test routine in the PROM 124 asserts the Error Check signal and enables the processor to assume the Master State only upon successful completion of this checking routine.

Each processing unit 12, 14 of FIGS. 5A and 5B includes logic circuits, typically in the processor status and control stage 136, to bring the two partner units into lock-step synchronization. The illustrated CPUs 12 and 14 attain lock-step synchronization with the transition to Master status. Each illustrated unit 12 and 14 must be in the Master state in order for it to drive signals onto the bus structure. The initializing sequence stored in each PROM 124 typically includes instructions for bringing the partnered units into synchronization and to ensure that neither processing unit is in the Master state initially, i.e. upon being turned on. The processing units 12, 14 are not in synchronization initially in the initializing sequence and one unit attains the Master state during a multi-phase cycle prior to the other. The one unit obtaining Master status controls the further initializing operation of the other unit to bring it into the Master state at a selected time during the next multi-phase initializing cycle.

CPU Operating Sequence

Figure 7:
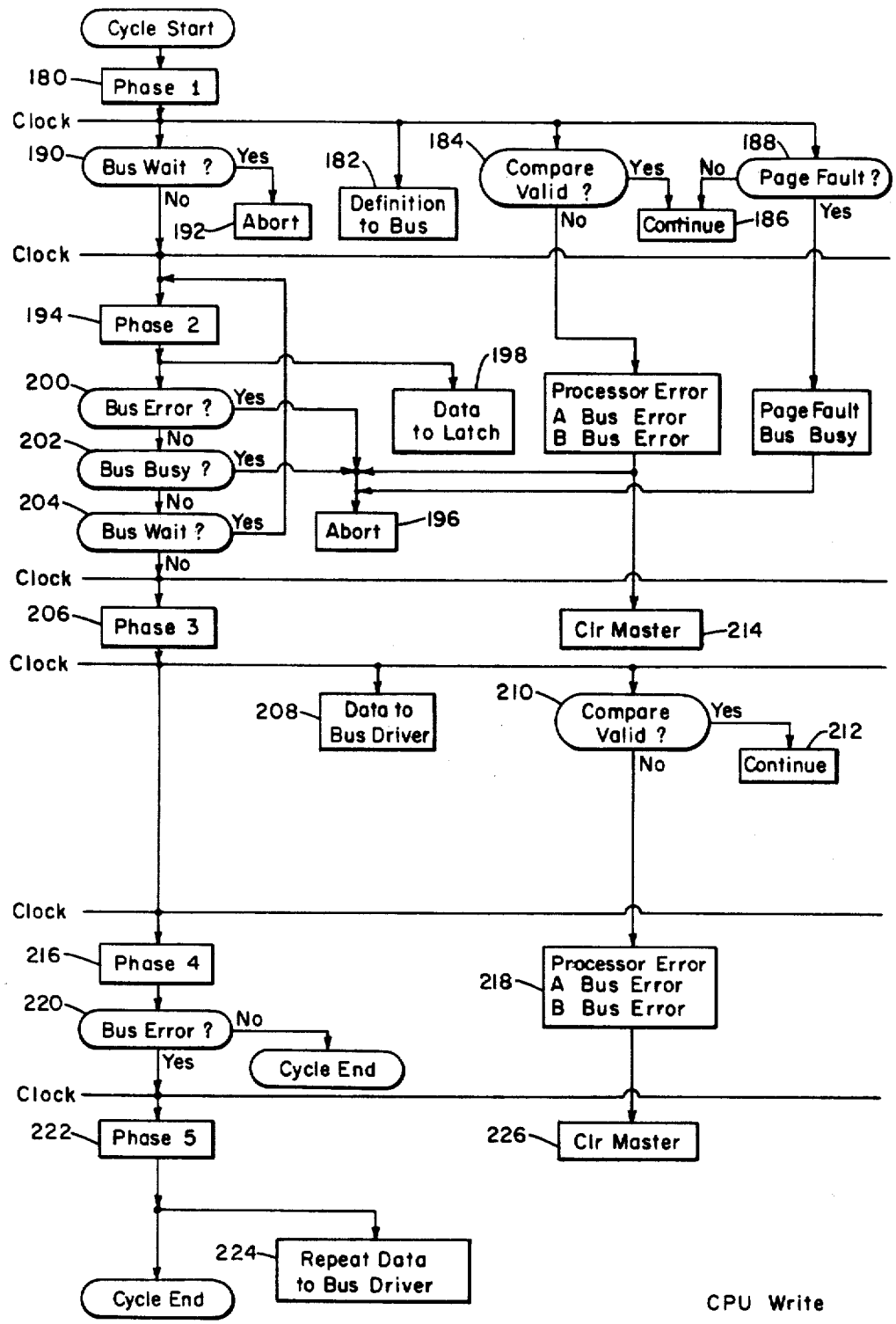
FIGS. 7 and 8 are diagrams illustrating operating sequences of the central processing unit of FIGS. 5A and 5B.
Figure 8:
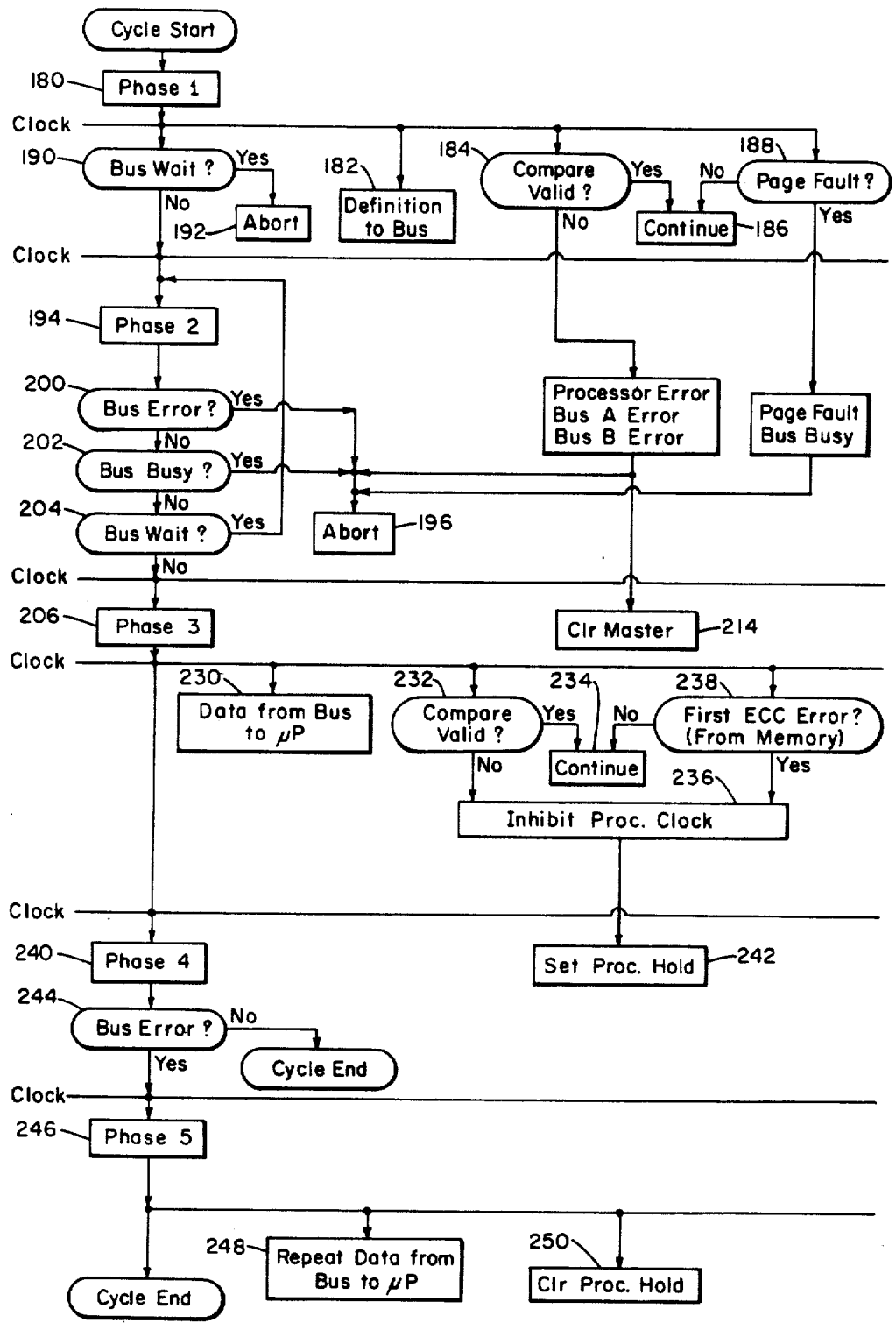

FIGS. 7 and 8 diagram operating sequences of the central processing unit 12 in FIG. 5 for a data transfer cycle in the processor module 10 in accordance with the format of backplane bus signals of FIG. 2. Both diagrams illustrate cycles when no other unit of the computer system is requesting access to the bus structure. FIG. 7 shows a write cycle and FIG. 8 a read cycle. A write cycle as illustrated in FIG. 7 commences when the control and timing stage 135 of FIG. 5 is set in response to a main clock signal (FIG. 2, waveform 56a) to the Phase One condition, as designated with action box 180. In this definition phase of the cycle, the selected microprocessor 100, 102 of FIG. 5 produces function and address signals for the write operation. The function signals are applied from the driver 140 to the bus structure, as designated with action box 182. Simultaneously, the comparator 150 compares the function signals which each processing section 12a and 12b applies to the bus structure, as designated with decision box 184. A valid comparison results in the cycle continuing, action box 186. Also during Phase One, as indicated with decision box 188, a page fault can occur as determined for example by the decoder 110 of FIG. 5B or in connection with another operating cycle which commenced prior to the cycle illustrated in FIG. 7. The absence of a page fault in Phase One allows the illustrated cycle to continue, action box 186.

As shown with decision box 190, the assertion of a Bus Wait signal by a previously commenced operating cycle aborts the illustrated cycle, per action box 192. In the absence of a Bus Wait, the write cycle advances upon the next clock signal to the response phase, Phase Two, as designated with action box 194. An invalid comparison, as determined with decision box 184 in the prior phase results, during the response phase, in the production of signals by the processor stages 134 and 136 and designated Processor Error, A Bus error and B Bus error, and further causes the cycle to abort as designated with action box 196. Similarly, the decoding of a Page Fault during the preceding phase One, as determined with decision box 188, causes the system during the Phase Two to produce a Page Fault signal and a Bus Busy signal and to abort the write cycle, action box 196.

Also during the illustrated phase two, the selected microprocessor 100, 102 applies the write data through the data selector 106 and to the latch 120, as designated with action box 198.

The assertion by any unit in the system of a Bus Error signal during Phase Two, as designated with decision box 200, aborts the cycle, as shown with action box 196. The cycle also aborts at this phase in the event a unit raises the Bus Busy signal, decision box 202. Further, in the event a unit raises a Bus Wait signal, as designated with decision box 204, the processor control and timing stage 135 remains in Phase Two for another timing phase.

When the cycle is not aborted or delayed in Phase Two, the operation proceeds to Phase Three, the data transfer phase, as designated with action box 206. In this phase, the data in the latch 120 is applied through the driver of transceiver 138 to the bus structure, as designated with action box 208. The processing unit 12 compares the outgoing data as designated with decision box 210 and the cycle continues, action box 212, in the absence of a detected fault. Also during this phase an invalid comparison determined during the preceding Phase One, decision box 184, causes the Master status to be cleared, as designated with action box 214.

FIG. 7 shows that the write operation unconditionally proceeds from Phase Three to Phase Four, as designated with action box 216. During this phase the result of an invalid comparison in the preceding phase, decision box 210, causes the processing unit to produce the Processor Error signal, the A Bus Error signal and the B Bus Error signal, action box 218. These signals cause the partner processing unit to repeat the data transfer, as designated with action box 224, in the next Phase Five. The assertion of a Bus Error signal during Phase Four, as can occur by the partner unit or any other unit connected with the bus structure, and as designated with decision box 220, causes the cycle to advance to a further Phase Five, designated with action box 222. In the absence of the bus error, the cycle ends without entering Phase Five. Upon entering Phase Five, however, the processing unit which caused the error clears the Master status, action box 226. Also, the processor 12, 14 which is free of a fault again applies to the bus structure the data stored in its latch 120, as designated with action box 224. At this juncture the illustrated write cycle is complete and ends.

A read cycle for the processing unit 12, 14 shown in FIG. 8, commences in the same manner as the write cycle of FIG. 7 and has the same operations during Phase One, the definition phase, as illustrated. The processing unit proceeds to Phase Two, the response phase, and executes the same operations as in the write cycle of FIG. 7 with the exception that the transfer of data to a latch, designated in FIG. 7 with action box 198, does not occur in a read cycle.

With further reference to FIG. 8, during Phase Three, the data phase, the processing unit 12, 14 receives read data from the bus structure by way of driver 138 and a latch 118 or 122 (FIG. 5) and transfers it to a microprocessor 100, 102 in each processing section, as designated with action box 230. The comparator 156 tests whether the incoming data is identical from each of the two busses 42 and 44, decision box 232. A valid comparison enables the cycle to continue, action box 234; an invalid comparison inhibits the processor clock, as designated with action box 236. Also during the data transfer phase, the occurrence of a Fast ECC Error signal, as produced from a memory unit as discussed below and as designated in FIG. 8 with decision box 238, likewise inhibits the processor clock, action box 236.

The processing unit increments to timing Phase Four, action box 240, and, in the event the processor clock is inhibited, sets a register to the hold status, action box 242. Otherwise, the cycle ends, except in the event a Bus Error signal is asserted during Phase Four, as determined with decision box 244, in which case the read cycle proceeds to an optional Phase Five, designated with action box 246. During this phase the processing unit repeats the transfer of data from the bus structure to a microprocessor, as designated with action box 248. Also, the processor hold condition is cleared, as designated with action box 250.

Memory Unit

Figure 9:
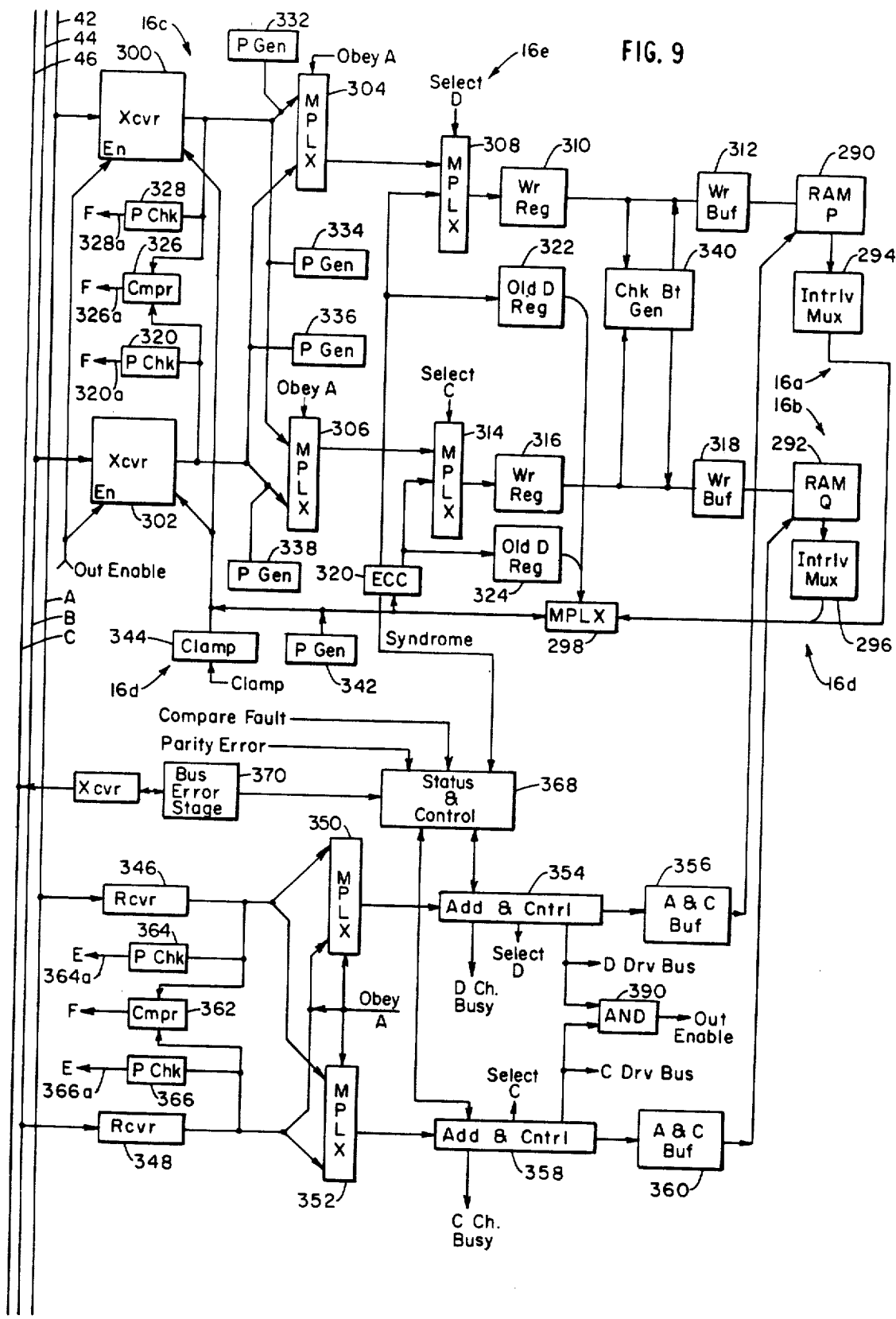
FIG. 9 is a block schematic diagram of a memory unit according to the invention.

FIG. 9 shows the main memory unit 16 of the FIG. 1 processor module 10. The partner memory unit 18 is identical and operates in lock-step synchronism with unit 16. The memory sections 16a and 16b (FIG. 1) of the illustrated memory unit employ identical random access memories (RAMs) 290 and 292, respectively. Each is illustratively a four-way interleaved dynamic RAM array capable of writing repeatedly to the same leaf once every five timing phases (FIG. 2) and of reading repeatedly from the same leaf once every three timing phases. The RAM 290 stores the upper byte of a data word and the RAM 292 stores the lower byte of a data word. Each RAM applies a byte of read data through an interleave multiplexor 294, 296, respectively, and the combined output bytes of a read word are applied to an output multiplexor 298. The output from this multiplexor is applied to the A bus 42 by way of an A bus transceiver 300 and is applied to the B bus 44 through a B bus transceiver 302. The multiplexors 294, 296 and 298 are part of the memory unit format section 16e, FIG. 1, which includes address and control circuits 16f shown in the lower part of FIG. 9.

Each transceiver 300, 302 can apply different bytes of write data received from the associated bus to each of two write multiplexors 304, 306 to write the upper byte of a data word in the RAM 290 by way of a data channel which has a further multiplexor 308, a write register 310 and a write buffer 312, and to write the lower byte of the same data word in the RAM 292 by way of a like data channel that has a further multiplexor 314, a write register 316 and a write buffer 318. The two write multiplexors 304, 306, in the illustrated embodiment select data from a single transceiver 300, 302, and hence from either the A bus or the B bus.

As further shown in FIG. 9, read data from the RAMs 290, 292 is applied to an error checking and correcting (ECC) stage 320. The ECC stage applies the upper byte of a read word both to the channel multiplexor 308 and to an old data register 322. It applies the lower byte of a read word to the channel multiplexor 314 and to a second old data register 324. The two old data registers are connected to apply the data byte stored in each to the multiplexor 298 for application as a complete two-byte word to both the A bus and the B bus by way of the transceivers 300, 302.

A parity checking circuit 328 is connected to check the parity of the write data output from the transceiver 300, and a like parity check circuit 330 is connected with the write data output from the transceiver 302. A parity generator 332 is connected to append a parity bit to the upper data byte which the multiplexor 304 received from the transceiver 300 and a like parity generator 334 is connected to append a parity bit to the lower data byte which the multiplexor 306 receives from that transceiver. Similarly, parity generators 336 and 338 are connected with the write date lines feeding from the transceiver 302 to the multiplexors 304 and 306, respectively.

In addition, a check bit generator 340 is connected to append further check bits to the write data bytes applied to the write buffers 312 and 318. There is also a parity generator 342 connected to introduce a parity bit to each read data word output from the multiplexor 298 to the transceivers 300, 302.

The format section 16e of the illustrated memory unit further includes a comparator 326 connected to compare the data words output from the transceivers 300, 302 to the byte multiplexors 304, 306. An invalid comparison raises a fault status, which can be processed as desired. A clamp circuit 344, preferably identical in design and operation to the clamp circuits 88 and 90 in each central processing unit shown in FIG. 4, is connected to selectively ground the read data lines which feed to the transceivers 300, 302.

It will thus be seen that the illustrated memory unit is in effect arranged with two identical read/write portions, each of which processes a byte of a given data word. Each such portion includes one transceiver 300, 302, one bus select multiplexor 304, 306, one channel multiplexor 308, 314; and one write register, write buffer, and RAM.

With further reference to FIG. 9, the address and control circuits 16f of the memory unit are similarly arranged in two portions, each of which operates with one RAM 290, 292. Receivers 346 and 348 connect with the address and function conductors of the A bus 42 and of the B bus 44, respectively, and are connected with channel multiplexors 350, 352 to select the signals from one receiver and correspondingly from one bus. An address and control stage 354 receives the signals from the multiplexor 350 and applies them to an address and control buffer 356 that operates the RAM 290. Similarly, an address and control stage 358 receives signals from the multiplexor 352 for producing signals which are applied by way of an address and control buffer 360 to operate the other RAM 292. The stages 354 and 358 produce, respectively, a Select D signal and a Select C signal which control the channel multiplexors 308 and 314. Each multiplexor is set to select input signals either from the bus structure or from the ECC stage 320, depending on the source of each byte being written in a memory section.

A comparator 362 is connected to compare the address and control signals output from the two receivers 346 and 348, i.e., on the two buses 42 and 44. In response to an invalid comparison, this comparator, like the data comparator 326, produces a fault signal.

Parity check circuits 364 and 366 are connected with the output lines from the receivers 346 and 348, respectively. The data parity check circuit 328 and the address parity check circuit 362 test the parity of signals on the A bus 42 for all data transfer operations of the processor module 10. The parity check circuits 320 and 366 provide the same function with regard to signals on the B bus 44. Note that address parity is separate from data parity inasmuch as address signals, including function or cycle definition, and data signals occur at different phases of a cycle. In each phase each set of bus conductors has its own parity, which is tested.

The illustrated memory unit 16 also has a status and control stage 368 which is not duplicated. The stage receives the parity error signals, the comparator fault signals, and ECC syndrome signals from the ECC stage 320. The stage 368 connects to numerous other elements in the memory unit, with connections which are in large part omitted for clarity of illustration. A bus error stage 370 is connected with the stage 368 and, by way a transceiver, with conductors of the X bus 46 as described below with reference to FIG. 10.

With this arrangement shown in FIG. 9, the memory unit 16 can operate without a partner unit 18 (FIG. 1) and still detect and correct for a single failure in an integrated circuit chip of the RAMs 290, 292. Moreover, the unit 16 with a partner unit 18 is able to detect a high percentage of single component failures and to continue functioning by disabling the failing memory unit 16, 18. Further, it is the memory unit 16, 18 of the FIG. 1 system that checks for errors on the bus structure 30 and signals other units of the system in the event that such an error is detected. This arrangement is deemed preferable, but other units can also be arranged to provide this operation, either in lieu of or in addition to the bus error-checking in the memory unit. The parity check circuits 328, 330, 364, and 366 and the comparators 326 and 362 test for bus faults. As will also become apparent from the following further description, the memory unit 16 can function as an I/0 device which other units of the processor module 10 can address, for example to diagnose a detected fault in the operation of a memory unit 16, 18.

Figure 10:
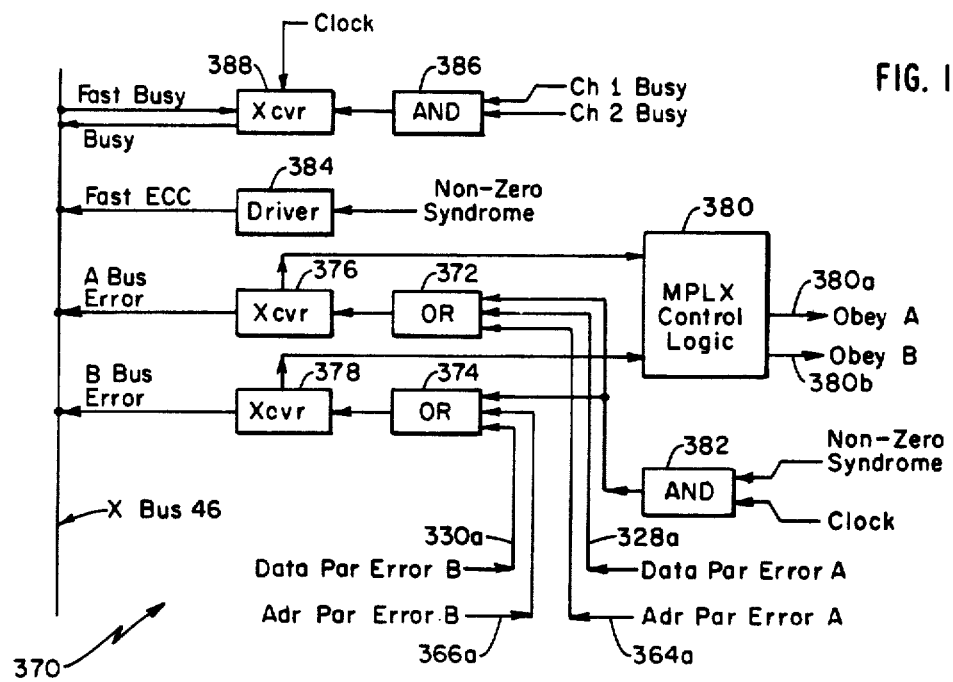
FIG. 10 is a block schematic diagram of memory unit control logic according to the invention.

FIG. 10 shows the bus error stage 370 of FIG. 9 which responds to parity error signals and the ECC syndrome signal of the illustrated memory unit 26. An OR gate 372 receives the Data Parity Error signal for the A bus, which the parity check circuit 328 produces on its output line 328a, and receives the Address Parity Error signal for the A bus output from the parity check circuit 364 on line 364a. Similarly, the Data Parity Error signal for the B bus, produced on line 330a, and the Address Parity Error signal for the B bus, produced on line 366a, are applied to a further OR gate 374. Either error signal for the A bus and input to the OR gate 372 actuates a transceiver 376 to produce an A Bus Error signal. This signal is applied to the X bus 46 for communication to all units in the module 10. Similarly, an error signal for the B bus and input to the OR gate 374 actuates a further transceiver 378 to produce a B Bus Error signal that is applied to the X bus 46. FIG. 2 illustrates operation of the illustrated processor module 10 when either Bus Error signal is asserted.

Each transceiver 376 and 378 is also connected with a multiplex control logic stage 380 that produces the OBEY A and OBEY B select signals for the multiplexors 304 and 306. The transceiver 376 applies the A Bus Error signal received from the bus structure, even when driven by the memory unit 16, to the logic stage 380 and the transceiver 378 likewise applies the B Bus Error signal. The logic stage 380 normally produces both OBEY signals. When it produces a single OBEY signal, and receives a Bus Error signal for the bus not being obeyed, it maintains the same single OBEY signal. However, when it produces a single OBEY signal and receives a Bus Error signal for the bus that is being obeyed, it produces only the other OBEY signal.

The operation of the FIG. 9 parity generators 332, 334, 336 and 338, check bit generator 340, and ECC stage 320 is now described in reference to an example with a sixteen-bit memory word consisting of two eight-bit bytes. Each data word which the memory unit 16 receives from the bus structure has a sixteen-bit length plus one parity bit, introduced for example by the parity generator 92 in a CPU section described above in FIG. 5. The parity check circuits 328 and 320 test this parity of data applied to the memory unit 16, and only eight data bits of each input word are applied to each bus multiplexor 304 and 306. The parity generators 332, 334, 336 and 338 produce byte parity for the data word received from the A bus and for the word received from the B bus. Each multiplexor 304 and 306 accordingly receives two nine-bit inputs, and applies a selected one to the output thereof, for a total byte length through each bus multiplexor, channel multiplexor and write register of nine bits.

The check bit generator 340 adds to each nine-bit byte two further parity bits to bring each byte length to eleven bits, all of which are written in each RAM 290, 292. Thus, the illustrated memory 16 stores a twenty-two bit memory word for each sixteen-bit data word. The code with which these error checking and correcting bits are appended to each sixteen bits of data are set forth in the following Table I, in which the data word bits are numbered (15) through (00), and the memory check bits introduced by the parity generators and by the check bit generator are numbered (5C) to (0C). The effectiveness of this ECC code stems in significant part from the fact that the present memory unit employs two byte-processing portions, two byte-storing RAMs, and controls each RAM with one of two identical address and control circuit portions. One RAM 290, 292 stores the data bits designated 15 to 08 and the check bits 4C, 3C and 2C of the following code. The other RAM stores the data bits of 07 to 00 and the check bits 5C, 1C and 0C. It is preferred that each data byte of a memory word include the parity bit generated from the other byte.

TABLE I

| 15 | 14 | 13 | 12 | 11 | 10 | 09 | 08 | 07 | 06 | 05 | 04 | 03 | 02 | 01 | 00 |    |
|----|----|----|----|----|----|----|----|----|----|----|----|----|----|----|----|----|
| X  | X  | X  | X  | X  | X  | X  | X  |    |    |    |    |    |    |    |    | 5C |
|    |    |    |    |    |    |    |    | X  | X  | X  | X  | X  | X  | X  | X  | 4C |
|    | X  | X  |    | X  |    |    | X  |    | X  | X  |    | X  |    |    | X  | 3C |
| X  | X  | X  | X  |    |    |    |    | X  | X  | X  | X  |    |    |    |    | 2C |
| X  | X  |    |    | X  | X  |    |    | X  | X  |    |    | X  | X  |    |    | 1C |
| X  |    | X  |    | X  |    | X  |    | X  |    | X  |    | X  |    | X  |    | 0C |

According to the showing in Table I, check bit 5C is generated to provide even parity for data bits 08 through 15, inclusive. Check bit 4C is similar, but with regard to data bits 00 through 07, inclusive. Check bit 3C on the other hand is generated to provide odd parity for data bits 00, 03, 05, 06, 08, 11, 13 and 14. Each remaining check bit also is generated to provide odd parity for the data bits designated for it.

When the memory unit 16 is used without a partner unit 18, this six-bit error correcting code of Table 1 makes possible the correction of single RAM failures. Further, when the memory unit 16 operates with a partner unit 18, the partnered units are capable of detecting errors in each unit and of isolating either unit from driving further signals onto the bus while the other unit continues normal operation. The six-bit error code of Table I enables the source of a single bit error to be located. The status and control stage 368 includes failure registers for storing the address of an error for subsequent accessing, and for storing the syndrome.

The reliability which the code of Table 1 provides for a memory unit having features as described can be explained as follows. The twenty-two-bit memory word, which the memory unit 16 stores in the two RAMs 290 and 292 has ($2^{22}$) possible states. Of these, only ($2^{16}$) are valid, i.e., will produce a zero syndrome in the ECC stage 320. The ratio of valid memory word states to invalid ones thus is ($2^{16}$) divided by ($2^{22}$) or (1/64).

A sample of random memory words hence will produce a ratio of (63) memory words with non-zero syndromes from the ECC stage 320 for every (64) memory words. Consequently, in the event of a failure in either portion of the address and control circuits 16f, i.e., in one address and control stage 354, 358 or in one buffer 356, 360, which causes half of the memory word to be addressed or enabled incorrectly, the resulting memory word—half of which has been addressed and enabled correctly and half of which has been addressed and enabled incorrectly—can be considered to have a random state. Sixty-three out of sixty-four times, the present memory unit will detect such a failure during a read operation by way of a non-zero syndrome from the ECC unit 320. The resulting non-zero syndrome will cause the unit 16, 18 in which it occurs to be switched to an off-line status, but leave the partner unit operating normally. A memory unit in off-line status, as implemented in the control stage 368, receives and processes diagnostic interrogation signals but does not drive signals onto the bus structure except in response to such interrogation.

Aside from a failure in the address and control section 16f of the memory unit, failure of components in the format section 16e are detected by parity. The parity generators 332, 334, 336 and 338 generate byte parity directly at the output of the transceivers 300, 302. The memory unit 16 propagates this byte parity through the section 16f and uses it to generate the two check bits which the check bit generator 340 introduces to the memory word. The ECC stage 320 thereupon detects a failure in the write data path of the memory unit 16 during a read operation by generating a non-zero syndrome. The ECC stage also detects error-producing faults in any element of the data read path, i.e., the data path from a RAM to the multiplexor 298, up to the inputs to the bus-driving transceivers 300, 302.

The illustrated memory unit detects faults in the non-duplicated portions, e.g., in the ECC stage 320, the status and control stage 368 or the parity generators, by means of maintenance software. However, an error in this portion of the memory unit is not by itself likely to produce erroneous data on either the A bus or B bus.

With further reference to FIGS. 9 and 10, the syndrome signal from the ECC stage 320 is applied to the status and control stage 368. A non-zero syndrome signal actuates a driver 384 (FIG. 10) to produce a Fast ECC Error signal and apply it to the X bus 46. A non-zero syndrome signal also produces both the A Bus Error signal and the B Bus Error signal, from the transceivers 376 and 378, by enabling an AND gate 382 to respond to a selected clock signal.

The memory unit 16, as noted above, carries out the foregoing fault detection operations concurrently with memory read and write operations. In the event a fault is detected during a time phase when the memory unit is driving read data onto the bus, the non-zero syndrome signal from the ECC stage 320 causes the driver 384 of FIG. 10 to produce the Fast ECC signal during the same time phase. This signal informs the CPU 12, 14 that a memory ECC error is occurring in the current time phase. The transceivers 376 and 378 drive the A Bus Error and the B Bus Error signals, or either of them as appropriate, during the next time phase. In the second time phase after the error is detected, the memory unit can drive correct data onto the bus structure. The correct data comes from the old data registers 322 and 324, which store corrected data produced in the ECC stage 320. That is, each old data register 322 and 324 can store corrected read data which it receives from the ECC stage 320. Alternatively, in a module having two memory units, the correct data comes from the old-data registers 322 and 324 of the nonfailing partner unit.

With further reference to FIG. 9, each address and control stage 354 and 358 can produce a Channel Busy signal and a further signal designated Channel Driving Bus. An AND gate 386 (FIG. 10) in the memory status and control stage 368 is actuated by the two Busy signals to drive a transceiver 388 to produce a Fast Busy signal and the Busy signal discussed above with reference to FIG. 2. A further AND gate 390, FIG. 9, produces an Out Enable signal that enables the data transceivers 300 and 302 only when both Driving Bus signals are present. With this arrangement, when the two channels of the address and control circuit 168 do not concurrently produce the Driving Bus signals, the memory unit is disabled from transferring data to the bus structure, as desired to prevent potentially faulty data from being transmitted to other units of the computer system. The clamp stage 344 in a memory unit prevents potentially faulty data from being applied to the transceivers 300, 302 in the event of a power supply failure.

A memory unit having the foregoing features of FIGS. 9 and 10 can execute numerous memory cycles. In a memory read cycle, the data read from memory is applied to the bus structure 30 by way of the transceivers 300, 302 in the same time phase as it is applied to the ECC stage 320. In the event this stage produces a non-zero syndrome, the memory unit produces the Fast ECC signal during the same time phase and transmits it to the central processing unit 12, 14 (FIG. 1) by way of the X bus 46. The ECC stage produces the corrected data word and stores it in the old data registers 322, 324 for feeding to the bus structure by way of the multiplexor 298 and the transceivers 300, 302 during a subsequent timing phase.

In addition to executing a conventional write operation of a full data word, the memory unit can perform a write operation with only a single data byte from the bus structure. For this operation, the address control portion of the memory unit does not receive both the Upper Data Valid and the Lower Data Valid signals, as occurs when a full data word is to be written, but receives only one of these control signals. In response to receiving only a single Data Valid signal, the memory unit first reads from the RAMs 290, 292 the word stored at the location being addressed, and uses one byte of that word in conjunction with the new data byte received from the bus structure to assemble a complete data word. The new byte receives one parity bit from one parity generator 332, 334, 336 or 338. The old byte already has one parity bit. The newly assembled eighteen-bit word receives four additional check bits from the check bit generator 340 before being written into memory. The memory unit thus stores a full twenty-two bit word, which includes the new data byte in addition to the old data byte with a full complement of parity and check bits.

Another memory cycle which the memory unit 16, 18 can execute is to read a complete word from the RAMs 290, 292 and drive it onto the bus structure by way of the transceivers 300, 302 and to receive the same data from the bus structure and again write it at the same address, with a recomputing of all ECC bits. This memory operation is useful, for example, to duplicate the contents of one memory unit in a partner unit. That is, to bring one memory unit up to date with a partner memory unit, a system can read from the latter memory unit and place the resultant data on the bus structure, and write that data from the bus structure into the former memory unit at the same location. Any data read from the former memory unit is not driven onto the bus structure, by inhibiting the Output Enable signal of the transceivers 300, 302 in that memory unit. The illustrated memory unit is thus capable of writing from an on-line memory unit to an off-line memory unit in one multi-phase memory cycle.

Peripheral Control Units

Figure 11:
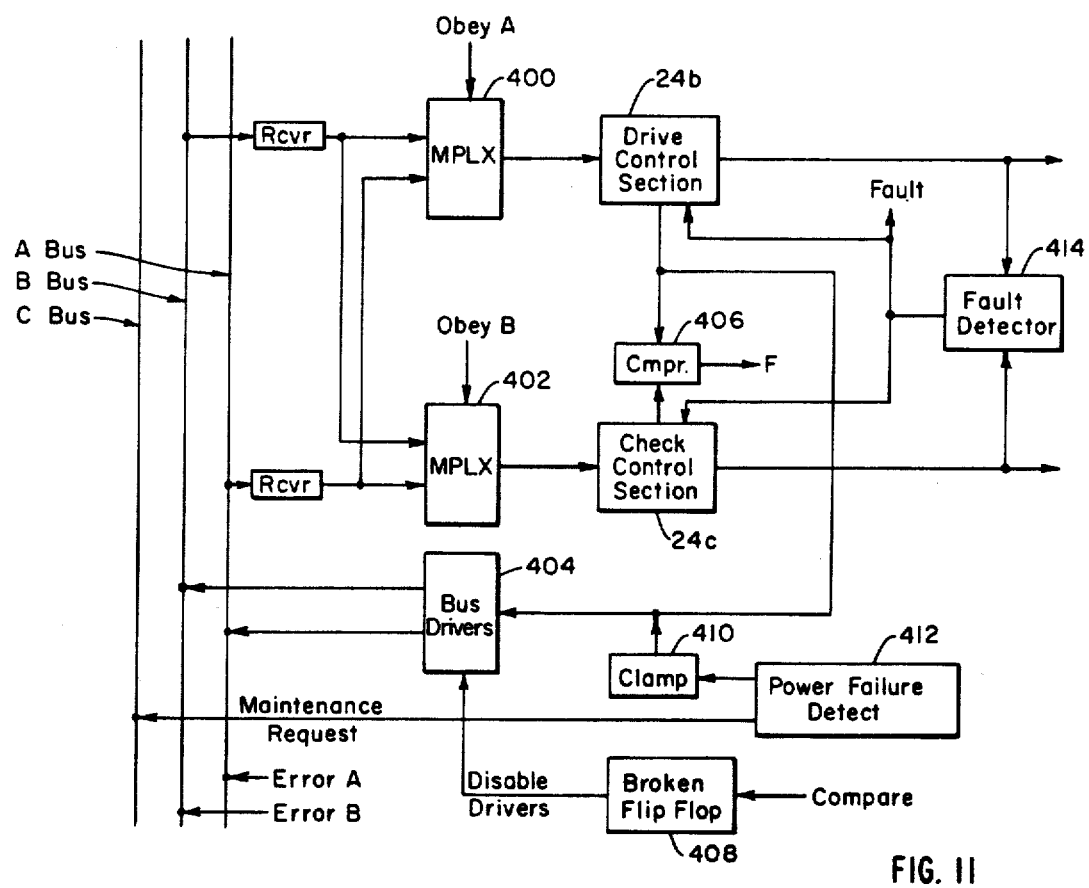
FIG. 11 is a functional block representation of a standard interface section of a control unit according to the invention.

The communication control unit 24, typical of the partner unit 26, and like other control units 20, 22, 28, 32 and 34 of the FIG. 1 processor module 10, has a bus interface section 24a that connects to the bus structure 30, has two parallel control stages 24b and 24c that provide logic and data transfer operations for the communication devices connected with the communication panels 50, and has a communication interface section 24d that connects to the communication panels. FIG. 11 is a simplified schematic representation of elements of the communication control unit 24 and particularly of the bus interface section 24a. Two channel-selecting multiplexors 400 and 402 are connected to receive input signals, each through a separate set of receivers, from the A bus 42 and from the B bus 44. The multiplexors form a cross-over circuit for applying signals from either bus to each control section 24b, 24c. Thus both control sections 24b, 24c can receive input signals from the A bus 42 or from the B bus 44, or one control section can receive signals from one bus while the other control section receives signals from the other bus.

The multiplexors 400, 402 provide this operation in response to a selection controlling signal which each multiplexor receives and termed an Obey A signal and an Obey B signal. In the module 10 of FIG. 1 in which all elements are functioning properly, both Obey signals are present and accordingly the multiplexor 400 applies to the control section 24b signals received from the A bus and multiplexor 402 applies signals from the B bus to the control section 24c.

The multiplexor 400, by way of example, responds to an assertive Obey A select signal to apply to the output terminals the signals which it receives from the A bus 42. An assertive Obey A select input switches the multiplexor to apply the signal it receives from the bus 44 to its output terminals. The multiplexor 402 operates identically and responds to the Obey B signal to apply to its output terminal signals received from the B bus, whereas the Obey B select input produces the A bus signal at the multiplexor output. The CPU multiplexors of FIGS. 4 and 5A oeprate in this manner in response to each designated select signal, as do the multiplexors in the memory unit, FIG. 9. However, in the preferred embodiment, each CPU 12 and 14 and each memory unit 16 and 18 processes input signals received from either the A bus or the B bus but not from both buses, whereas each peripheral control unit 20, 22, 24, 26, 28, 32, and 34 responds to the Obey A and Obey B signals to process input signals received from both the A bus and the B bus.

The control section 24b drives an output device, which for the communication control unit is one or more communication panels 50 (FIG. 1), and drives signals from the control unit to the bus structure 30. The other control section 24c produces signals for checking these operations. Accordingly, drivers 404 apply bus output signals from the drive control section 24b to both the A bus and the B bus. A comparator 406 compares these output signals with corresponding output signals from the check control section 24c. In response to an invalid comparison, the comparator switches a so-called broken flip-flop 408 to disable the drivers 404. When thus disabled, the drivers do not drive signals onto the bus structure, regardless of what input signals they receive.

With further reference to FIG. 11, the multiplexors 400, 402, the drivers 404, the comparator 406, and the flip-flop 408 are part of the bus interface section of the control unit 24. This section also includes a clamp circuit 410 that responds to the detection of a power failure in the control unit 24 as determined by a power failure detector 412 to clamp to ground the output lines from the drive control section 24b to the drivers 404. This prevents the control unit 24 from applying potentially faulty signals to the bus structure. The detector 412 generally responds sufficiently quickly to the onset of a power failure to clamp the driver input lines to an inactive condition during the transition from normal operation to inoperativeness due to the power failure.

FIG. 11 also indicates schematically that a fault detector 414 is connected with the signal lines interconnecting the drive control section 24b and the communication panels 50 to test the signals on these lines against the signals which the check section 24c produces. The fault detector thereby tests for further fault conditions in the operation of the control unit 24. The resultant fault signals from the fault detector 414 are applied to each control section 24b and 24c, as indicated.

Bus Interface Section

Figure 12A:
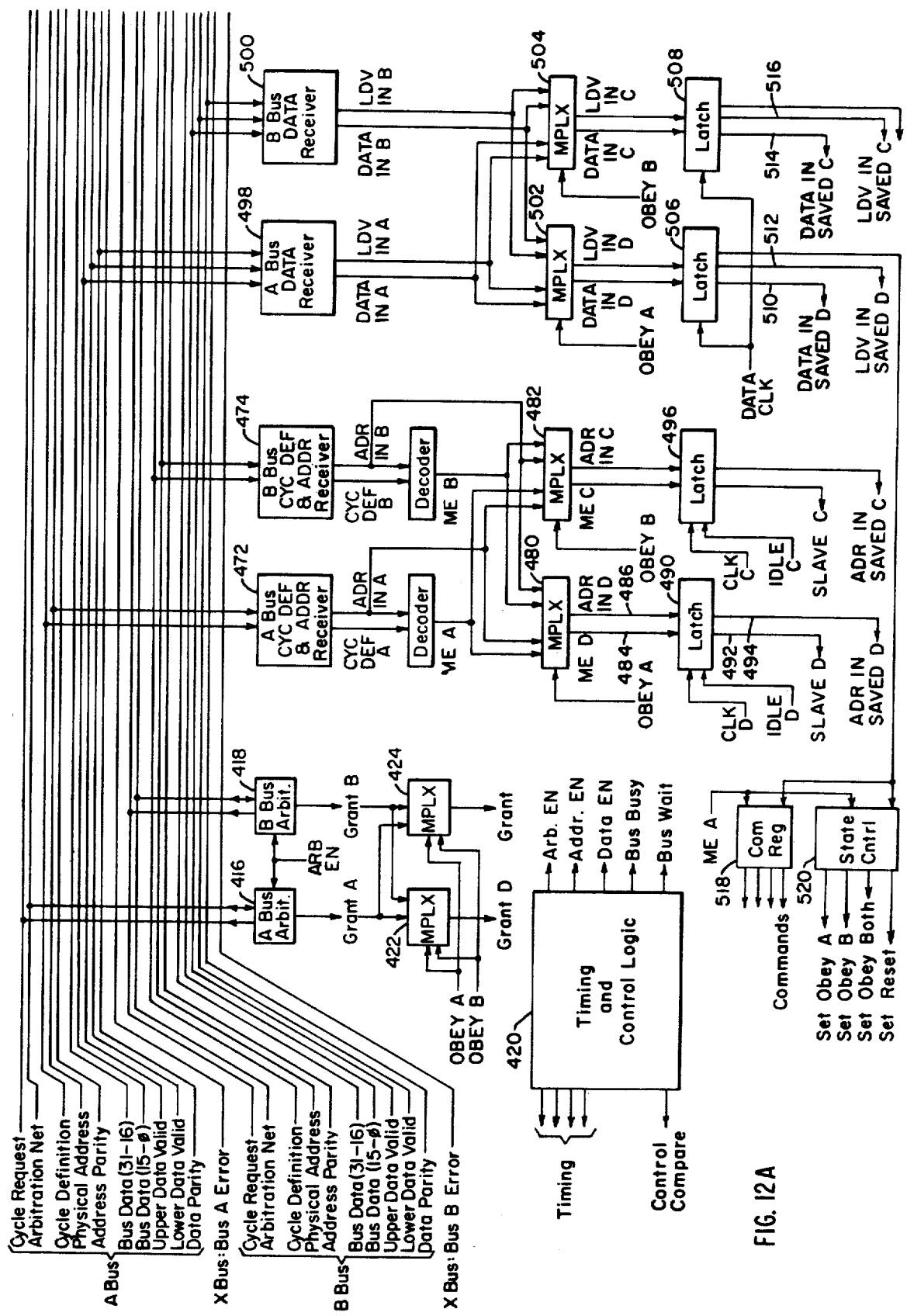
FIGS. 12A and 12B form a block schematic diagram of an interface section according to FIG. 11.
Figure 12B:
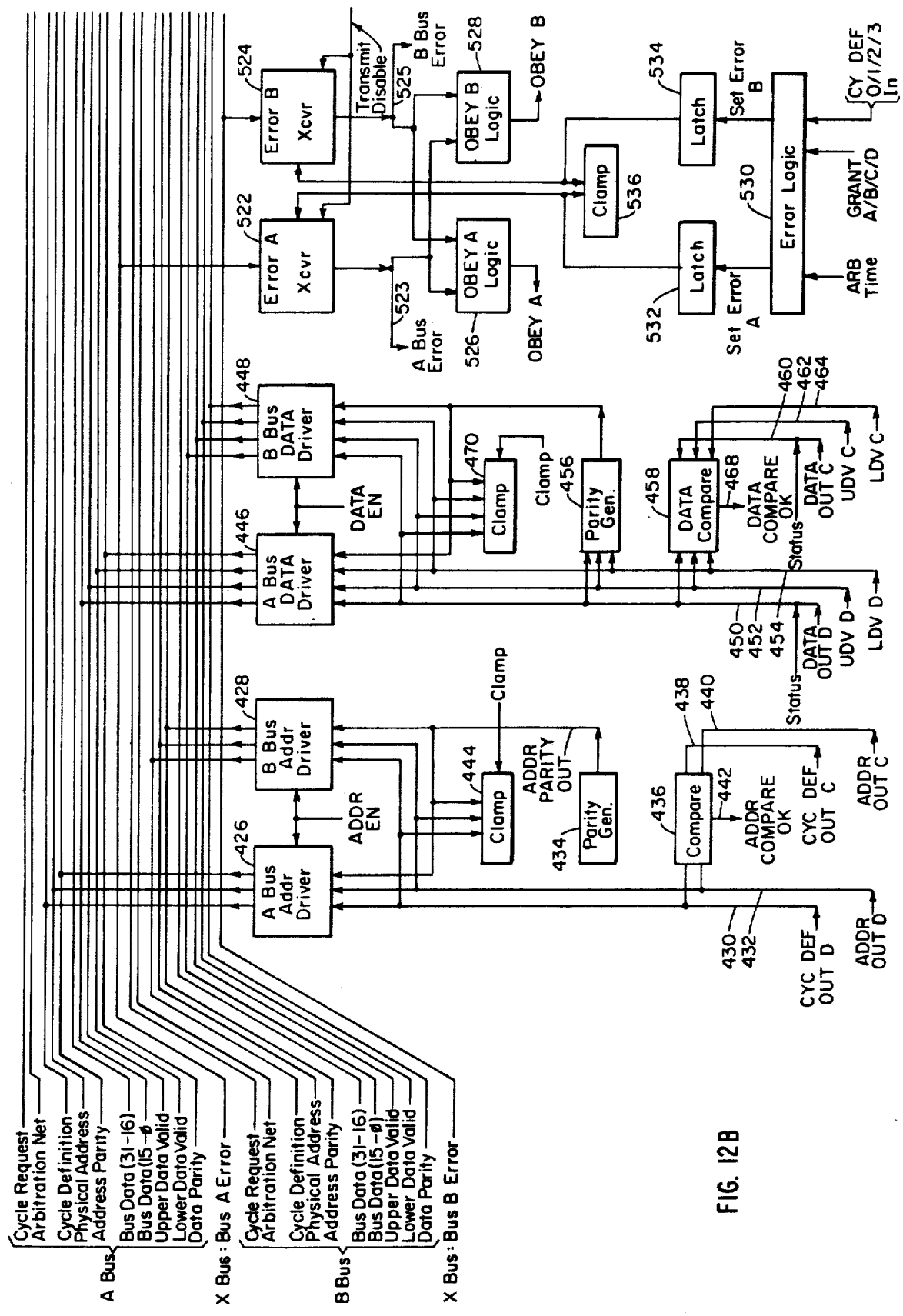

FIGS. 12A and 12B show in further detail a preferred embodiment of the communication control unit 24 interface section 24a. Each also shows the connections of the interface section to the conductors of the A bus 42 and of the B bus 44, and to the X bus 46 conductors for the Bus Error signals. This interface section is preferably used in each control unit of the FIG. 1 module 10.

The illustrated control unit interface section 24e has an arbitration circuit 416 connected with the cycle request conductors and with the arbitration conductors of the A bus 42, in the manner described with reference to FIG. 3 for the arbitration circuit 264. A like arbitration network 418 is connected in the same manner with the cycle request and arbitration conductors of the B bus 44. Control logic 420 actuates the two arbitration circuits 416 and 418 with an arbitrate enable (Arb En) signal, as shown, when the control unit 24 is in an arbitration phase, as described with reference to FIG. 2. The Grant signal output from each arbitration circuit 416 and 418, assertive when the control unit 24 is the highest priority unit requesting access to the bus structure 30, is applied to each of two multiplexors 422 and 424. The multiplexors respond to an Obey A signal and an Obey B signal to produce both Grant D(drive) and Grant C(check) signals, as required for operation of the memory unit. The resultant Grant Drive and Grant Check output signals from the two multiplexors 422, 424 enable the control unit 24 to drive signals onto the bus structure for a data transfer cycle.

To drive address signals onto the bus structure, the bus interface section 24a has an A bus address driver 426, FIG. 12B, with output lines connected to the cycle definition, physical address, and address parity conductors of the A bus 42. A like B bus address driver 428 is connected in the same manner with conductors of the B bus 44. An Address Enable (ADDR EN) signal from the control logic 420 enables the address drivers 426 and 428 during the definition phase of an operating cycle. Input signals to both drivers 426 and 428, in common, are address signals from the drive control section 24b of FIG. 11 and a cycle definition signal from the control logic 420 (FIG. 12A). In addition, each data bus driver receives, again in common, an address parity digit from an address and cycle definition parity generator 434. The input signals for this parity generator are the output address and cycle definition signals applied to the two drivers. A comparator 436 compares the output address and cycle definition signals from the drive control section 24b, on lines 430 and 432, with the corresponding signals which the check control stage 24c produces on lines 438 and 440. The address compare signal from the comparator 436 is developed on a line 442. A diode clamp stage 444 responds to a Clamp signal to clamp to ground all the input lines to the drivers 426 and 428.

The interface stage of FIG. 12B applies data to the bus structure with an A bus data driver 446, the output of which is connected to the A bus 42 conductors of data signals, data parity, and the upper data valid and lower data valid signals. The control logic 420 enables this driver, and an identical driver 428 connected with the corresponding conductors of the B bus 44, with a Data Enable signal during the data transfer phase of an operating cycle. The input signals to the two drivers 446, 448 are the output data, Upper Data Valid and Lower Data Valid signals from the drive control section 24b of the control unit; these signals are applied to the interface section of lines 450, 452, and 454. A data parity generator 456 also connects with these lines to produce a data parity bit that is also applied to the two data drivers 446 and 448.

A data comparator 458, which together with the address comparator 436 is part of the FIG. 11 comparator 406, compares the signals applied to the drivers 446 and 448 on the lines 450, 452 and 454 with corresponding signals which the check control section 24c develops on conductors 460, 462 and 464. The resultant data compare signal is developed on line 468. A diode clamp 470 is connected with all the input lines to data drivers 446 and 448 and responds to the Clamp signal to fix the lines to ground potential.

The data which each data line 450 and 460 applies to the drivers 446 and 448, respectively, can include status information. The status information, for example, includes control unit identification such as type and revision status, and operating status such as idle, busy, broken, and interrupt conditions. A control unit stores such status information in status registers, as can be provided with conventional techniques, and drives it to the A bus and B bus in response to interrogation, typically from the CPU.

With further reference to FIG. 12A, the communication control unit 24 receives address and cycle definition signals from the A bus 42 with a cycle definition and address receiver 472. A like receiver 474 receives corresponding signals from the B bus 44. Each receiver 472, 474 applies the cycle definition signals and selected address signals to a cycle definition and address decoder 476 and 478, respectively. The decoder 476 produces an assertive output signal, designated ME A, in response to signals on the A bus 42 which address the control unit 24. This signal, and other address signals from the receiver 472, are applied to inputs of two channel multiplexors 480, 482. The multiplexors 480, 482 are actuated with Obey A and Obey B signals in the same manner as the arbitration multiplexors 422 and 424. A ME D (drive) signal and the address signals from the multiplexor 480, on conductors 484 and 486 respectively, are applied to a latch 490. The latch is enabled to store these signals, in response to a timing signal, by an Idle signal which the drive control section 24b produces when it is inactive, i.e., is not participating in a data transfer cycle.

In the event the multiplexor 480 produces a ME D(drive) signal on line 484 at a time when the drive control section 24b is not producing the Idle signal, i.e., is not in the idle state, the control section actuates the control logic 420 to produce a Bus Busy signal, which is applied to the X bus 46. With reference to FIG. 2, this signal causes the data transfer cycle which produced the ME D signal to be aborted.

Upon being entered into the latch 490, the cycle definition and address signals are available on lines 492, 494 for application to the drive control section of the control unit 24. A like latch 496 stores the ME C (check) and address signals output from the multiplexor 482 when the check control section 24c is in the Idle state.

Data receivers 498 and 500, shown in FIG. 12A, receive data and the Upper Data Valid and Lower Data Valid signals on the A bus and on the B bus, respectively, and apply corresponding data and data valid signals to each of two further channel multiplexors 502 and 504. Obey A and Obey B signals actuate each multiplexor 502 and 504, and registers 506 and 508 receive data and Data Valid signals for the drive channel and for the check channel, respectively, from the multiplexors. Data and Data Valid signals clocked into each latch 506 and 508 are available for application to the drive control stage 24b on lines 510 and 512, and are similarly available on lines 514 and 516 from the latch 508 for the check channel of the control unit.

The data receivers 498 and 500 also can receive command and instruction information from another unit of a processor module, generally the CPU. This information is transferred from the receivers to the latches 506 and 508. As further shown in FIG. 12A, the latch 506 is connected to transfer the information, under control of the ME A signal, to command registers 518 and to status control stage 520. The command and instruction information actuates the command register assert different command lines 518a for controlling the operation of a control unit, and actuates the status control stage to produce such control signals as set Obey A, set Obey B, set both Obey A and Obey B, and set Reset. The latch 508 preferably is connected with an identical set of command registers and state control stage.

The illustrated bus interface section 24a further has a transceiver 522 (FIG. 12B) connected with the bus error conductor of the A bus 42 and has a like transceiver 524 connected with the corresponding error conductor of the B bus 44. The input error signal from each transceiver 522, 524 is applied to Obey A logic 526 and to Obey B logic 528. The former produces an Obey A signal and the logical complement, and the latter produces an Obey B signal and the logical complement. These are the signals which operate the grant-routing multiplexors 422 and 424, the address-routing multiplexors 480 and 482, and the data-routing multiplexors 502 and 504. In one preferred manner of operation when no error-producing fault is detected, the multiplexors 422, 480 and 502 respond to signals received on the A bus concurrently with the response of the multiplexors 424, 482 and 504 to signals received on B bus. An error detected with regard to the A bus causes the obey logic 526 to disable the Obey A signal and thereby switch multiplexor 422, 480 and 502 to apply to the output terminals of each the input signals from the B bus. Correspondingly, the detection of an error on the B bus switches the other multiplexor of each pair, i.e. the multiplexors 424, 482 and 504.

The error transceivers 522 and 524 also drive error signals onto the A bus and B bus in response to a logic error as detected within the interface section, whenever it is in an arbitration phase of operation and obeying both buses, by a logic error circuit 530. This circuit 530 produces a Set Error A signal and a Set Error B signal in the event the arbitration circuits 416 and 418 produce inconsistent Grant A bus and Grant B bus signals. The Set Error signals are stored in registers 532 and 534 for application to the transceivers 522 and 524, as shown. In the event a power failure produces the Clamp signal, a clamp circuit 536 clamps to ground the input lines to the transceivers 522 and 524.

The bus interface section 24a of a control unit as shown in FIG. 12 operates with all receivers of signals from the A bus and the B bus continually ON for receiving bus signals. The receiver portions of the Error transceivers 522 and 524 accordingly respond to signals on the A bus error and B bus error conductors to produce an A bus error signal on line 523 and/or a B bus error signal on line 525, whenever another unit of the system applies the appropriate Error signal to either of these bus conductors. The obey logic 526 and 528 respond to these Bus Error signals, and to Obey instructions received from the bus structure, typically in response to signals from the central processing unit 12, 14. In particular, when the obey logic 526, 528 receives instructions to respond to both buses, it produces both the Obey A signal and the Obey B signal. It produces either one signal or the other, but not both, in response to other received instructions. When the obey logic is producing only the Obey A signal and the error A transceiver 522 applies an A Bus Error signal to it, the circuit switches to produce only the Obey B signal. Conversely, when the logic 526, 528 is producing only the Obey B signal and it receives a B Bus Error signal from transceiver 524, it switches to produce only the Obey A error signal. When the logic 526, 528 is producing only the obey signal for one bus and receives a Bus Error signal for the other bus, it continues to produce the same one obey signal. In the event the obey logic 526, 528 receives bus error signals from both transceivers 522 and 524 in the same clock phase, it does not change the existing condition of the Obey A and Obey B signals. This condition occurs when a CPU 12, 14 detects an invalid comparison or invalid parity as discussed with reference to FIG. 6. Otherwise it is a fault condition for the processor module 10 and the memory unit 16, 18 detects most instances of such an error condition to produce an ECC error.

The cycle definition and address receivers 472 and 474 (FIG. 12A) respond to cycle definition and address signals received from the bus structure, and store in the latches 490 and 496 the signals received from the A bus and/or the B bus according to the condition of the Obey A and Obey B signals applied to the address multiplexors 480 and 482. Similarly, the data receivers 498 and 500 respond to data and data valid and data parity signals on the A bus and the B bus, and store corresponding input data in both latches 506 and 508 according to the Obey signals applied to the data multiplexors 502 and 504.

The illustrated bus interface section of the control unit 24 of FIG. 12 drives onto both the A bus and the B bus address signals output from the drive control section 24b (FIG. 11) with a parity bit, by way of the address drivers 426 and 428. Similarly, the data drivers 446 and 448 apply to both the A bus and the B bus data output from the drive control section 24b, together with a parity bit from the parity generator 456.

The address comparator 436 (FIG. 12B) compares the output address and cycle definition signals applied to the drivers 426 and 428 with the corresponding signals from the check control stage 24c of the control unit. As discussed below with reference to FIG. 13, the Address Enable signal applied to the address drivers is asserted, to cause the signals to be driven onto the bus structure, in the next clock phase after the signals are applied to the comparator 436. In the event the set of drive signals applied to the comparator does not compare identically with the set of check signals, the address drivers are not enabled. This action prevents the control unit 24 from applying potentially faulty information to the bus structure.

In the same manner, the data comparator 458 compares the output data and valid signals, which the drive control section applies to the data drivers 446 and 448, with the corresponding signals which the check control section develops. An invalid data comparison inhibits the Data Enable signal and thereby prevents potentially faulty data from being applied to the bus structure.

With further reference to FIG. 12A, the arbitration circuits 416 and 418 together with the cross-over formed by the multiplexors 422 and 424 produce, during normal operation, the Grant D signal concurrently with the Grant C signal. The multiplexors 422 and 424 produce both the Grant D signal and the Grant C signal in three different conditions. In one condition, both buses are functioning properly so that the Obey A and Obey B signals both are present. In this condition, both the Grant A and the Grant B signals are required for the multiplexors to produce the Grant D and Grant C signals. In a second condition, where only the Obey A signal is present, and not the Obey B signal, the multiplexors produce both the Grant D and Grant C signals in response to the Grant A signal, regardless of the condition of the Grant B signal. The third condition is the reverse of the second; only the Obey B signal is asserted and the Grant B signal alone causes the Grant D and C signals to be produced.

In the event only one of the Grant D or Grant C signals is produced when both obey signals are assertive, the error logic 530 (FIG. 12B) produces either, but not both, the Set Error A or the Set Error B signal. More particularly, each control unit in the illustrated processor module 10 checks the arbitration lines of the bus structure. For this operation, the error logic 530 responds in the following manner to the assertion of only one of the two Grant C and Grant D signals when both the Obey A and Obey B signals are assertive. When in the next clock phase another unit of the module commences an operating cycle, the error logic 530 produces a Set Error signal for the bus that produced a Grant signal. For example, when the arbitration circuits 416, 418 in the communication control unit produce only a Grant B signal, and not a Grant A signal, and on the next clock phase a unit of the system other than the communication control unit 24 or the partner 26 applies cycle definition and address signals to the bus structure, the error logic 530 reports that the production of the Grant B signal was the result of an error in signals received from the B bus 44. Accordingly the error logic 530 produces the Set Error B signal. The error B transceiver 524 responds to that signal to apply a B Bus Error signal to the B bus 44. Conversely, when the arbitration circuits 416, 418 produce only a Grant B signal, and not a Grant A signal, and on the next clock phase no unit of the system applies cycle definition and address signals to the bus structure, the error logic 530 reports that the failure to produce a Grant A signal was the result of an error in signals received from the A bus 42. The error logic 530 accordingly produces the Set Error A signal, which the error A transceiver 522 drives onto the A bus error conductor.

Figure 13:
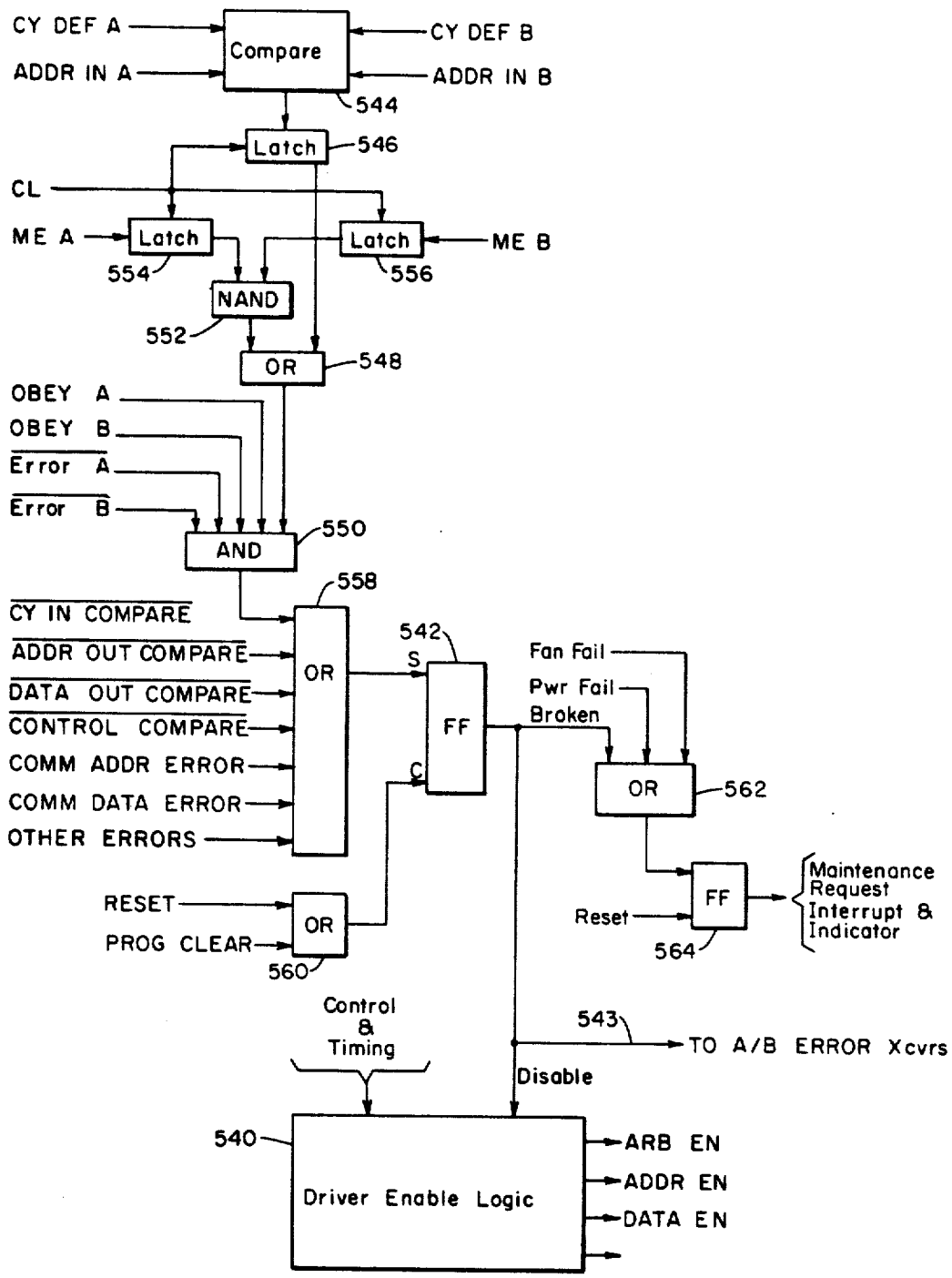
FIG. 13 is a block diagram of control circuitry for the interface section of FIGS. 12A and 12B.

FIG. 13 shows further circuits of the bus interface section for preventing the timing and control logic 420 of FIG. 12A from producing the arbitration enable, address enable, and data enable signals. This action of blocking the enable signals to the bus drivers occurs in response to the detection of an error in the interface section. FIG. 13 shows that driver enable circuit 540 in the control logic 420 produces the arbitration enable, address enable and data enable signals in response to control and timing signals except when a flip-flop 542 is set, in response to a fault condition, and produces a Broken signal. The Broken signal from the flip-flop 542 is also applied by line 543 to disable the transmit section of each error transceiver 522 and 524 of FIG. 12B. (The flip-flop 542 is preferably the same broken flip-flop 408 described with reference to FIG. 11.

One condition that sets flip-flop 542 to produce the Broken signal results from an illegal difference in the cycle definition and address signals which the communication control unit bus interface receivers 472 and 474 produce from signals received from the bus structure 30. More particularly, with further reference to FIG. 13, a comparator 544 receives selected ones of the cycle definition and address signals from the A bus and compares them with corresponding cycle definition and address signals received from the B bus. The Address In Invalid signal that the comparator produces in response to an invalid comparison condition is stored in a latch 546 for application, by way of an OR gate 548, to an AND gate 550.

A NAND gate 552 also actuates the OR gate 548 when either one, but not both, the ME A signal or the ME B signal, which the FIG. 12A cycle definition address decoders 476 and 478 produce, is present. Latches 554 and 556 save the ME A and ME B signals for application to the NAND gate. With this arrangement, the OR gate 548 applies an assertive signal to the AND gate 550 either when the two sets of signals applied to the comparator 544 differ or when only one ME signal is produced but not the other. A fault is present if either of these conditions occurs when the control unit is set to respond to both buses, i.e., when both the Obey A and the Obey B signals are present, and when neither the Error A nor the Error B signal is assertive. Accordingly, other inputs to the AND gate 550 are, as shown, the Obey A, Obey B, Error A, and Error B signals. When these four inputs are assertive, the AND gate 550 responds to an assertive output from the OR gate 548 to set the broken flip-flop 542, by way of an OR gate 558.

Thus, the circuit of FIG. 13 produces the Broken signal when the bus interface section 24a is set to obey both buses and neither Bus Error signal is present, but nevertheless the cycle definition and address signals received from the two buses differ, as determined by the comparator 544 and the NAND gate 552. The latches 546, 554 and 556 provide a delay of one clock phase before producing the Broken signal, to allow either Error A or Error B signal to be asserted. If either Error signal is asserted during the one timing phase delay which the latches provide, the inequality which the comparator 544 and/or the NAND gate 552 detects is considered to be the result of the faulty bus which gives rise to the asserted Error A or Error B signal, rather than to a fault in the control unit 24. Hence, if either Error signal is asserted during the single timing phase delay, the control unit 24 continues operating, and does not raise the Broken signal.

The FIG. 13 OR gate 558 also receives the FIG. 12B output lines 442 and 468 from the address comparator 436 and the data comparator 458, respectively. An invalid comparison from either comparator again causes the OR gate 558 to set the broken flip-flop 542.

FIG. 13 further shows that the OR gate 558 receives the complement of a Control Compare signal. The bus interface section 24a typically compares selected control signals, for checking selected control functions, and raises the broken flag in response to a failure of such control signal comparisons. The broken flip-flop 542 is cleared or reset in response to either a Reset signal or a Program Clear signal as applied to an OR gate 560.

The Broken signal from flip-flop 542 is applied also to an OR gate 562 that sets a flip-flop 564 to raise a maintenance request interrupt signal and to turn on an indicator of the broken condition. Other inputs to the OR gate 562 are a Fan Failure signal and Power Failure signal. The former signal indicates that a temperature controlling fan is faulty and the latter signal, produced with power circuits described hereinafter, indicates that the electrical supply to the control unit is failing.

Communication Control Unit

Figure 14:
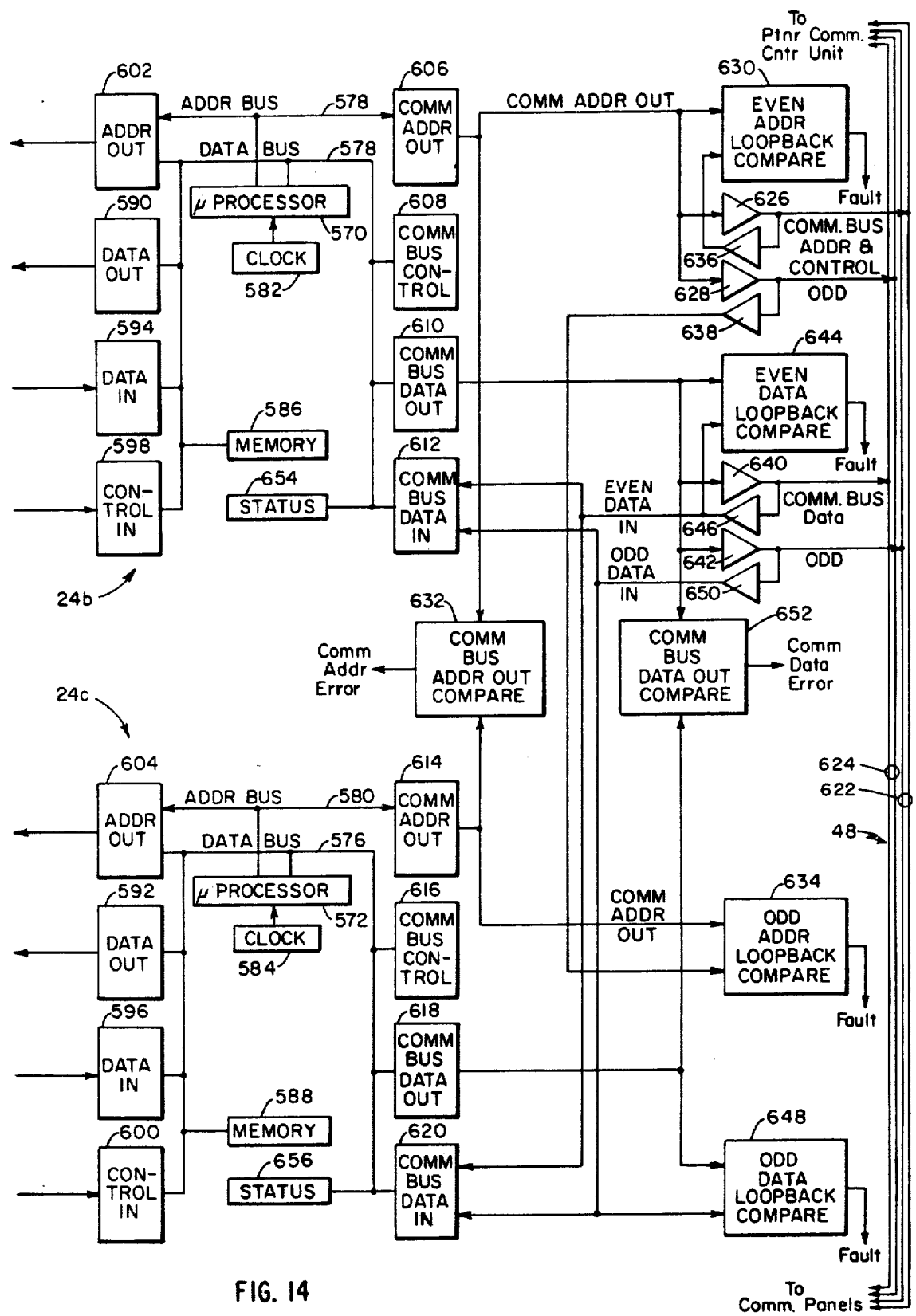
FIG. 14 is a block schematic diagram of control sections and a further interface section for a communication control unit according to the invention.

FIG. 14 shows the drive control section 24b, the check control section 24c and the communication interface section 24d of the illustrated communication control unit 24. The two control sections 24b and 24c are essentially identical. Each has a microprocessor 570, 572 connected with a data bus 574, 576 and with an address bus 578, 580, respectively. A clock 582, 584 is connected with each microprocessor 570, 572, and a random access memory 586, 588 is connected with each data bus 574, 576, respectively. Also connected with each data bus 574, 576 are a data output register 590, 592, a data input register 594, 596 and a control input register 598, 600. An address output register 602, 604 is connected with each data bus 574, 576, and with each address bus 578, 580, respectively.

The control registers 598 and 600 of the drive and check control sections 24b and 24c receive the control and address signals stored in the interface section latches 490 and 496, respectively, of FIG. 12A. The control registers 598 and 600 also receive other control and timing signals from within the bus interface section, and apply control signals to other elements of the bus interface section. The data in registers 594 and 596 receive respectively the information stored in the data latches 506 and 508 of FIG. 12A. The address output registers 602 and 604 connect to the bus address drivers 426 and 428, respectively, of FIG. 12B, and the data out registers 590 and 592 connect to the data drivers 446 and 448.

With further reference to the simplified functional representation in FIG. 14, the illustrated drive control section 24b has an address output register 606 connected with the address bus 578, and has a communication control register 608, a communication data output register 610 and a communication data input register 612, all connected with the data bus 574. The check control section 24c similarly has an address output register 614 connected with the address bus 580 and has, connected with the data bus 576, a bus control register 616, a communication data output register 618 and a communication data input register 620.

FIG. 14 further shows a functional representation of the communication unit interface section 24d which connects to the communication panels 50 by way of the communication bus 48 (FIG. 1). The illustrated communication bus 48 is arranged with two identical sets of conductors designated odd conductors 622 and even conductors 624. A peripheral communication device generally connects at communication panel 50 to only one conductor set. The interface section 24d applies signals from the address output register 606 of the drive section 24b to two communication bus drivers 626 and 628. One driver is connected to the even-address conductors 622 and the other, to the odd-address conductors 624, as shown. The signals from the address register 606 are also applied to a comparator 630, which provides an even-address loop-back compare function, and to a comparator 632. The latter comparator also receives the address output signals from the register 614 in the check control section. The comparator 632 thus compares the address output signals from the drive control section, with those produced in the check control section.

The address signals from the check channel address output register 614 are also applied to a comparator 634 that provides an odd-address loop-back compare function. A further driver 636 applies the output address signals from the even-address driver 626 to a further input of the loop-back comparator 632 and a like driver 638 applies the output signals from the odd bus driver 628 to the other input of the odd-address loop-back comparator 634.

The communication bus interface section 24d similarly applies the data signals output from the drive channel register 610 to a driver 640 which feeds the even-conductor set 624 of the communication bus 48 and to a driver 642 which feeds the odd-conductor set 622. An even-data loop-back comparator 644 also receives the data signals from the register 610 and, by way of a driver 646, the signals output from the even-data driver 640. An odd-data loop-back comparator 648 compares the data signals output from the check channel register 618 with the data which the driver 642 applies to the odd-conductors 622, as fed back by way of a driver 650.

Further, data input to the control unit 24 from the communication bus 48 is applied, by way of the data in drivers 646 and 650, to the communication data input registers 612 and 620. A further comparator 652 compares the data which the drive channel data register 610 applies to the communication bus 48 with the data output from the check channel register 618.

The communication control unit 24 operates in the following manner with the control sections 24b and 24c and with the communication interface section 24d of FIG. 14. The drive control section 24b addresses a communication device, by way of the communication bus 48 and a communication panel 50, with address and control signals from the address output register 606. The signals are driven onto both the odd and the even address conductors of the bus 48 by way of the drivers 626 and 628. The loop-back comparators 630 and 634 compare the address and control signals placed on each set of address and control conductors with corresponding signals which the register 614 in the check channel produces. In addition, the comparator 632 compares the outputs of the two registers 606 and 614.

An invalid comparison of address signals or of data signals, output from the two control sections 24b and 24c for application to a communication device and as detected by the comparators 632 and 652, produces an error signal that switches the broken flip-flop 542 of FIG. 13 to the set or broken state. The Communication Address Error and the Communication Data Error signals from the comparators 532 and 652, respectively, accordingly are also applied to the FIG. 13 OR gate 558.

Any invalid loop-back comparison, as detected with the loop-back comparators 630 and 634 of address signals and as detected with the loop-back comparators 644 and 648 of data signals, produces a Fault signal. The fault signals are applied to both the drive and the check control sections 24b and 24c, typically by way of status registers 654 and 646 connected with each data bus 574 and 576, respectively. Each control section typically stores any such Fault signal in a status location for processing in any of several selected ways. For example, the control unit can be instructed to repeat a read operation or a write operation in the event of a fault signal. An alternative mode of operation is to simply log the fault and continue operation, and a further mode of operation is to halt operation in the event of a comparison fault.

In a read operation, the designated communication device responds to address, data, and control signals and sends information, typically either status information or data. The control unit 24 receives this information from the peripheral device on either the even-data conductors or the odd-data conductors, whichever are connected to the addressed device. Accordingly, one data input driver 646 and 650 applies the received information to both the data input register 612 in the drive channel and to the data input register 620 in the check channel. These data input registers serve as selectors to couple input data from either the odd set of conductors or the even set of conductors to data buses 574 and 576, respectively.

In a write operation, in addition to applying address and control signals to the bus 48, the drive control section 24d sends out data, by way of the data output register 610, to the data conductors of both conductor sets. The comparator 652 compares the data being sent out to the communication panel on the bus 48 with the corresponding signals which the check channel produces. In addition, the data loop-back comparators 644 and 648 compare the data applied to the bus 48. The comparator 644 effects the comparison with the data output from the drive channel register 610, and the comparator 648 effects the comparison with the data output from the check channel register 618.

The communication unit interface stage 24d thus checks operations of the control sections 24b and 24c, checks the output drivers to the communication bus 48 and, with the loop back comparators, checks functions of the communication bus.

Figure 15:
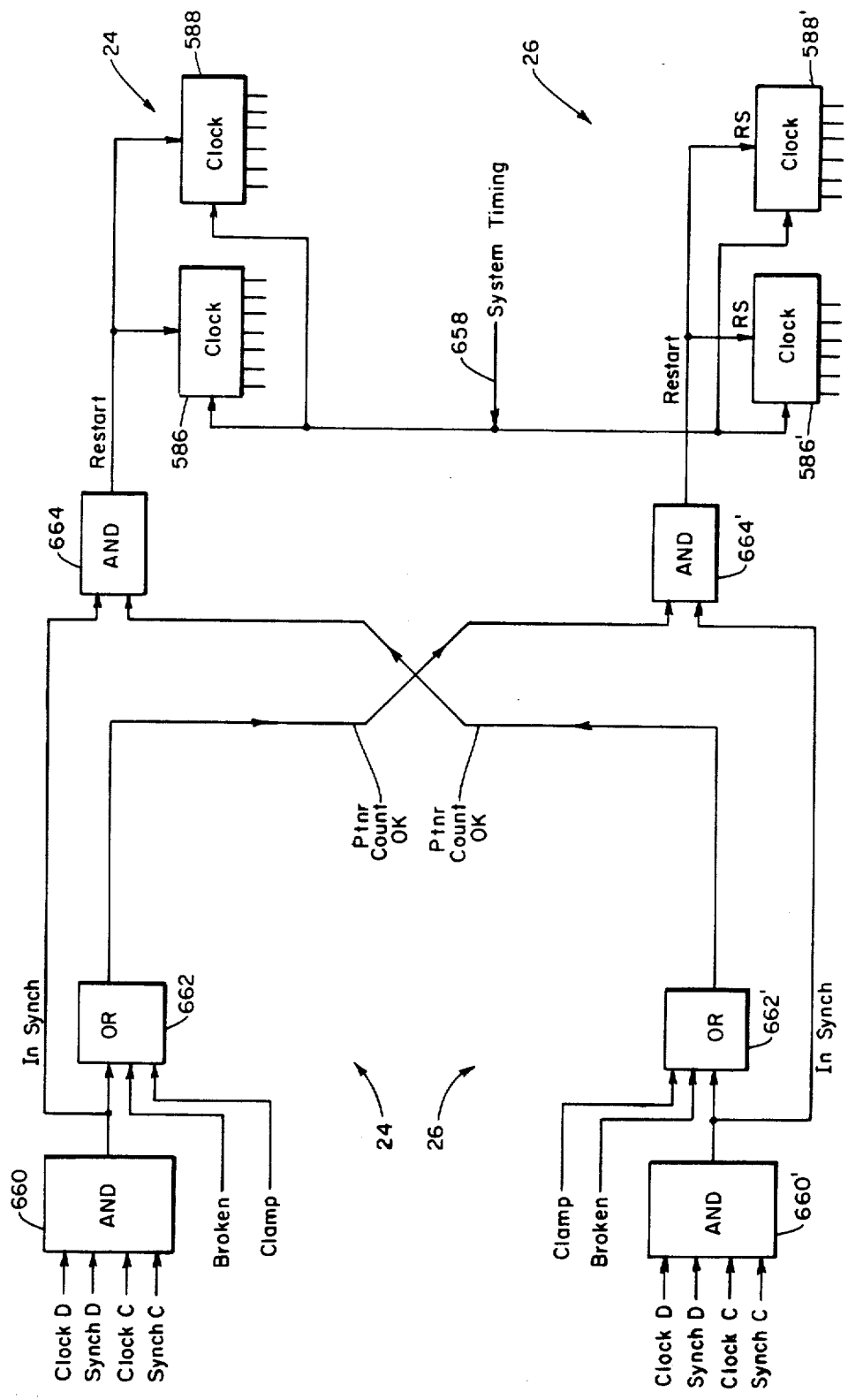
FIG. 15 is a block schematic diagram of a control circuit for a pair of communication control units according to the invention.

The drive and the check channels of the communication unit operate in lock-step synchronism with one another. Further, the communication control unit operates in synchronism with peripheral communication devices and hence can operate in lock-step synchronism with the partner communication unit 26. The illustrated communication unit 24 attains this synchronism with a partner unit by synchronizing the clocks 582 and 584 in one unit 24 with the corresponding clocks in the partner unit 26, as now described with reference to FIGS. 14 and 15. The clocks 582 and 584 in each control section 24b, 24c include a stage which counts system timing signals received from the X bus of the bus structure. FIG. 15 shows the two clocks 582 and 584 of FIG. 14 and the system timing input line 658 to each for the counting operation, to generate timing signals for the communication unit operation. The drawing also shows the corresponding clocks 582' and 584' in the partner communication unit 26. The drive and check clocks 582 and 584 in one unit are synchronized by synchronizing the restart of each count interval. Further, the pair of clocks 582, 584 in each communication unit 24, 26 is synchronized with those in the partner unit to provide the lock-step synchronous operation.

The illustrated control unit 24 provides this operation, as shown in FIG. 15, by applying to an AND gate 660 the clock and synch signals which the drive clock 582 therein produces at the very end of each count interval, and the corresponding clock and synch signals from the check clock 584 therein. When all the input signals to the AND gate 660 are assertive, the AND gate produces an In-Synch signal which it applies to an AND gate 664 and to an OR gate 662. The output signal from the AND gate 664 is applied to the re-start input of the two clocks 582 and 584, as shown. The OR gate 662 also receives the Broken signal produced with the broken flip-flop 542 of FIG. 13, and the same Clamp signal that clamps the input to bus drivers throughout the processor module in the event of power failure.

The OR gate 662 thus produces an assertive output signal, which signals the partner unit to count and hence is termed Partner Count OK, in response to the Clamp signal, which is a stopped condition for the unit 24 but not for the partner unit 26. The OR gate 662 also produces the Partner Count OK signal in response to either the In-Synch signal from the AND gate 660 or a Broken signal. This signal from the OR gate 662 thus is present either when the two clocks 582 and 584 are ready to commence a new count interval or when the communication unit 24 is broken, or when the Clamp signal is asserted. The Partner Count OK signal is applied to one input of an AND gate 664' in the partner communication unit 26, as FIG. 15 also shows. The AND gate 664' is connected in the same manner as the AND gate 664 in the control unit 24 with an AND gate 660' and an OR gate 662'.

Thus, in the unit 24, the AND gate 664 produces an assertive clock restart signal each time the clocks 582 and 584 therein have attained a full count, as determined with the AND gate 660, at the time when it receives the Partner Count OK signal.

In the event either unit 24, 26 becomes broken, or suffers a Clamp producing power failure, the AND gate 664, 664' in the partner unit nevertheless receives a Partner Count OK signal by virtue of the Broken signal and the Clamp signal being applied to the OR gate 662, 662' in the unit which is broken.

Thus, when the two partner communication units are not broken and are not stopped, the clocks in each unit commence a new count interval only when the partner unit is synchronized with it as determined by the In-Synch signals output from the two AND gates 660 and 660'. A Clamp signal or a broken condition in one partner unit releases the other unit to commence a new count interval independent of the clamped or broken unit.

Tape Control Unit

Figure 16:
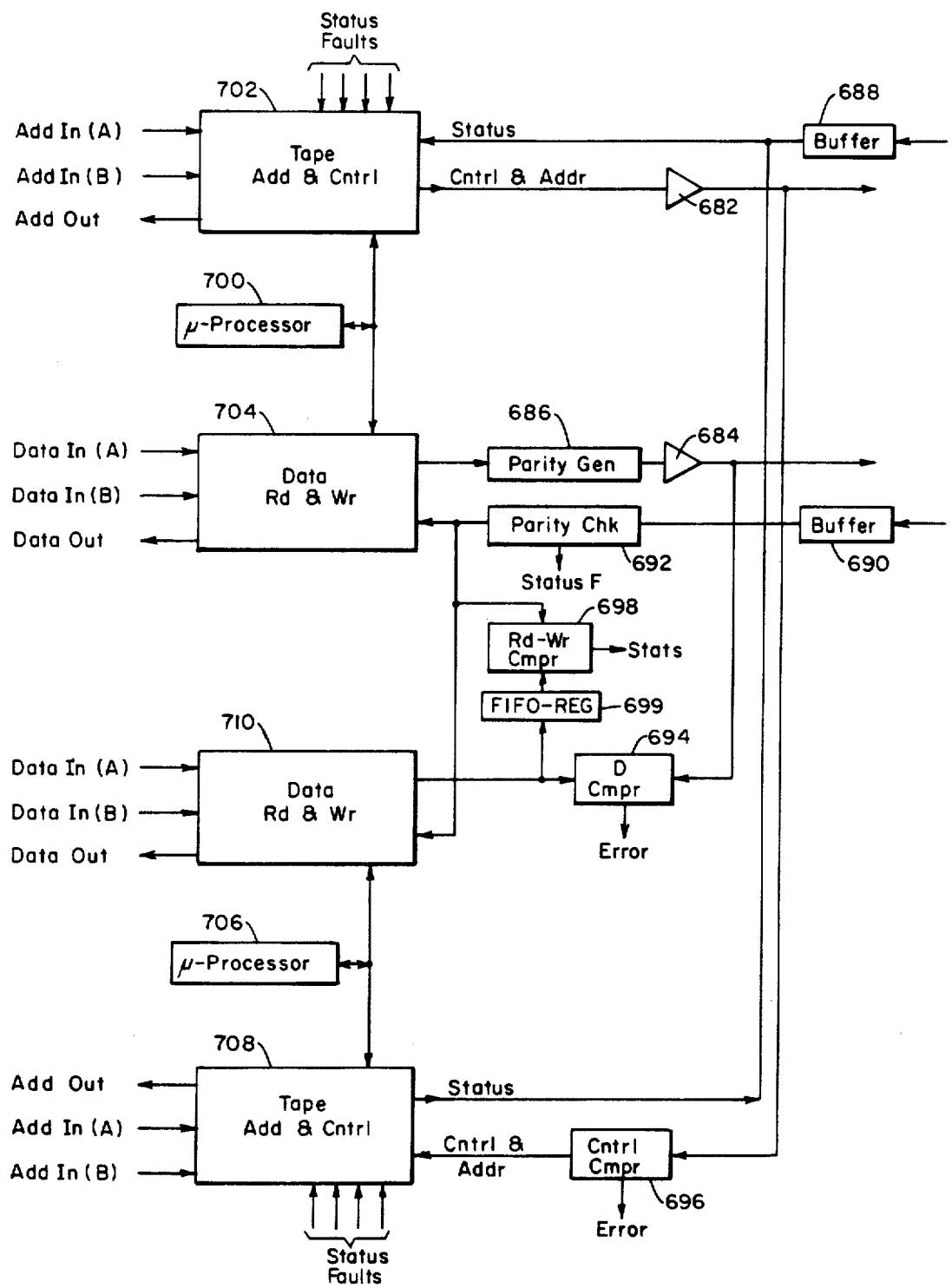
FIG. 16 shows section of a tape control unit according to the invention.

FIG. 16 shows the drive control section 28b, the check control section 28c, and the tape interface section 28d of the tape control unit 28 of FIG. 1. This control unit operates with a non-synchronous peripheral device, i.e. a tape transport, and hence is illustrative of features employed in the disc control unit 20, 22 of the FIG. 1 module 10. The control unit sections of FIG. 16 operate with a bus interface section 28a (FIG. 1) preferably structured substantially as the interface section 24c described above with reference to FIGS. 12 and 13.

The illustrated drive control section 28d has a microprocessor 700 connected with an address and control stage 702 and with a data stage 704. The check control section 28c similarly has a microprocessor 706 connected with an address and control stage 708 and with a data stage 710. The address and control stages 702 and 708 and the data stages 704 and 710 typically employ a number of registers for address, control, and data signals connected by way of data and address buses with the microprocessors 700, 706, respectively, with related control and timing logic, as illustrated in FIG. 14 for the communication unit sections 24b and 24c. The further construction of the tape control unit sections 28b and 28c for practice of the invention can follow conventional practices known to those skilled in this art and is not described further.

The tape unit interface section 28d applies address and control signals to a tape transport by way of a driver 682 and applies data signals, with parity from a parity generator 686, by way of a driver 684. A comparator 694 compares the output data from the drive section 28b with corresponding data signals from the check section 28c. An invalid data comparison results in an error signal which causes the FIG. 13 flip-flop 542 to switch to the set or broken condition.

The interface section 28d receives status signals from a tape transport by way of a buffer 688 and receives data signals, with parity, by way of a buffer 690. The data signals are applied to the data stage in both the drive and the check sections 28b and 28a. A parity check circuit 692 tests the parity of the received data from the buffer 690 and in the event of faulty parity, produces a fault signal which also is applied to both address and control stages 702 and 708.

The status signals from the buffer 688 are applied to the address and control stages 702 and 708 in both the drive and the check channels. Further, the address and control signals from the driver 682 are applied to a comparator 696 for comparison with the corresponding signals which the address and control stage 708 in the check channel produces. An invalid comparison produces a further error signal which switches the tape control unit to the broken state.

A further comparator 698 compares data signals output from the check channel data stage 710 with data input from a tape transport to provide a read after write comparison. For this operation, the tape control unit instructs the peripheral tape transport to record data output from the drive channel data stage 704 as for a conventional write operation and, further, to read the newly-recorded data. The read data, after transmission through the data input buffer 690 and the data parity check circuit 692, as applied to one input of the comparator 698. The other comparator input receives data signals from the check channel data stage 710 by way of FIFO (first in first out) register 699 that provide a selected time delay. During correct operation, the check-channel signals the comparator 698 receives from the FIFO register are identical to the signals read back from the tape transport. The detection of an error raises a further status fault that is applied to both address and control stages 702 and 708.

The tape control unit 28 thus provides duplicated circuits, i.e. the drive and check stages 702, 704, 708 and 710, with duplicated microprocessors 700 and 706, for signals being transferred between the bus structure 30 and a peripheral tape transport. In addition to fault detection in the tape control unit bus interface section 28a, the unit tests the parity of data received from a tape tansport, compares control signals and address signals and data signals which it applies to a tape transport, and compares output data with the read-afterwrite response from the peripheral tape transport.

The fault signals from the parity and from the read after write comparison tests are applied to circuits in both the drive and the check channels. The control unit can respond to any fault signal in whatever manner is prescribed, including, for example, to halt operation and/or raise a maintenance interrupt signal, or to log the fault signal while continuing operation.

The disc control unit 20, and the identical partner unit 22, for the FIG. 1 module 10 can be constructed with a bus interface section 20a as described with reference to FIGS. 11, 12A, 12B and 13. The check control section 20b and the drive control section 20c can be similar to the corresponding control sections of the communication unit 24 and of the tape unit 28 described with reference to FIGS. 14 and 16, and using conventional disc controller implimentations. The disc interface section 20d can likewise employ constructions described for the communication unit and the tape unit to test for faults, by comparison and/or cyclic redundancy checking (CRC).

The module operates two disc control units 20 and 22, which are connected to different disc memories, to store the same information in the disc memory subsystem connected to each unit. Only one control unit, however, is employed to read information, the selection typically being made on the basis of which disc control unit is not busy and has the shortest access time.

The illustrated module 10 of FIG. 1 can use either or both link control units 32 and 34 to exchange information with another module or like computer processor by way of one or both sets of the link conductors 40a and 40b. Each illustrated link control unit employs a bus interface section 32a and redundant control sections 32b and 32c, together with a link interface section 32d. Each section can be constructed as described herein for corresponding sections of the communication control unit and the tape control unit, in view of practices known for linking computer processors to multi-processor networks.

Central Power Supply

Figure 17:
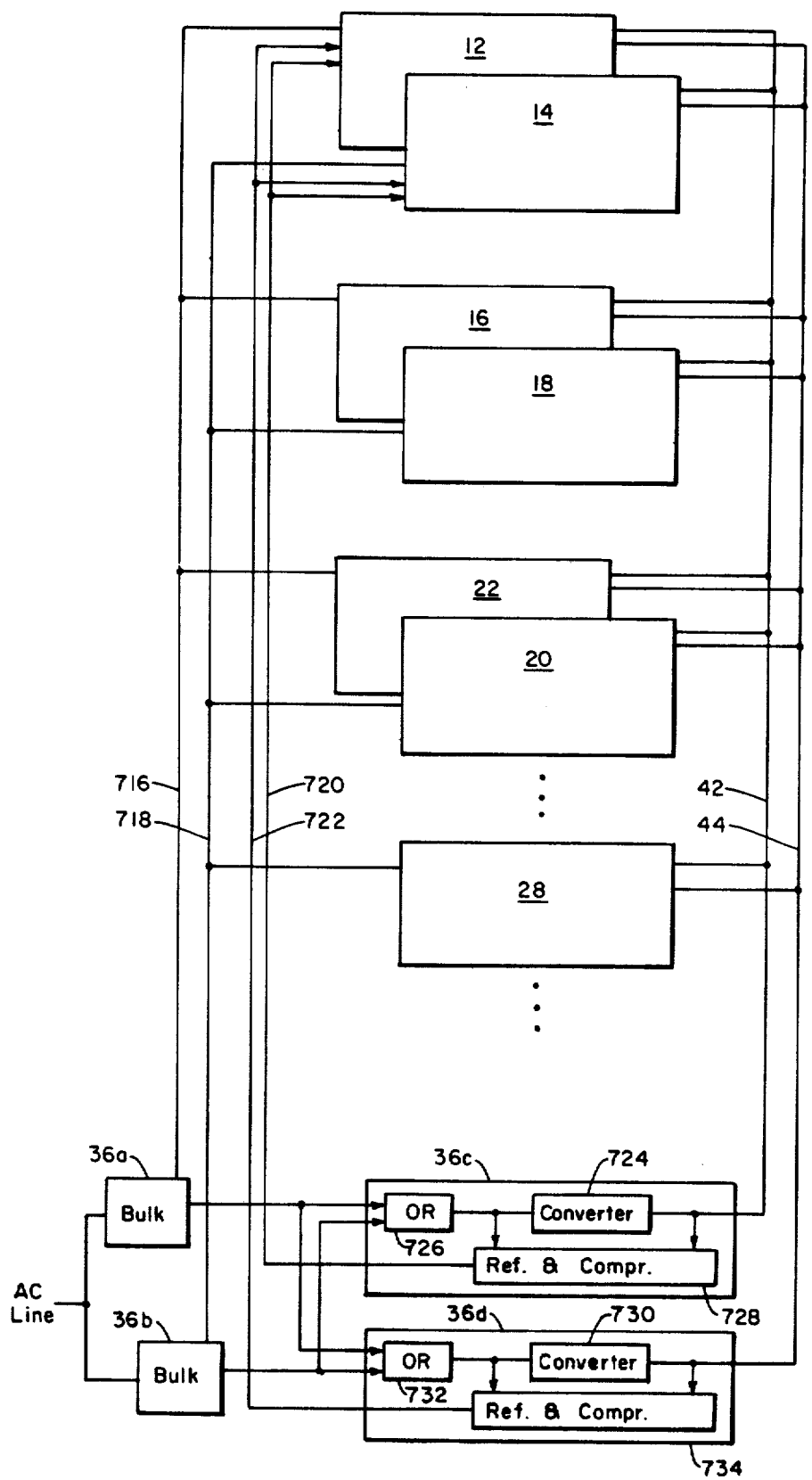
FIG. 17 is a block schematic diagram of a power supply arrangement according to the invention.

The power supply subsystem for the FIG. 1 processor module 10 is described first with reference to FIG. 17, which shows the connections of several units of the module to different supply conductors of the bus structure 30. These conductors, aside from ground return conductors which for simplicity are not shown, include a supply conductor 716 which provides operating power from the bulk supply 36a to all units connected in the even-numbered, for example, connectors of the back plane described with reference to FIG. 3. A like supply conductor 718 provides operating power from the bulk supply 38b to units connected in the odd-numbered receptacles of the back plane. There also is a power-failure conductor 720, 722 connected from each of two further supplies 36c and 36d to both processor units 12 and 14, as shown.

As shown on the right side of FIG. 17, the supply 36c maintains each conductor of the A bus 42 normally, i.e. in the absence of an assertive signal, at a positive supply voltage by way of a separate pull-up resistor for each such conductor, as described with reference to FIG. 3. The supply 36c develops this voltage with an electrical converter 724 that is energized from either bulk supply 36a or bulk supply 36b by way of a power-handling OR gate 726. A reference and compare circuit 728 in the supply 36c produces an A Bus Power Fail signal on conductor 720 when the output of the converter 724 falls below a selected threshold level. The supply 36d, which develops the pull-up voltage for each conductor of the B bus 44, is similar, with a converter 730 fed by a powerhandling OR gate 732 and a reference and compare circuit 734 which produces a B Bus Power Fail signal on conductor 722.

FIG. 5B shows that the processor status and control stage 133 in the processor 12 receives the Bus Power Fail signals on conductors 720 and 722. The response of the CPU to each signal is to produce a Bus Error signal for the corresponding bus; the signal produced under ths condition is a level, rather than a pulse of one timephase duration. Each Bus Power Fail signal also sets a status register or flag which the CPU can interrogate.

With this supply arrangement, the failure of either bulk supply 36a or 36b disables essentially only one-half of the units in a processor module, assuming the units are evenly distributed between connections to odd-numbered backplane connections and even-numbered ones. It leaves the remaining units fully operational. Similarly, the failure of either bus supply 36c or 36d disables only the A bus 42 or the B bus 44, but not both. It hence does not degrade the quality of the module performance.

FIG. 18 shows a power circuit 740 which is provided in the central processing unit 12. The partner CPU 14 has an identical circuit. This circuit receives bulk power from either bus conductor 716, 718 (FIG. 17) on a power input line 742. A bulk monitor 744 produces a Bulk Failure alarm signal on line 746 in the event the bulk supply 36a, 36b to which it is connected fails. This alarm signal is a highest priority interrupt. The CPU response is to execute special routines that save crucial informatin before an Alert signal halts all further operation.

A power inverter 748, energized from the power line 742, produces the different supply voltages, for example +5 volts, −5 volts, +12 volts, which the CPU requires on conductors 750a, 750b and 750c. A primary reference circuit 752, also energized from the power line 742, produces a first reference voltage which separate comparators 754a, 754b, 754c compare with the voltage on each line 750a, 750b and 750c, respectively. An OR gate 756 produces a Power Fail signal in response to an invalid compare signal applied to it from any comparator 754. The illustrated power circuit 740 includes a further, secondary reference circuit 758 which produces a secondary reference voltage that a comparator 760 tests against the output from the primary reference circuit 752. The invalid compare output from the comparator 760 is also applied to the OR gate 756 and, when assertive, produces the Power Fail signal.

A mechanical switch 762 is mounted on the circuit board or other frame of the processing unit 12 to be closed, and thereby to ground a further input line to the secondary reference 758, only when the CPU is installed, i.e. when the unit is fully plugged into the structure of the back plane of FIGS. 2 and 3. The switch 762 is open when the unit 12 is not fully plugged in, and it immediately opens when the unit becomes partially unplugged. When open, the switch 762 breaks the ground connection for the secondary reference 758. This causes the comparator 760 to produce an invalid compare signal that generates the Power Fail signal. When the processor unit 12 is unplugged for removal from a computer system, for example for servicing, the switch 762 opens prior to the interruption of any electrical connections between the unit and the bus structure 30. That is, the switch 762 opens upon the initial movement of the unit to unplug it.

In addition to producing the Power Fail signal, the OR gate 756 actuates a further OR circuit 764 to produce an Alert signal and is applied to one input of an AND gate 766. The other input to both the OR gate 764 and the AND gate 766 is the output from a delay circuit 768 that also receives the Power Fail signal. With this arrangement, the OR gate 764 produces the Alert signal as soon as the Power Fail signal is produced, and continues to assert the Alert signal until a time determined by the delay circuit 768 after the Power Fail signal is removed. Further, the AND gate 766 is actuated to produce the Clamp signal after initiation of the Power Fail signal by the delay interval of the delay circuit 768, and terminating with the Fault signal.

FIG. 19 shows these relative time relations of the Power Fail, Alert, and Clamp signals with waveforms 770a, 770b and 770c, respectively. Thus, in the event of a power failure, the power circuit 740 produces the Power Fail signal and an Alert signal essentially simultaneously. After a selected delay it produces the Clamp signal.

The circuit of FIG. 18 detects a power failure, and produces the Power Fail and Alert signals, sufficiently quickly to enable many circuits in units of a processor module to respond to these signals and effect protective measures during the delay interval and before the disabling loss of power occurs. The Clamp signal prevents further operations at a time when system power may have fallen to such a point that the operation is no longer fully reliable.

Similarly, upon return of power, the Power Fail and Clamp signals immediately terminate, but the Alert signal continues for the brief delay of the circuit 768 to allow the system units to stabilize to full power before resuming processing operation.

The response of the illustrated processor module to the Power Fail signal is to raise an interrupt for initiating routines to save information from loss upon a power failure. The subsequent Alert signal resets the module unit to place logic circuits in the same known condition used for initializing the module. By way of specific example, when an operating voltage normally of (5) volts drops to (4.8) volts, the FIG. 18 power circuit produces the Power Fail and then Alert signals. Ten microseconds later it produces the Clamp signal; the failing voltage at that time typically is around (4.5) volts.

As indicated above, the partner CPU 14 has a power circuit 740 identical to the one shown in FIG. 18. In addition, each other unit of the FIG. 1 module 10 preferably has a power circuit identical to the one shown in FIG. 18, except that the bulk monitor 744 typically is omitted from all units other than the central processor units 12 and 14.

FIG. 18 further shows the OR gate 562 and the flip-flop 564 previously described with reference to FIG. 13. These logic elements respond not only to the Broken signal and the Fan Fail signal, but also to the Power Fail signal of FIG. 18.

Clamp Circuit

Each unit of the illustrated processor module 10 is described above as having a clamp circuit connected to each driver, or transmitter, that applies signals to the A bus 42 and to the B bus 44. The clamp circuits thus located throughout the module are normally inactive, but are all activated by the clamp signal produced with the power supply circuit of FIG. 18. The output element of each driver, or transmitter, that connects to a bus conductor is a transistor. FIG. 20 shows two such bus-driving transistors 780 and 782 in any unit of the module 10, each having a collector connected to drive information onto different conductors 784, 786 of the A bus 42 or the B bus 44. A separate pull-up resistor 788, 790 connects from the supply conductor of one bus supply 36c or 36d, FIG. 17, to each bus conductor 784 and 786. A separate clamping diode 790, 792, as provided in a clamp circuit 88 or 90, as in FIG. 4, or in the clamp circuit in any other unit of the system, as illustrated, is in circuit with each driver transistor 780, 782 to clamp the transistor base to the nondriving ground level of the Clamp signal to disable the transistor from conduction. In the absence of an input signal to the base of the driver transistor, the bus conductor is at the normally high voltage which the pull-up resistor applies to it from the electrical supply. The Clamp signal, applied to each Clamp circuit diode, disables the driver transistor from responding to any input signal it might receive. The clamp signal thus prevents the driver from placing information on the bus structure of the FIG. 1 processor module 10.

The above-noted related application entitled "Digital Data Processor With High Reliability", Ser. No. 307,632, has attached thereto as Annex I and as Annex II detailed logic diagrams respectively for a central processing unit 12 or 14 as described with reference principally to FIGS. 4 through 8 and for a memory unit 16 or 18 as described with reference principally to FIGS. 9 and 10.

It will thus be seen that the objects set forth above, among those made apparent from the preceding description, are efficiently attained. It will be understood that changes may be made in the above constructions and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is set forth in the appended claims:

1. In random-access computer memory apparatus for reading and for writing digital information transferred to and from other computer apparatus by way of a bus structure having at least first and second duplicative buses, the improvement comprising A. first and second independently operable random access memory means, each of which is arranged for storing portions of memory words, and which together are arranged for storing complete memory words, B. first means for applying to each one of said memory means a different memory word portion received from either of said first and second buses, C. second means for applying to each of said first and second buses a memory word portion read from one said memory means, D. error checking means connected with said second means for responding to an invalid memory word portion to produce a fault-reporting signal, E. parity generating means connected with said first means for appending at least one parity digit to each memory word portion and for appending further parity information to each complete memory word being written in said memory means, and F. error correcting means connected with said second means for responding to said fault-reporting signal and to said parity digits and to said parity information for correcting at least single-bit errors in a memory-read word.

2. Apparatus according to claim 1 further comprising register means for storing corrected memory read words from said correcting means, and for selectively applying a stored corrected word to said bus structure.

3. In random-access computer memory apparatus for reading and for writing digital information transferred to and from computer central processing apparatus by way of a bus structure having at least first and second duplicative buses, the improvement comprising A. first and second independently operable random access memory means, each of which is arranged for storing portions of memory words and which together are arranged for storing complete memory words, B. multiplexor means for applying to each of said memory means different word portions received from any one of said first and second buses, C. output means for applying each memory word portion read from said memory means to both of said first and second buses, D. code checking means connected with said output means for responding to an invalid memory word coding to produce a fault-reporting signal, E. first code-introducing means connected with said multiplexor means and with said memory means for appending a selected digital code in each word portion applied to each said memory means, and F. second code-introducing means connected with said multiplexor means and with said memory means for appending a selected digital code in each two-portion word applied to said two memory means.

4. In apparatus according to claim 3, the further improvement comprising

A. register means arranged for storing at least one word portion read from said memory means, and B. means connected with said register means for selectively applying to said output means, in lieu of a memory-read word portion, a word portion stored in said register means.

5. In apparatus according to claim 3, the further improvement comprising

A. first and second register means, each of which is arranged for storing a word portion read from the memory means, and B. means for selectively applying to said output means, in lieu of a memory-read word, word portions stored in both of said register means.

6. In apparatus according to claim 3, the further improvement comprising error correcting means connected with said output means for responding to said fault-reporting signal and to said selected digital codes for correcting at least signal-bit errors in a memory-read word.

7. In apparatus according to claim 3, the further improvement comprising parity checking means for connection with each of said first and second buses and for producing a bus error-reporting signal in response to invalid parity of information received from any said bus.

8. In apparatus according to claim 3, the further improvement comprising control means responsive to signals received from conductors of said bus structure other than said first and second buses for effecting substantially identical operation of said first and second memory means.

9. In apparatus according to claim 3, the further improvement comprising timing control means for operating said first and second memory means in lock-step synchronism with each other.

10. In random-access computer memory apparatus for reading and for writing digital information transferred to and from computer central processing apparatus by way of a bus structure having at least first and second duplicative buses, the improvement comprising A. first and second independently operable random access memory means, each of which is arranged for storing portions of memory words and which together are arranged for storing complete memory words, B. multiplexor means for applying to each of said memory means different word portions received from any one of said first and second buses, C. output means for applying each memory word portion read from said memory means to both of said first and second buses, D. code checking means connected with said output means for responding to an invalid memory word to produce a fault-reporting signal, E. first and second parity introducing means for appending a selected parity condition in each word portion applied to said first and second memory means, and F. code introducing means for appending a selected error checking and correcting code in each two-portion word applied to said two memory means.

11. In apparatus according to claim 10, the further improvement in which said parity introducing means includes means for appending to each memory word portion the parity digit determined on the basis of the digital content of the other word portion of the same memory word.

12. In apparatus according to claim 10 in which each bit in a memory word and in a memory word portion has a numerically-designated bit position, in which each memory word portion received from the bus structure is of eight-bit length, and in which each parity-introducing means adds one bit to each memory word portion, the further improvement wherein said code introducing means includes means for adding four bits to each complete memory word, said bit-adding means determining said four bits in accord with data bits positionally-designated 00 through 15 of the memory word in the following manner:

A. a first bit selected to provide a selected parity condition determined by data bits 01, 03, 05, 07, 09, 11, 13 and 15 of the complete memory word, B. a second bit selected to provide a selected parity condition determined by data bits 02, 03, 06, 07, 10, 11, 14 and 15 of the complete memory word, C. a third bit selected to provide a selected parity condition determined by data bits 04, 05, 06, 07, 12, 13, 14 and 15 of the complete memory word, and D. a fourth bit selected to provide a selected parity condition determined by data bits 00, 03, 05, 06, 08, 11, 13 and 14 of the complete memory word.

13. In random-access computer memory apparatus for reading and for writing digital information transferred to and from other computer apparatus by way of a bus structure having at least first and second duplicative buses, the improvement comprising A. first and second independently operable random access memory means each of which has a plurality of addressable storage locations for storing memory word portions, B. memory write means for applying a selected addressable location of said first memory means and to a selected addressable location of said second memory means portions of a complete memory word received from at least one of said first and second buses, said memory word portions being applied to said memory means for together forming a complete memory word, C. memory read means for applying to each of said first and second buses a memory word portion read from a selected addressable location of at least one of said first and second memory means, D. error checking means connected with said memory read means for detecting an error caused by the invalid addressing of an addressable location of at least one of said memory means by at least one of said memory read means and said memory write means, said error checking means including means for producing a fault-reporting signal in response to said detected error, E. first and second parity introducing means for appending a selected parity condition in each word portion applied to said first and second memory means, and F. code introducing means for appending a selected error checking and correcting code in each two-portion word applied to said two memory means.

14. In apparatus according to claim 13, the further improvement in which said code introducing means includes means for appending to each memory word portion an error checking and correcting code determined, in part, on the basis of the digital content of the other word portion of the same memory word.

15. In apparatus according to claim 13, the further improvement comprising error correcting means connected with said memory read means and responsive to said fault-reporting signal for evaluating said word portions, including parity condition and error checking and correcting code, for correcting at least single-bit errors in a memory-read word.

16. In apparatus according to claim 13, the further improvement comprising

A. register means arranged for storing at least one word portion read from said memory means, and B. means connected with said register means for applying to said buses, in lieu of a memory-read word portion, a word portion stored in said register means.

17. In apparatus according to claim 13, the further improvement comprising

A. first and second register means, each of which is arranged for storing a word portion read from the same-numbered memory means, and B. means for applying to the buses, in lieu of a memory-read word, word portions read from both of said register means.

* * * * *

UNITED STATES PATENT AND TRADEMARK OFFICE
CERTIFICATE OF CORRECTION

PATENT NO. : 4,597,084
DATED : June 24, 1986
INVENTOR(S) : Dynneson et al

It is certified that error appears in the above-identified patent and that said Letters Patent is hereby corrected as shown below:

Column 3, line 15, replace "tne" with -- the --.

Column 23, line 49, replace "tne" with -- the --.

Column 58, line 5, replace "signal-bit" with -- single-bit --.

Column 41, line 30, replace "oeprate" with -- operate --.

Column 47, line 11, after "FIG. 11." insert -- ) --.

Column 54, line 39, replace "informatin" with -- information --.

Signed and Sealed this

Eighteenth Day of November, 1986

*Attest:*

DONALD J. QUIGG

*Attesting Officer*     *Commissioner of Patents and Trademarks*